(12) United States Patent
Kurokawa et al.

(10) Patent No.: US 7,897,971 B2
(45) Date of Patent: Mar. 1, 2011

(54) DISPLAY DEVICE

(75) Inventors: Yoshiyuki Kurokawa, Sagamihara (JP); Takayuki Ikeda, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 218 days.

(21) Appl. No.: 12/219,379

(22) Filed: Jul. 21, 2008

(65) Prior Publication Data

US 2009/0026454 A1   Jan. 29, 2009

(30) Foreign Application Priority Data

Jul. 26, 2007   (JP) ............................. 2007-195252

(51) Int. Cl.
*H01L 31/00* (2006.01)
(52) U.S. Cl. .................... 257/59; 257/57; 257/E33.001
(58) Field of Classification Search .............. 257/57–61, 257/E24.004, E33.001
See application file for complete search history.

(56) References Cited

U.S. PATENT DOCUMENTS

| | | |
|---|---|---|
| 4,409,134 A | 10/1983 | Yamazaki |
| 4,581,620 A | 4/1986 | Yamazaki et al. |
| 5,262,654 A | 11/1993 | Yamazaki |
| RE34,658 E | 7/1994 | Yamazaki et al. |
| 5,414,442 A | 5/1995 | Yamazaki et al. |
| 5,453,858 A | 9/1995 | Yamazaki |
| 5,591,987 A | 1/1997 | Yamazaki et al. |
| 5,614,732 A | 3/1997 | Yamazaki |
| 6,013,930 A | 1/2000 | Yamazaki et al. |
| 6,121,660 A | 9/2000 | Yamazaki et al. |
| 6,218,219 B1 | 4/2001 | Yamazaki et al. |
| 6,387,737 B1 | 5/2002 | Yamazaki et al. |
| 6,693,044 B1 | 2/2004 | Yamazaki et al. |

(Continued)

FOREIGN PATENT DOCUMENTS

JP   04-242724   8/1992

(Continued)

OTHER PUBLICATIONS

Arai et al., "41.2: Micro Silicon Technology for Active Matrix OLED Display," SID Digest '07: SID International Symposium Digest of Technical Papers, 2007, vol. 38, pp. 1370-1373.

(Continued)

*Primary Examiner*—Eugene Lee
*Assistant Examiner*—Tucker Wright
(74) *Attorney, Agent, or Firm*—Eric J. Robinson; Robinson Intellectual Property Law Office, P.C.

(57) ABSTRACT

To provide a display device including a protection circuit having a thin film transistor which has small size and high withstand voltage. In the protection circuit of the display device, a thin film transistor is used in which an amorphous semiconductor layer, a microcrystalline semiconductor layer, a gate insulating layer which is in contact with the microcrystalline semiconductor layer, and a gate electrode layer overlap with each other. Since current drive capability of the microcrystalline semiconductor layer is high, the size of the transistor can be made small. In addition, the amorphous semiconductor layer is included, so that the withstand voltage can be improved. Here, the display device is a liquid crystal display device or a light-emitting device.

23 Claims, 30 Drawing Sheets

U.S. PATENT DOCUMENTS

| | | |
|---|---|---|
| 7,067,845 B2 | 6/2006 | Murakami et al. |
| 7,102,718 B1 | 9/2006 | Yamazaki et al. |
| 7,259,429 B2 | 8/2007 | Yamazaki |
| 7,365,805 B2 | 4/2008 | Maekawa et al. |
| 2002/0009890 A1* | 1/2002 | Hayase et al. ............... 438/706 |
| 2005/0012097 A1 | 1/2005 | Yamazaki |
| 2007/0080374 A1 | 4/2007 | Kurokawa |
| 2007/0176176 A1 | 8/2007 | Yamazaki et al. |
| 2009/0001375 A1* | 1/2009 | Yamazaki et al. ............. 257/59 |

FOREIGN PATENT DOCUMENTS

| | | |
|---|---|---|
| JP | 11-121761 | 4/1999 |
| JP | 2005-049832 | 2/2005 |

OTHER PUBLICATIONS

Sazonov et al., "Low-Temperature Materials and Thin Film Transistors for Flexible Electronics," Proceedings of the IEEE, Aug. 2005, vol. 93, No. 8, pp. 1420-1428.

Lee et al., "Top-Gate TFTs Using 13.56 MHz PECVD Microcrystalline Silicon," IEEE Electron Device Letters, vol. 26, No. 9, Sep. 2005, pp. 637-639.

Lee et al., "Postdeposition Thermal Annealing and Material Stability of 75° C. Hydrogenated Nanocrystalline Silicon Plasma-Enhanced Chemical Vapor Deposition Films," Journal of Applied Physics, Aug. 4, 2005, vol. 98, pp. 034305-1-034305-7.

Esmaeili-Rad et al., "Stability of Nanocrystalline Silicon Bottom-Gate Thin Film Transistors with Silicon Nitride Gate Dielectric," Journal of Applied Physics, 2007, vol. 102, pp. 064512-1-064512-7.

Esmaeili-Rad et al., "Absence of Defect State Creation in Nanocrystalline Silicon Thin Film Transistors Deduced from Constant Current Stress Measurements," Applied Physics Letters, 2007, vol. 91, pp. 113511-1-113511-3.

Lee et al., "Leakage Current Mechanisms in Top-Gate Nanocrystalline Silicon Thin Film Transistors," Applied Physics Letters, 2008, vol. 92, pp. 083509-1-083509-3.

Lee et al., "Stability of nc-Si:H TFTs with Silicon Nitride Gate Dielectric,", IEEE Transactions on Electron Devices, Jan. 2007, vol. 54, No. 1, pp. 45-51.

* cited by examiner

DISPLAY DEVICE

BACKGROUND OF THE INVENTION

1. Field of the Invention

The present invention relates to a display device including a thin film transistor. In particular, the present invention relates to a liquid crystal display device or a light-emitting device.

2. Description of the Related Art

In recent years, a technique for forming a thin film transistor (TFT) by using a semiconductor thin film (having a thickness of approximately several to several hundreds of nanometers) formed over a substrate having an insulating surface has attracted attention. Thin film transistors have been widely applied to electronic devices such as ICs and electro-optical devices and have been rapidly developed particularly as switching elements for image display devices such as a liquid crystal display device.

In a semiconductor element typified by a thin film transistor, it is one of important objects in manufacturing steps of a semiconductor device that how an electrification phenomenon (charging) which leads to deterioration in an element or dielectric breakdown is suppressed. In particular, since film thickness of various insulating films such as gate insulating films is decreased in accordance with high integration, dielectric breakdown due to charging has become a more serious problem.

Causes and circumstances of charging are extremely complicated and diverse. Therefore, it is necessary that causes and circumstances of charging be found out. In addition, it is necessary that the structure of a semiconductor device itself be devised so that resistance against deterioration or dielectric breakdown due to charging is increased. In order to prevent deterioration or dielectric breakdown due to charging, it is effective to provide a discharging path by a protection circuit formed using a diode (a protection diode). When a discharging path is provided charge accumulated in an insulating film can be prevented from being discharged near a semiconductor element, so that a phenomenon where the semiconductor element deteriorates or is damaged by discharge energy (ESD: electrostatic discharge) can be prevented.

Further, when the protection circuit is provided, even when noise as well as a signal and power supply voltage is input, a malfunction of a circuit due to the noise can be prevented and deterioration or damage of the semiconductor element due to the noise can be prevented.

In an image display device such as a liquid crystal display device, a thin film transistor using an amorphous semiconductor film or a thin film transistor using a polycrystalline semiconductor film is mainly used as a switching element.

As a method for forming a polycrystalline semiconductor film, a technique is know in which a pulsed excimer laser beam is processed linearly by an optical system and an amorphous semiconductor film is irradiated with a linear laser beam while being scanned by the linear laser beam to be crystallized.

Further, as well as a thin film transistor using an amorphous semiconductor film or a thin film transistor using a polycrystalline semiconductor film, a thin film transistor using a microcrystalline semiconductor film is known as a switching element of an image display device (for example, see Reference 1: Japanese Published Patent Application No. H04-242724, Reference 2: Japanese Published Patent Application No. 2005-49832, Reference 3: U.S. Pat. No. 4,409,134, and Reference 4: U.S. Pat. No. 5,591,987).

As a method for manufacturing a thin film transistor using a microcrystalline semiconductor film, a technique is known in which an amorphous silicon film is formed over a gate insulating film, a metal film is formed over the amorphous silicon film, and the metal film is irradiated with diode laser to modify the amorphous silicon film into a microcrystalline silicon film. With this manufacturing method, the metal film formed over the amorphous silicon film only converts light energy of the diode laser into thermal energy and is removed in a later step. That is, the amorphous silicon film is heated only by conduction heating and the microcrystalline silicon film is formed by this heat (for example, see Reference 5: Toshiaki ARAI and others, SID '07 DIGEST, 2007, pp. 1370 to 1373).

SUMMARY OF THE INVENTION

A thin film transistor using an amorphous semiconductor film has low carrier mobility. That is, current drive capability is low. Therefore, when a protection circuit is formed by using a thin film transistor using an amorphous semiconductor film, there is a problem in that a transistor having large size should be formed in order to sufficiently take a countermeasure against electrostatic discharge, and reduction in frame size is inhibited. Further, when a transistor having large size is formed, there is a problem in that electric capacitance between a scan line electrically connected to a gate electrode and a signal line electrically connected to a source electrode or a drain electrode is increased, whereby power consumption is increased.

A thin film transistor using a polycrystalline semiconductor film has higher mobility than a thin film transistor using an amorphous semiconductor film by two or more digits, and a pixel portion of a liquid crystal display device and a peripheral driver circuit thereof can be formed over the same substrate. However, because of crystallization of a semiconductor film, manufacturing steps of a thin film transistor using a polycrystalline semiconductor become more complicated than manufacturing steps of a thin film transistor using an amorphous semiconductor film. Therefore, there is a problem in that yield is low and cost is high.

Meanwhile, there is a problem in that the surface of a crystal grain of a microcrystalline semiconductor film is easily oxidized. Therefore, a crystal grain of a channel formation region is easily oxidized in manufacturing steps of a thin film transistor, and an oxide film is formed on the surface of the crystal grain. There is a problem in that the oxide film inhibits movement of carries and electric characteristics of the thin film transistor are decreased (for example, mobility is decreased).

In addition, high voltage is often applied to a thin film transistor used for a protection circuit, and large current flows therethrough in some cases.

Further, in order to manufacture a display device with few steps and high yield, a thin film transistor formed in a pixel and a thin film transistor which is formed over the same substrate as the thin film transistor formed in the pixel and is included in a protection circuit are preferably formed at the same time.

In view of the foregoing problems, it is an object of the present invention to manufacture a display device which has excellent electric characteristics and high reliability with high yield at low cost.

According to one aspect of the present invention, in a display device, a microcrystalline semiconductor layer is used as a semiconductor layer of a thin film transistor included in a protection circuit. An amorphous semiconductor layer is provided over the microcrystalline semiconductor layer as a buffer layer. The structure of the thin film transistor is described below.

A thin film transistor of the present invention is an inversely staggered structure, which includes a gate insulating layer covering a gate electrode, a microcrystalline semiconductor layer (also referred to as a semi-amorphous semiconductor layer) functioning as a channel formation region over the gate insulating layer, a buffer layer over the microcrystalline semiconductor layer, a pair of a source region and a drain region over the buffer layer, and a pair of a source electrode and a drain electrode which are in contact with the source region and the drain region. Further, in a region where the source electrode and the drain electrode face with each other, part of the source region and the drain region and part of the buffer layer are exposed.

Alternatively, a pair of a source electrode and a drain electrode which are in contact with a source region and a drain region are preferably included so that part of the source region and the drain region is exposed. This is to reduce leakage current between the source electrode and the drain electrode. In this case, each of the source region and the drain region have a region which is in contact with the source electrode or the drain electrode and a region which is not in contact with the source electrode or the drain electrode. In addition, end portions of the source region and the drain region are formed outside of end portions of the source electrode and the drain electrode.

A display device of the present invention includes an input terminal and a pixel portion. At least a protection circuit is included between the input terminal and the pixel portion. The protection circuit includes at least a thin film transistor. The thin film transistor includes a gate electrode, a gate insulating layer provided so as to cover the gate electrode, a microcrystalline semiconductor layer provided over the gate insulating layer, a buffer layer provided over the microcrystalline semiconductor layer, a source region and a drain region provided over part of the buffer layer and having a side surface which is almost aligned with a side surface of a depression portion of the buffer layer, a source electrode provided so as to be in contact with the source region, and a drain electrode provided so as to be in contact with the drain region. A region overlapping with the source region and the drain region is thicker than a region overlapping with a channel formation region in the buffer layer. A protective insulating layer is included over the source electrode and the drain electrode. The protective insulating layer includes a first opening portion and a second opening portion. The first opening portion is provided so as to reach one of the source electrode and the drain electrode. The second opening portion is provided so as to reach the gate electrode. An electrode connecting the first opening portion and the second opening portion is provided over the protective insulating layer.

When end portions of a source electrode and a drain electrode and end portions of a source region and a drain region are not aligned with each other and the end portions of the source region and the drain region are formed outside of the end portions of the source electrode and the drain electrode, a distance between the end portions of the source electrode and the drain electrode is long. Therefore, leakage current between the source electrode and the drain electrode is reduced, and short circuit can be prevented. Further, an electric field does not concentrate on the end portions of the source electrode and the drain electrode and the end portions of the source region and the drain region, and leakage current between the gate electrode and the source electrode and the drain electrode can be reduced.

Further, a depression portion is provided in part of the buffer layer and side surfaces of the depression portion and the end portions of the source region and the drain region are aligned with each other. Since the depression portion is provided in part of the buffer layer and a leak path between the source region and the drain region has a sufficient distance, leakage current between the source region and the drain region is reduced, so that off current can be made small.

Furthermore, the buffer layer is also provided between the microcrystalline semiconductor layer and the source region and the drain region. The microcrystalline semiconductor layer functions as a channel formation region. The buffer layer prevents the microcrystalline semiconductor layer from being oxidized and functions as a high resistance region. Since the buffer layer provided with the depression portion is provided between the microcrystalline semiconductor layer and the source region and the drain region, a thin film transistor which has high mobility, small leakage current, and high withstand voltage can be formed. When leakage current of a thin film transistor is made small, off current can be made small.

The buffer layer can be formed using an amorphous semiconductor, and one or more of nitrogen, hydrogen, or halogen are preferably included therein. When one or more of nitrogen, hydrogen, or halogen are included in the amorphous semiconductor layer, oxidation of a crystal grain included in the microcrystalline semiconductor layer can be suppressed.

The buffer layer can be formed by a plasma CVD method, a sputtering method, or the like. In addition, after the amorphous semiconductor layer is formed, by exposing the amorphous semiconductor layer to nitrogen plasma, hydrogen plasma, or halogen plasma, the amorphous semiconductor layer can be nitrided, hydrogenated, or halogenated.

When the buffer layer is provided on the surface of the microcrystalline semiconductor layer, oxidation of a crystal grain included in the microcrystalline semiconductor layer (the surface, particularly) can be suppressed, so that deterioration in current characteristics of the thin film transistor can be suppressed.

The microcrystalline semiconductor layer can be directly formed over a substrate. Specifically, the microcrystalline semiconductor layer can be formed by using silicon hydride (silane or the like) as a source gas and using a plasma CVD method. The microcrystalline semiconductor layer formed by using the above-described method also includes a microcrystalline semiconductor which has a semiconductor crystal grain with a diameter of 0.5 to 20 nm in an amorphous semiconductor layer. Therefore, unlike the case of using a polycrystalline semiconductor layer, a crystallization process such as laser crystallization is not necessarily performed after a semiconductor layer is formed. When the microcrystalline semiconductor layer is used, the number of manufacturing steps of the thin film transistor can be reduced, so that yield of the display device can be improved and cost can be reduced. In this specification, a film (a layer) obtained by film formation is referred to as a microcrystalline semiconductor film (layer), and a film (a layer), crystals of which are grown by being irradiated with laser light at energy density such that the film (the layer) does not melt after film formation, is referred to as an LPSAS film (layer). In addition, plasma generated by using microwaves with a frequency of higher than or equal to 1 GHz has high electron density and silicon hydride which is the source gas can be easily dissociated. Therefore, compared to the case of using a microwave plasma CVD method with a frequency of several tens to several hundreds of megahertz, by using a microwave plasma CVD method with a frequency of higher than or equal to 1 GHz, the microcrystalline semiconductor layer can be easily formed and a film-formation rate can be increased. Thus, mass productivity (productivity) of the display device can be improved.

In addition, in the present invention, a display device is manufactured by using a thin film transistor having a microcrystalline semiconductor layer for a protection circuit. Mobility of a thin film transistor using the microcrystalline semiconductor layer is approximately higher than or equal to 1 $cm^2$/V·sec and lower than or equal to 20 $cm^2$/V·sec, which is approximately twice to 20 times mobility of a thin film transistor using an amorphous semiconductor layer. Therefore, part of or all a driver circuit is formed over the same substrate as a pixel portion and a system-on-panel can be formed.

Further, specifically, an element substrate may have a state in which only a pixel electrode of a display element is formed, a state after a conductive layer serving as the pixel electrode is formed and before the conductive layer is etched to form the pixel electrode, or any other state.

Note that a liquid crystal display device in this specification refers to an image display device or a light source (including a lighting device). Further, a liquid crystal display device also refers to all the following modules: a module to which a connector, for example, an FPC (flexible printed circuit), a TAB (tape automated bonding) tape, or a TCP (tape carrier package) is attached, a module in which a printed wiring board is provided at an end of a TAB tape or a TCP, and a module in which an IC (integrated circuit) is directly mounted on a display element by a COG (chip on glass) method.

Note that LPSAS in this specification refers to a crystalline semiconductor obtained by performing laser process (hereinafter also referred to as LP) treatment on a formed microcrystalline semiconductor layer.

Note that as for formation of a microcrystalline semiconductor layer in the present invention, a microcrystalline silicon (semi-amorphous silicon (hereinafter also referred to as SAS)) layer is deposited over a gate insulating layer. After that, laser light is delivered to the microcrystalline semiconductor layer from the surface side of the microcrystalline semiconductor layer. The laser light is delivered at energy density such that the semi-amorphous silicon layer does not melt. That is, LP process in the present invention refers to laser process by which solid-phase crystallization growth which is performed by radiation heating without melting the semi-amorphous silicon layer is generated. In other words, laser process in the present invention refers to laser process utilizing a critical region where the deposited semi-amorphous silicon layer is not in a liquid phase. Therefore, laser process in the present invention can also be referred to as critical growth.

The laser light can be delivered to an interface between the semi-amorphous silicon layer and the gate insulating layer. Thus, solid-phase crystallization growth is performed with a crystal formed in the semi-amorphous silicon layer used as a nucleus, and the semi-amorphous silicon layer with better crystallinity can be formed. Typically, a crystal formed near the surface side of the semi-amorphous silicon layer is used as a nucleus, solid-phase crystallization growth proceeds from the surface toward the interface between the semi-amorphous silicon layer and the gate insulating layer, and an almost columnar crystal is formed. Alternatively, a crystal formed in the semi-amorphous silicon layer is used as a nucleus, solid-phase crystallization growth proceeds from the crystal nucleus toward a surface of the semi-amorphous silicon layer and toward the interface between the semi-amorphous silicon layer and the gate insulating layer, so that the semi-amorphous silicon layer with better crystallinity can be formed.

The solid-phase crystallization growth by the LP treatment does not increase a crystal grain size but makes crystallization growth proceed in a laser delivery direction (a direction of layer thickness).

In the LP treatment, when a laser beam is condensed in a long rectangular shape (is shaped into a linear laser beam), a 730 mm×920 mm semi-amorphous silicon layer over a glass substrate can be treated by one laser beam scanning. In this case, the LP treatment is performed with a ratio of overlapping linear laser beams (an overlapping ratio) of 0 to 90%, preferably 0 to 67%. Thus, treatment time for one substrate is shortened, so that productivity can be improved. Note that the shape of a laser beam is not limited to a linear shape, and may be a plane shape. Further, the LP treatment is not limited by the size of the glass substrate, and the LP treatment can be used for substrates with various sizes. When the LP treatment is performed, crystallinity of a region of the interface between the microcrystalline semiconductor layer and the gate insulating layer is improved, so that electric characteristics of a transistor having a bottom-gate structure can be improved.

Through such a critical growth, unevenness (convexity called a ridge) generated on the surface of conventional low-temperature polysilicon is not formed, and the surface of silicon, on which LP treatment is performed, is smoothed.

As described above, a crystalline silicon layer obtained by directly delivering laser light to a formed semi-amorphous silicon layer has growth mechanism and film quality of a layer to be formed which are greatly different from those of a microcrystalline silicon layer remaining deposited in a conventional technique or a microcrystalline silicon layer modified by conduction heating (a microcrystalline silicon layer disclosed in Reference 5).

Note that in this specification, an amorphous semiconductor layer preferably includes nitrogen, hydrogen, fluorine, or chlorine.

When the present invention is used, display device which has excellent electric characteristics and high reliability can be manufactured with high yield at low cost.

DETAILED DESCRIPTION OF THE INVENTION

Figure 1:
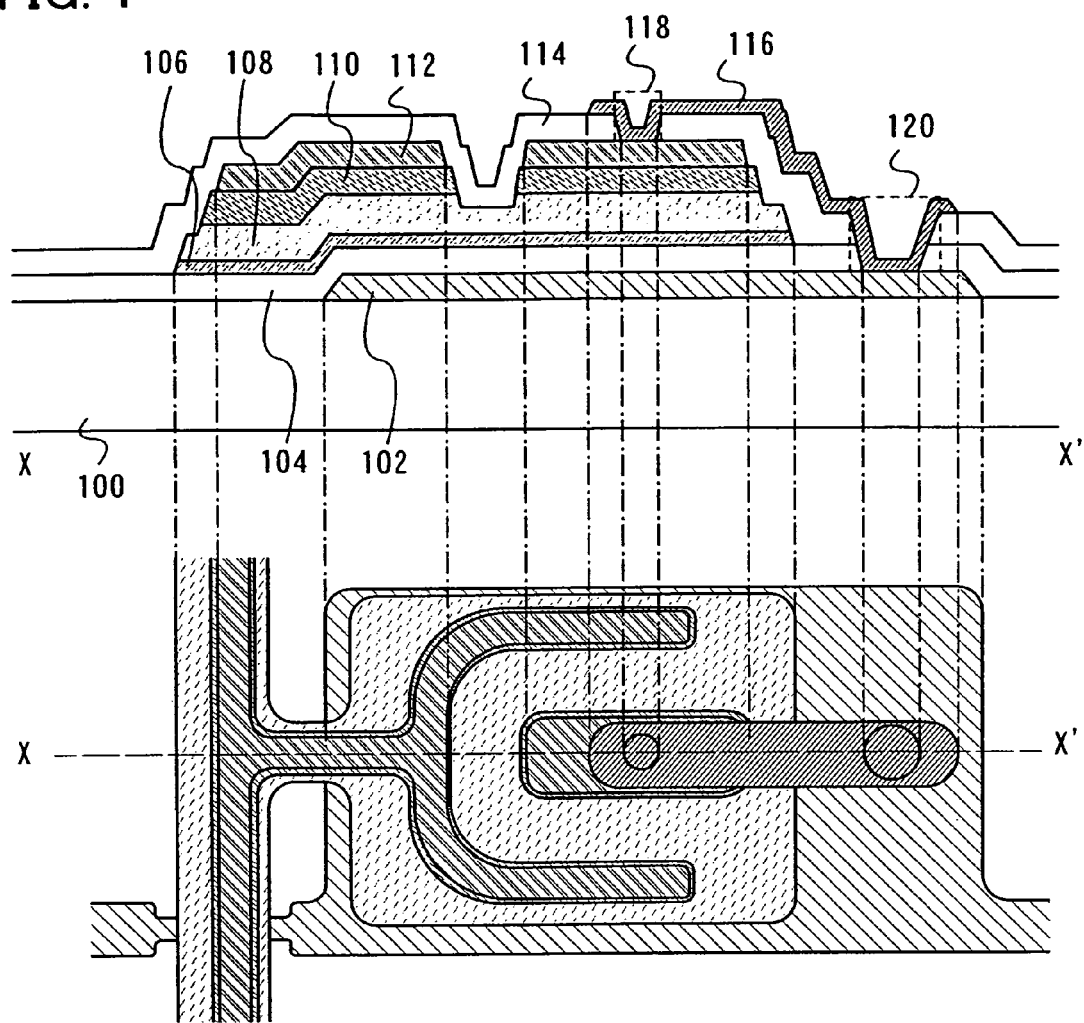
FIG. 1 illustrates a structural example of a thin film transistor used in the present invention.

Hereinafter, embodiment modes of the present invention will be described with reference to the drawings. Note that the present invention is not limited to the following description. The present invention can be implemented in various different ways and it will be readily appreciated by those skilled in the art that various changes and modifications are possible without departing from the spirit and the scope of the present invention. Therefore, the present invention should not be construed as being limited to the following description of the embodiment modes. Note that as structures of the present invention are described with reference to the drawings, like portions are denoted by common reference numerals in different drawings.

Embodiment Mode 1

In this embodiment mode, one mode of the present invention is described with reference to the drawings.

Figure 2:
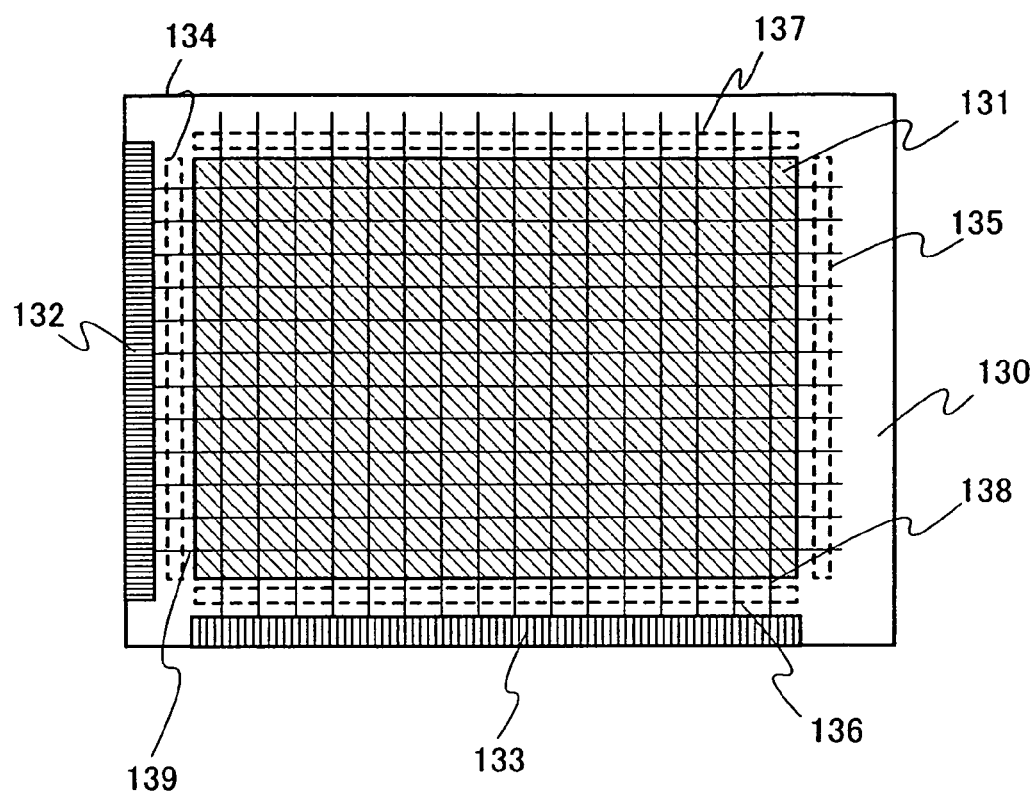
FIG. 2 illustrates an example of a display device to which the present invention can be applied.

First, the structure of a semiconductor display device of the present invention is described with reference to FIG. 2. FIG. 2 is a top view of a substrate 130 over which a semiconductor display device is formed. A pixel portion 131 is formed over the substrate 130. In addition, an input terminal 132 and an input terminal 133 supply a signal and power for displaying images to a pixel circuit formed over the substrate 130.

Note that the present invention is not limited to the mode shown in FIG. 2. That is, one or both of a scan line driver circuit and a signal line driver circuit may be formed over the substrate 130.

The input terminal 132 on the scan line side and the input terminal 133 on the signal line side which are formed over the substrate 130 are connected to the pixel portion 131 by wirings extended vertically and horizontally. The wirings are connected to protection circuits 134 to 137.

The pixel portion 131 and the input terminal 132 are connected by a wiring 139. The protection circuit 134 is placed between the pixel portion 131 and the input terminal 132 and is connected to the wiring 139. When the protection circuit 134 is provided, various semiconductor elements such as thin film transistors, which are included in the pixel portion 131, can be protected and deterioration or damage thereof can be prevented. Note that although the wiring 139 corresponds to one wiring in the drawing, all of a plurality of wirings provided in parallel to the wiring 139 have connection relation which is similar to that of the wiring 139. Note that the wiring 139 functions as a scan line.

Note that on the scan line side, not only the protection circuit 134 provided between the input terminal 132 and the pixel portion 131 but also a protection circuit provided on the opposite side of the input terminal 132 across the pixel portion 131 may be provided (see a protection circuit 135 in FIG. 2).

Meanwhile, the pixel portion 131 and the input terminal 133 are connected by a wiring 138. The protection circuit 136 is placed between the pixel portion 131 and the input terminal 133 and is connected to the wiring 138. When the protection circuit 136 is provided, various semiconductor elements such as thin film transistors, which are included in the pixel portion 131, can be protected and deterioration or damage thereof can be prevented. Note that although the wiring 138 corresponds to one wiring in the drawing, all of a plurality of wirings provided in parallel to the wiring 138 have connection relation which is similar to that of the wiring 138. Note that the wiring 138 functions as a signal line.

Note that on the signal line side, not only the protection circuit 136 provided between the input terminal 133 and the pixel portion 131 but also a protection circuit provided on the opposite side of the input terminal 133 across the pixel portion 131 may be provided (see the protection circuit 137 in FIG. 2).

Note that all the protection circuits 134 to 137 are not necessarily provided. However, it is necessary to provide at least the protection circuit 134. This is because when excessive current is generated in the scan line, gate insulating layers of the thin film transistors included in the pixel portion 131 are damaged and a number of point defects can be generated in some cases.

In addition, when not only the protection circuit 134 but also the protection circuit 136 are provided, generation of excessive current in the signal line can be prevented. Therefore, compared to the case where only the protection circuit 134 is provided, reliability is improved and yield is improved. When the protection circuit 136 is provided, electrostatic discharge which can be generated in a rubbing process or the like after forming the thin film transistors can also be prevented.

Further, when the protection circuit 135 and the protection circuit 137 are provided, reliability can be further improved.

Moreover, yield can be improved. The protection circuit 135 and the protection circuit 137 are provided on the opposite sides of the input terminal 132 and the input terminal 133, respectively. Therefore, the protection circuit 135 and the protection circuit 137 prevent deterioration and damage of the various semiconductor elements, which are generated in a manufacturing step (e.g., a rubbing process) of the display device.

Note that in FIG. 2, a signal line driver circuit and a scan line driver circuit which are formed separately from the substrate 130 are mounted on the substrate 130 by a known method such as a COG method or a TAB method. However, the present invention is not limited to this. The scan line driver circuit and the pixel portion may be formed over the substrate 130 and the signal line driver circuit which is formed separately may be mounted on the substrate 130. Alternatively, part of the scan line driver circuit or part of the signal line driver circuit, and the pixel portion 131 may be formed over the substrate 130 and the other part of the scan line driver circuit or the other part of the signal line driver circuit may be mounted on the substrate 130. When part of the scan line driver circuit is provided between the pixel portion 131 and the input terminal 132 on the scan line side, a protection circuit may be provided between the input terminal 132 on the scan line side and part of the scan line driver circuit over the substrate 130; a protection circuit may be provided between part of the scan line driver circuit and the pixel portion 131; or a protection circuit may be provided between the input terminal 132 on the scan line side and part of the scan line driver circuit over the substrate 130 and a protection circuit may be provided between part of the scan line driver circuit and the pixel portion 131. Alternatively, when part of the signal line driver circuit is provided between the pixel portion 131 and the input terminal 133 on the signal line side, a protection circuit may be provided between the input terminal 133 on the signal line side and part of the signal line driver circuit over the substrate 130; a protection circuit may be provided between part of the signal line driver circuit and the pixel portion 131; or a protection circuit may be provided between the input terminal 133 on the signal line side and part of the signal line driver circuit over the substrate 130 and a protection circuit may be provided between part of the signal line driver circuit and the pixel portion 131. That is, since various modes are used for driver circuits, the number and the positions of protection circuits are determined in accordance with modes of the driver circuits.

Next, examples of specific circuit structures of protection circuits which are used as the protection circuits 134 to 137 in FIG. 2 are described with reference to FIGS. 3A to 3F. As for a thin film transistor having a microcrystalline semiconductor layer, an n-channel transistor has higher mobility than a p-channel transistor and not a p-channel transistor but an n-channel transistor is generally used. Therefore, only the case where an n-channel transistor is provided is described below.

Figure 3A:
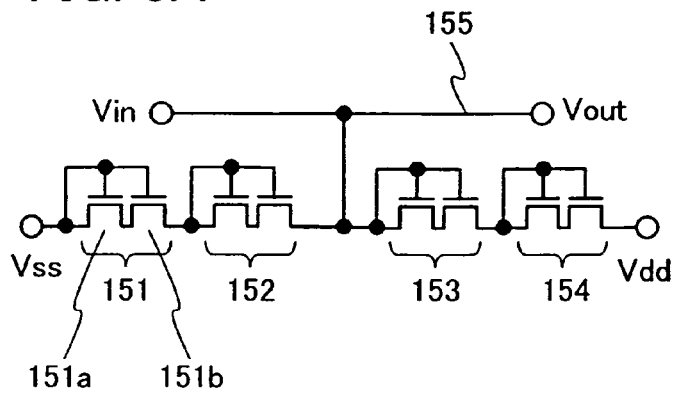
FIGS. 3A to 3F each illustrate an example of a circuit structure of a protection circuit to which the present invention is applied.

A protection circuit shown in FIG. 3A includes a protection diodes 151 to 154 each using a plurality of thin film transistors. The protection diode 151 includes an n-channel thin film transistor 151a and an n-channel thin film transistor 151b connected in series. One of a source electrode and a drain electrode of the n-channel thin film transistor 151a is connected to a gate electrode of the n-channel thin film transistor 151a and a gate electrode of the n-channel thin film transistor 151b and is kept at a potential $V_{ss}$. The other of the source electrode and the drain electrode of the n-channel thin film transistor 151a is connected to one of a source electrode and a drain electrode of the n-channel thin film transistor 151b. The other of the source electrode and the drain electrode of the n-channel thin film transistor 151b is connected to the protection diode 152. Further, in a manner similar to that of the protection diode 151, the protection diodes 152 to 154 each include a plurality of thin film transistors connected in series, and an end of each of the plurality of thin film transistors connected in series is connected to gate electrodes of the plurality of thin film transistors.

Note that in the present invention, the number and polarity of the thin film transistors included in the protection diodes 151 to 154 are not limited to those shown in FIG. 3A. For example, the protection diode 151 may be formed of three thin film transistors connected in series.

The protection diodes 151 to 154 are sequentially connected in series, and a wiring 155 is connected between the protection diode 152 and the protection diode 153. Note that the wiring 155 is a wiring electrically connected to a semiconductor element which is to be protected. Note that a wiring connected to the wiring 155 is not limited to a wiring between the protection diode 152 and the protection diode 153. That is, the wiring 155 may be connected between the protection diode 151 and the protection diode 152, or may be connected between the protection diode 153 and the protection diode 154.

One end of the protection diode 154 is kept at a power supply potential $V_{dd}$. In addition, each of the protection diodes 151 to 154 is connected so that reverse bias voltage is applied to each of the protection diodes 151 to 154.

Figure 3B:
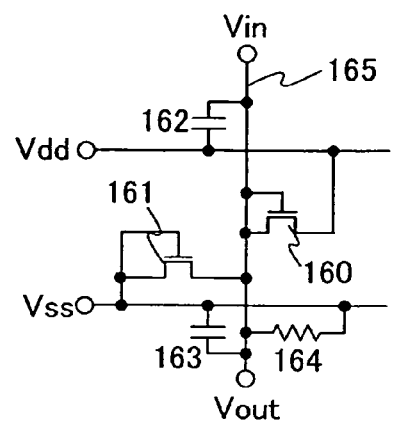

A protection circuit shown in FIG. 3B includes a protection diode 160, a protection diode 161, a capacitor 162, a capacitor 163, and a resistor 164. The resistor 164 is a resistor having two terminals. A potential $V_{in}$ is supplied to one of the terminals of the resistor 164 from a wiring 165. The potential $V_{ss}$ is supplied to the other of the terminals of the resistor 164. The resistor 164 is provided in order to make the potential of the wiring 165 $V_{ss}$ when the potential $V_{in}$ is not supplied, and the resistance value of the resistor 164 is set so as to be sufficiently larger than wiring resistance of the wiring 165. Diode-connected n-channel thin film transistors are used for the protection diode 160 and the protection diode 161.

Note that as the protection diodes shown in FIGS. 3A to 3F, protection diodes to which a plurality of thin film transistors are further connected in series may be used.

Here, the case where the protection diodes shown in FIGS. 3A to 3D and 3F are operated is described. At this time, between source electrodes and drain electrodes of respective protection diodes 151, 152, 156, 161, 170, 171, 174, and 175, electrodes kept at the potential $V_{ss}$ are drain electrodes, and the other electrodes thereof are source electrodes. Between source electrodes and drain electrodes of protection diodes 153, 154, 157, 160, 172, 173, 176, and 177, electrodes kept at the potential $V_{dd}$ are source electrodes, and the other electrodes thereof are drain electrodes. In addition, the threshold voltage of the thin film transistors included in the protection diodes is denoted by $V_{th}$.

Further, as for the protection diodes 151, 152, 156, 161, 170, 171, 174, and 175, when the potential $V_{in}$ is higher than the potential $V_{ss}$, reverse bias voltage is applied thereto and current does not easily flow therethrough. Meanwhile, as for the protection diodes 153, 154, 157, 160, 172, 173, 176, and 177, when the potential $V_{in}$ is lower than the potential $V_{dd}$, reverse bias voltage is applied thereto and current does not easily flow therethrough.

Here, operations of protection circuits in which a potential $V_{out}$ is set almost between the potential $V_{ss}$ and the potential $V_{dd}$ are described.

First, the case where the potential $V_{in}$ is higher than the potential $V_{dd}$ is described. When the potential $V_{in}$ is higher than the potential $V_{dd}$, the n-channel thin film transistors are turned on when a potential difference between the gate electrodes and the source electrodes of the respective protection diodes 153, 154, 157, 160, 172, 173, 176, and 177 $V_{gs}=V_{in}-V_{dd}>V_{th}$. Here, since the case where $V_{in}$ is unusually high is assumed, the n-channel thin film transistors are turned on. At this time, n-channel thin film transistors included in the protection diodes 151, 152, 156, 161, 170, 171, 174, and 175 are turned off. Then, potentials of wirings 155, 158, 165, 179A, and 179B become $V_{dd}$ through the protection diodes 153, 154, 157, 160, 172, 173, 176, and 177. Therefore, even when the potential $V_{in}$ is unusually higher than the potential $V_{dd}$ due to noise or the like, the potentials of the wirings 155, 158, 165, 179A, and 179B do not become higher than the potential $V_{dd}$.

On the other hand, when the potential $V_{in}$ is lower than the potential $V_{ss}$, the n-channel thin film transistors are turned on when a potential difference between the gate electrodes and the source electrodes of the respective protection diodes 151, 152, 156, 161, 170, 171, 174, and 175 $V_{gs}=V_{ss}-V_{in}>V_{th}$. Here, since the case where $V_{in}$ is unusually low is assumed, the n-channel thin film transistors are turned on. At this time, n-channel thin film transistors included in the protection diodes 153, 154, 157, 160, 172, 173, 176, and 177 are turned off. Then, the potentials of the wirings 155, 158, 165, 179A, and 179B become $V_{ss}$ through the protection diodes 151, 152, 156, 161, 170, 171, 174, and 175. Therefore, even when the potential $V_{in}$ is unusually lower than the potential $V_{ss}$ due to noise or the like, the potentials of the wirings 155, 158, 165, 179A, and 179B do not become lower than the potential $V_{ss}$. Further, the capacitor 162 and the capacitor 163 reduce pulsed noise of the input potential $V_{in}$ and relieve steep change in potential due to noise.

Note that when the potential $V_{in}$ is between $V_{ss}-V_{th}$ and $V_{dd}+V_{th}$, all the n-channel thin film transistors included in the protection diodes are turned off, and the potential $V_{in}$ is input to the potential $V_{out}$.

When the protection circuits are provided, the potentials of the wirings 155, 158, 165, 179A, and 179B are almost kept between the potential $V_{ss}$ and the potential $V_{dd}$ as described above. Therefore, the potentials of the wirings 155, 158, 165, 179A, and 179B can be prevented from deviating this range greatly. That is, the potentials of the wirings 155, 158, 165, 179A, and 179B can be prevented from being unusually high or being unusually low, a circuit in the next stage of the protection circuits can be prevented from being damaged or deteriorating, and the circuit in the next stage can be protected.

Further, when a protection circuit including the resistor 164 is provided for an input terminal as shown in FIG. 3B, potentials of all the wirings to which a signal is input can be kept constant (here the potential $V_{ss}$) when a signal is not input. That is, when a signal is not input, the protection circuit also have a function of a short-circuit ring capable of short-circuiting the wirings. Therefore, electrostatic discharge caused by a potential difference between the wirings can be prevented. In addition, since the resistance value of the resistor 164 is sufficiently larger than wiring resistance, a signal input to the wiring can be prevented from dropping to the potential $V_{ss}$ at the time of inputting the signal.

Here, as an example, the case is described in which n-channel thin film transistors having the threshold voltage $V_{th}=0$ are used for the protection diode 160 and the protection diode 161 in FIG. 3B.

First, in the case of $V_{in}>V_{dd}$, the protection diode 160 is turned on because $V_{gs}=V_{in}-V_{dd}>0$. The protection diode 161 is turned off. Therefore, the potential of the wiring 165 becomes $V_{dd}$, so that $V_{out}=V_{dd}$.

On the other hand, in the case of $V_{in}<V_{ss}$, the protection diode 160 is turned off. The protection diode 161 is turned on because $V_{gs}=V_{ss}-V_{in}>0$. Therefore, the potential of the wiring 165 becomes $V_{ss}$, so that $V_{out}=V_{ss}$.

Even in the case of $V_{in}<V_{ss}$ or $V_{dd}<V_{in}$ in this manner, operations can be performed in a range of $V_{ss}<V_{out}<V_{dd}$. Therefore, even in the case where $V_{in}$ is excessive or too low, $V_{out}$ can be prevented from being excessive or too low. Accordingly, even when the potential $V_{in}$ is lower than the potential $V_{ss}$ due to noise or the like, the potential of the wiring 165 do not become extremely lower than the potential $V_{ss}$. Further, the capacitor 162 and the capacitor 163 reduce pulsed noise of the input potential $V_{in}$ and relieve steep change in potential.

When the protection circuit is provided, the potential of the wirings 165 is almost kept between the potential $V_{ss}$ and the potential $V_{dd}$ as described above. Therefore, the potential of the wiring 165 can be prevented from deviating this range greatly, and a circuit in the next stage of the protection circuit (a circuit, an input portion of which is electrically connected to $V_{out}$) can be protected against damage or deterioration. Further, when a protection circuit is provided for an input terminal, potentials of all the wirings to which a signal is input can be kept constant (here the potential $V_{ss}$) when a signal is not input. That is, when a signal is not input, the protection circuit also have a function of a short-circuit ring capable of short-circuiting the wirings. Therefore, electrostatic discharge caused by a potential difference between the wirings can be prevented. In addition, since the resistance value of the resistor 164 is sufficiently large, decrease in potential of a signal input to the wiring 165 can be prevented at the time of inputting the signal.

Figure 3C:
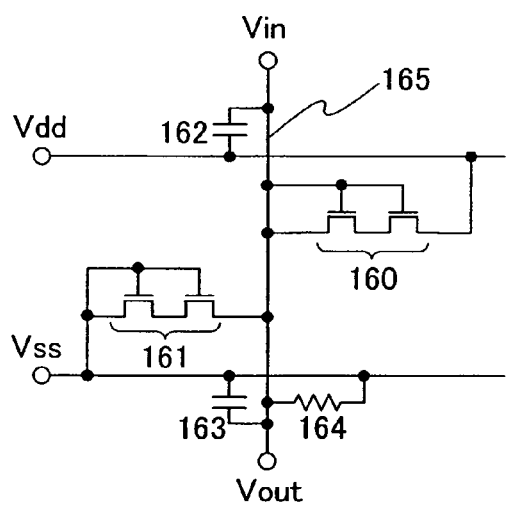

The protection circuit shown in FIG. 3C is a protection circuit in which two n-channel thin film transistors are used as a substitute for each of the protection diode 160 and the protection diode 161.

Note that although diode-connected n-channel thin film transistors are used for the protection diodes in the protection circuits shown in FIGS. 3B and 3C, the present invention is not limited to this structure.

Figure 3D:
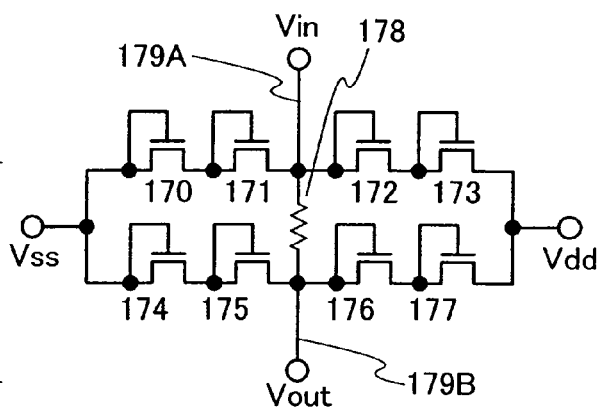

The protection circuit shown in FIG. 3D includes protection diodes 170 to 177 and a resistor 178. The resistor 178 is connected between the wiring 179A and the wiring 179B in series. A diode-connected n-channel thin film transistor is used for each of the protection diodes 170 to 173. A diode-connected n-channel thin film transistor is used for each of the protection diodes 174 to 177.

The protection diode 170 and the protection diode 171 are connected in series, one end thereof is kept at the potential $V_{ss}$, and the other end thereof is connected to the wiring 179A of the potential $V_{in}$. The protection diode 172 and the protection diode 173 are connected in series, one end thereof is kept at the potential $V_{dd}$, and the other end thereof is connected to the wiring 179A of the potential $V_{in}$. The protection diode 174 and the protection diode 175 are connected in series, one end thereof is kept at the potential $V_{ss}$, and the other end thereof is connected to the wiring 179B having the potential $V_{out}$. The protection diode 176 and the protection diode 177 are connected in series, one end thereof is kept at the potential $V_{dd}$, and the other end thereof is connected to the wiring 179B having the potential $V_{out}$.

Figure 3E:
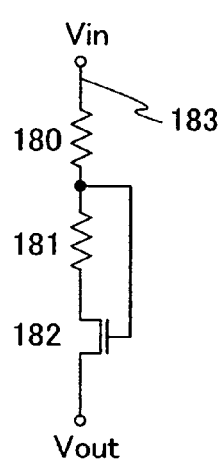

The protection circuit shown in FIG. 3E includes a resistor 180, a resistor 181, and a protection diode 182. Although a diode-connected n-channel thin film transistor is used for the protection diode 182 in FIG. 3E, the present invention is not limited to this structure. A plurality of diode-connected thin film transistors may be used. The resistor 180, the resistor 181, and the protection diode 182 are connected to a wiring 183 in series.

The resistor 180 and the resistor 181 can relieve steep change in the potential of the wiring 183 and can prevent deterioration and damage of a semiconductor element. Further, the protection diode 182 can prevent reverse bias current from flowing through the wiring 183 due to change in potential.

Figure 3F:
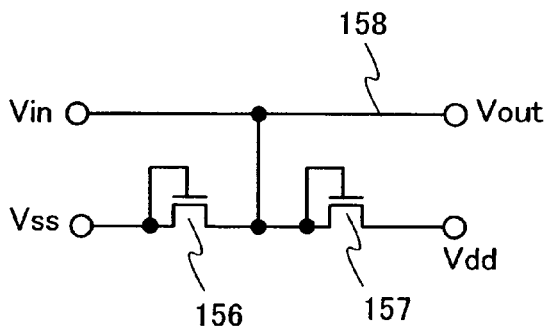

Note that the protection circuit shown in FIG. 3A can be replaced with the structure shown in FIG. 3F. In particular, since the protection circuit used in the present invention has high withstand voltage, a structure such as that shown FIG. 3F can be used.

Note that when only the resistors are connected to the wiring in series, steep change in the potential of the wiring can be relieved and deterioration and damage of a semiconductor element can be prevented. Further, only the protection diode is connected to the wiring in series, the protection diode can prevent reverse bias current from flowing through the wiring due to change in potential.

Note that the protection circuit used in the present invention is not limited to the structures shown in FIGS. 3A to 3F, and design of the protection circuit used in the present invention can be changed as appropriate as long as the protection circuit used in the present invention has a circuit structure having a similar function.

As the protection diode included in the protection circuit of the present invention, a diode-connected thin film transistor is used. A thin film transistor having high withstand voltage is used as the thin film transistor. Therefore, when the protection circuit of the present invention is included, even when voltage such that a protection circuit itself may be damaged in a conventional protection circuit is applied, the potential of a wiring can be prevented from being unusually high or low. Here, a thin film transistor, which is included in the protection diode included in the protection circuit, is described with reference to FIG. 1.

FIG. 1 shows examples of a top view and a cross-sectional view of the protection diode 160 or the like shown in FIGS. 3A to 3F. A thin film transistor included in a protection diode shown in FIG. 1 includes a first conductive layer 102 over a substrate 100, a first insulating layer 104 covering the first conductive layer 102, an LPSAS layer 106 over the first insulating layer 104, a buffer layer 108 over the LPSAS layer 106, an impurity semiconductor layer 110 over the buffer layer 108, a second conductive layer 112 over the impurity semiconductor layer 110, a second insulating layer 114 covering the second conductive layer 112, and a third conductive layer 116 over the second insulating layer 114. Each layer is patterned into a desired shape. The third conductive layer 116 electrically connects the first conductive layer 102 and the second conductive layer 112 through a first opening portion 118 and a second opening portion 120 which are provided in the second insulating layer 114.

Note that one of a source electrode and a drain electrode is provided so as to have a shape of surrounding at least the other of the source electrode and the drain electrode (a U-shape) (see FIG. 1). When an electrode of a thin film transistor used for a protection circuit of a display device has a U-shape as shown in FIG. 1, the channel width of the thin film transistor can be increased and current can flow effectively even when excessive current flows. Therefore, a protection circuit having an excellent original function can be provided.

Next, a method for manufacturing the protection diode shown in FIG. 1 is described. Note that as for a thin film transistor having a microcrystalline semiconductor layer, an n-channel transistor generally has higher mobility than a p-channel transistor. It is preferable that all thin film transistors formed over the same substrate have the same polarity because the number of manufacturing steps can be reduced. Therefore, here, a method for manufacturing an n-channel thin film transistor is described.

First, the first conductive layer 102 is formed over the substrate 100. As the substrate 100, any of the following substrates can be used: an alkali-free glass substrate formed of barium borosilicate glass, aluminoborosilicate glass, aluminosilicate glass, or the like by a fusion method or a float method; a ceramic substrate; a plastic substrate having heat resistance enough to withstand a process temperature of this manufacturing process; and the like. Alternatively, a metal substrate of a stainless alloy or the like with the surface provided with an insulating layer may be used. That is, a substrate having an insulating surface is used as the substrate 100. When the substrate 100 is a mother glass, the substrate may have any of the following sizes: the first generation (e.g., 320 mm×400 mm), the second generation (e.g., 400 mm×500 mm), the third generation (e.g., 550 mm×650 mm), the fourth generation (e.g., 680 mm×880 mm or 730 mm×920 mm), the fifth generation (e.g., 1000 mm×1200 mm or 1100 mm×1300 mm), the sixth generation (e.g., 1500 mm×1800 mm), the seventh generation (e.g., 1900 mm×2200 mm), the eighth generation (e.g., 2160 mm×2460 mm), the ninth generation (e.g., 2400 mm×2800 mm), the tenth generation (e.g., 2850 mm×3050 mm), and the like.

The first conductive layer 102 functions as a gate electrode. The first conductive layer 102 is formed using a metal material such as titanium, molybdenum, chromium, tantalum, tungsten, aluminum, copper, neodymium, or scandium or an alloy material which includes any of these materials as a main component. In the case of using aluminum, an Al—Ta alloy in which aluminum is alloyed with tantalum added thereto is preferably used because hillocks are suppressed. Alternatively, an Al—Nd alloy in which aluminum is alloyed with neodymium added thereto is more preferably used because wiring with low resistance can be formed and hillocks are suppressed. Alternatively, a semiconductor typified by polycrystalline silicon doped with an impurity element such as phosphorus, or an AgPdCu alloy may be used. The first conductive layer 102 may have either a single-layer structure or a stacked-layer structure. For example, a two-layer structure in which a molybdenum layer is stacked over an aluminum layer, a two-layer structure in which a molybdenum layer is stacked over a copper layer, or a two-layer structure in which a titanium nitride layer or a tantalum nitride is stacked over a copper layer is preferable. When a metal layer functioning as a barrier layer is stacked over a layer with low electric resistance, a metal element which has low electric resistance and may diffuse from the metal layer into the microcrystalline semiconductor layer can be prevented from diffusing. Alternatively, a two-layer structure including a titanium nitride layer and a molybdenum layer, or a three-layer structure in which a tungsten layer having a thickness of 50 nm, an alloy layer of aluminum and silicon having a thickness of 500 nm, and a titanium nitride layer having a thickness of 30 nm may be used. When the three-layer structure is used, tungsten nitride may be used instead of tungsten of the first conductive layer, an alloy layer of aluminum and titanium may be used instead of the alloy layer of aluminum and silicon of the second conductive layer, or a titanium layer may be used instead of the titanium nitride layer of the third conductive layer. For example, when a molybdenum layer is stacked over an Al—Nd alloy layer, a conductive layer which has excellent heat resistance and low resistance can be formed.

The first conductive layer 102 can be formed in such a manner that a conductive layer is formed over the substrate 100 by sputtering or a vacuum evaporation method; a mask is formed over the conductive layer by a photolithography technique or an inkjet method; and the conductive layer is etched using the mask. Alternatively, the first conductive layer 102 can be formed by discharging a conductive nanopaste of silver, gold, copper, or the like by an inkjet method and baking the conductive nanopaste. Note that as barrier metal which increases adhesion between the first conductive layer 102 and the substrate 100 and prevents diffusion to a base, a nitride layer of any of the above-described metal materials may be provided between the substrate 100 and the first conductive layer 102. Here, the first conductive layer 102 is formed by etching the conductive layer formed over the substrate 100 by using a resist mask formed using a photomask.

Note that since a semiconductor layer and a wiring layer are formed over the first conductive layer 102 in later steps, it is preferable that the first conductive layer 102 be processed so that end portions thereof are tapered in order to prevent disconnection at portions having steps. In addition, in this step, a scan line can be formed at the same time. Further, a capacitor line included in a pixel portion can also be formed. Note that a scan line refers to a wiring selecting a pixel.

Figure 4A:
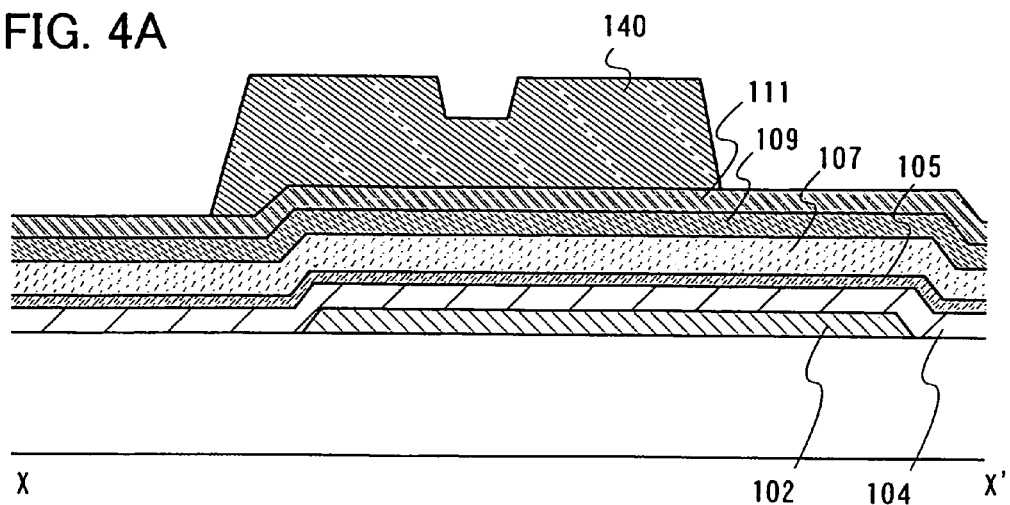
FIGS. 4A to 4C illustrate an example of a method for manufacturing a thin film transistor used in the present invention.

Next, the first insulating layer 104, the microcrystalline semiconductor layer 105, the buffer layer 107, an impurity semiconductor layer 109 to which an impurity element imparting one conductivity type is added, and a layer forming a conductive layer 111 are formed in that order to cover the first conductive layer 102, and a resist mask 140 is formed over the conductive layer 111 by using a multi-tone mask (see FIG. 4A). Note that it is preferable that at least the first insulating layer 104, the microcrystalline semiconductor layer 105, and the buffer layer 107 be formed successively. It is more preferable that the first insulating layer 104, the microcrystalline semiconductor layer 105, the buffer layer 107, and the impurity semiconductor layer 109 be formed successively. When at least the first insulating layer 104, the microcrystalline semiconductor layer 105, and the buffer layer 107 are formed successively without being exposed to the atmosphere, each interface between stacked layers can be formed without being contaminated by an atmospheric constituent or a contaminant impurity element floating in the atmosphere. Thus, variations in electric characteristics of thin film transistors can be reduced, and a semiconductor device having high reliability can be manufactured with high yield.

The first insulating layer 104 functions as a gate insulating layer. The first insulating layer 104 can be formed using silicon oxide, silicon nitride, silicon oxynitride, or silicon nitride oxide by a CVD method, a sputtering method, or the like. The first insulating layer 104 may have either a single-layer structure or a stacked-layer structure of the above-described materials. As the first insulating layer 104, it is preferable that silicon nitride or silicon nitride oxide, and silicon oxide or silicon oxynitride be stacked from the substrate side in that order. This is because silicon nitride and silicon nitride oxide have a high effect of preventing an impurity element contained in the substrate 100 from entering the LPSAS layer 106 when the impurity element is contained in the substrate 100 and silicon oxide and silicon oxynitride have excellent interface properties with the microcrystalline semiconductor layer. Alternatively, as the first insulating layer 104, silicon oxide or silicon oxynitride, silicon nitride or silicon nitride oxide, and silicon oxide or silicon oxynitride may be formed from the substrate side in that order. Alternatively, the first insulating layer 104 may be formed of a single layer of silicon oxide, silicon nitride, silicon oxynitride, or silicon nitride oxide. Further, it is preferable that the first insulating layer 104 be formed by using a microwave plasma CVD method with a frequency of higher than or equal to 1 GHz. Silicon oxynitride or silicon nitride oxide formed by a microwave plasma CVD method has high withstand voltage because of dense film quality, and reliability of a thin film transistor which is formed later can be improved.

The first insulating layer 104 preferably has a two-layer structure in which silicon oxynitride is stacked over silicon nitride oxide. This stacked-layer is formed such that the thickness thereof is greater than or equal to 50 nm, preferably 50 to 200 nm. Silicon nitride oxide can prevent alkali metal or the like contained in the substrate 100 from being mixed into the LPSAS layer 106. Further, silicon oxynitride can prevent hillocks which can be generated in the case of using aluminum for the first conductive layer 102 and also prevents the first conductive layer 102 from being oxidized.

Note that silicon oxynitride refers to a material which contains more oxygen than nitrogen and contains oxygen, nitrogen, silicon, and hydrogen at concentrations ranging from 55 to 65 at. %, 1 to 20 at. %, 25 to 35 at. %, and 0.1 to 10 at. %, respectively. Further, silicon nitride oxide refers to a material that contains more nitrogen than oxygen and contains oxygen, nitrogen, silicon, and hydrogen at concentrations ranging from 15 to 30 at. %, 20 to 35 at. %, 25 to 35 at. %, and 15 to 25 at. %, respectively.

Note that after the first insulating layer 104 is formed and before the microcrystalline semiconductor layer 105 is formed, a layer for increasing adhesion of the microcrystalline semiconductor layer 105 and preventing the microcrystalline semiconductor layer 105 from being oxidized by LP is preferably formed over the first insulating layer 104. With this treatment, adhesion of the microcrystalline semiconductor layer 105 can be increased and the microcrystalline semiconductor layer 105 can be prevented from being oxidized at the time of LP.

The microcrystalline semiconductor layer 105 serves as the LPSAS layer 106 through the later step. The microcrystalline semiconductor layer 105 is formed using a semiconductor having an intermediate structure between amorphous and crystalline structures (including a single crystal and a polycrystal). A microcrystalline semiconductor is a semiconductor which has a third state which is stable in free energy, is a crystalline semiconductor which has a short-range order and lattice distortion, and can be dispersed in a non-single-crystal semiconductor, with a grain size of 0.5 to 20 nm. Microcrystalline silicon, which is a typical example of a microcrystalline semiconductor, has a Raman spectrum which is shifted to a wave number side lower than 520.6 cm$^{-1}$ that represents single-crystal silicon. That is, the peak of a Raman spectrum of microcrystalline silicon is within the range from 481 cm$^{-1}$ to 520.6 cm$^{-1}$. In addition, microcrystalline silicon contains hydrogen or halogen of at least 1 at. % or more in order to terminate a dangling bond. Moreover, microcrystalline silicon contains a rare gas element such as helium, argon, krypton, or neon to further promote lattice distortion, so that stability is increased and a favorable microcrystalline semiconductor layer can be obtained. Such a microcrystalline semiconductor is disclosed in, for example, Reference 3.

Note that when a half width of the peak of a Raman spectrum is used, the grain size of a crystal grain contained in a microcrystalline semiconductor layer can be calculated.

However, it can be considered that the shape of a crystal grain which is actually contained in a microcrystalline semiconductor layer is not rounded.

The microcrystalline semiconductor layer 105 can be formed by a high-frequency plasma CVD method with a frequency of several tens to several hundreds of megahertz or a microwave plasma CVD method with a frequency of 1 GHz or more. Typically, the microcrystalline semiconductor layer 105 can be formed using a dilution of silicon hydride such as $SiH_4$ or $Si_2H_6$ with hydrogen. With a dilution with one or plural kinds of rare gas elements selected from helium, argon, krypton, or neon in addition to silicon hydride and hydrogen, the microcrystalline semiconductor layer 105 can be formed. In that case, the flow ratio of hydrogen to silicon hydride is 5:1 to 200:1, preferably, 50:1 to 150:1, more preferably, 100:1. Note that instead of silicon hydride, $SiH_2Cl_2$, $SiHCl_3$, $SiCl_4$, $SiF_4$, or the like can be used.

A microcrystalline semiconductor layer exhibits weak n-type conductivity when an impurity element for valence control is not intentionally added. Thus, the threshold voltage $V_{th}$ is preferably controlled by adding an impurity element imparting p-type conductivity to a microcrystalline semiconductor layer which functions as a channel formation region of a thin film transistor at the same time as or after film formation. A typical example of an impurity element imparting p-type conductivity is boron, and an impurity gas such as $B_2H_6$ or $BF_3$ may be mixed into silicon hydride at a proportion of 1 to 1000 ppm, preferably, 1 to 100 ppm. The concentration of boron may be, for example, $1\times10^{14}$ to $6\times10^{16}$ $cm^{-3}$.

In addition, the oxygen concentration of the microcrystalline semiconductor layer is preferably $1\times10^{19}$ $cm^{-3}$ or less, more preferably $5\times10^{18}$ $cm^{-3}$ or less and each of the nitrogen concentration and the carbon concentration is preferably $5\times10^{18}$ $cm^{-3}$ or less, more preferably $1\times10^{18}$ $cm^{-3}$ or less. When concentrations of oxygen, nitrogen, and carbon to be mixed into the microcrystalline semiconductor layer are decreased, a channel formation region of the microcrystalline semiconductor layer can be prevented from being changed into an n-type semiconductor. Further, when the concentrations of mixture of these elements are varied among elements, variations in the threshold voltage $V_{th}$ occur. Thus, when these concentrations are decreased, variations in the threshold voltage $V_{th}$ in a substrate can be reduced.

The microcrystalline semiconductor layer 105 is formed to a thickness of 2 to 50 nm, preferably 10 nm to 30 nm. The microcrystalline semiconductor layer 105 functions as a channel formation region of a thin film transistor. When the thickness of the microcrystalline semiconductor layer 105 is within the range from 2 to 50 nm, a thin film transistor can be made a fully depleted type. In addition, since the formation rate of the microcrystalline semiconductor layer is low, i.e., a tenth to a hundredth of the formation rate of an amorphous semiconductor layer, the microcrystalline semiconductor layer 105 is preferably formed thinly. When the microcrystalline semiconductor layer 105 is formed thinly, throughput can be improved. Furthermore, since the microcrystalline semiconductor layer contains microcrystals, it has lower resistance than an amorphous semiconductor layer. Further, in a thin film transistor using a microcrystalline semiconductor, a rising portion of a curve of current-voltage characteristics in which the horizontal axis represents gate voltage and the vertical axis represents source-drain current is represented by a steep slope. Therefore, a thin film transistor using a microcrystalline semiconductor for a channel formation region has an excellent response as a switching element and can be operated at high speed. When a microcrystalline semiconductor is used for a channel formation region of a thin film transistor, fluctuation in the threshold voltage $V_{th}$ of the thin film transistor can be suppressed. When the fluctuation in the threshold voltage $V_{th}$ is suppressed, a display device with little variation in electric characteristics can be manufactured.

A microcrystalline semiconductor has higher carrier mobility than an amorphous semiconductor. Thus, when a thin film transistor, a channel formation region of which is formed using a microcrystalline semiconductor, is used as a switching element in a display device, the area of the channel formation region, i.e., the area of the thin film transistor can be decreased. Accordingly, the area of a protection circuit can be decreased, and the frame of a display device can be narrowed.

As the buffer layer 107, an amorphous semiconductor layer is formed using the same material as that of the microcrystalline semiconductor layer 105. The amorphous semiconductor layer can be formed using silicon hydride such as $SiH_4$ or $Si_2H_6$ by a plasma CVD method. Alternatively, with a dilution of silicon hydride described above with one or plural kinds of rare gas elements selected from helium, argon, krypton, or neon, the amorphous semiconductor layer can be formed. When hydrogen at a flow rate which is 1 to 20 times, preferably 1 to 10 times, more preferably 1 to 5 times higher than that of silicon hydride is used, a hydrogen-containing amorphous semiconductor layer can be formed. When silicon hydride described above and nitrogen or ammonia are used, a nitrogen-containing amorphous semiconductor layer can be formed. When silicon hydride described above and a gas containing fluorine or chlorine ($F_2$, $Cl_2$, HF, HCl, or the like) are used, an amorphous semiconductor layer containing fluorine or chlorine can be formed. Note that instead of silicon hydride, $SiH_2Cl_2$, $SiHCl_3$, $SiCl_4$, $SiF_4$, or the like can be used. Note that the thickness of the amorphous semiconductor layer is 100 to 500 nm, preferably 150 to 400 nm, more preferably 200 to 300 nm.

Alternatively, the buffer layer 107 may be formed using an amorphous semiconductor layer formed by sputtering with hydrogen or a rare gas using an amorphous semiconductor as a target. In this case, when ammonia, nitrogen, or $N_2O$ is contained in an atmosphere, a nitrogen-containing amorphous semiconductor layer can be formed. Alternatively, when a gas including fluorine or chlorine ($F_2$, $Cl_2$, HF, HCl or the like) is contained in an atmosphere, an amorphous semiconductor layer containing fluorine or chlorine can be formed.

Alternatively, the buffer layer 107 may be formed by forming an amorphous semiconductor layer on the surface of the microcrystalline semiconductor layer 105 by a plasma CVD method or a sputtering method and then by performing hydrogenation, nitridation, or halogenation of the surface of the amorphous semiconductor layer through processing of the surface of the amorphous semiconductor layer with hydrogen plasma, nitrogen plasma, or halogen plasma. Alternatively, the surface of the amorphous semiconductor layer may be processed with helium plasma, neon plasma, argon plasma, krypton plasma, or the like.

Although the buffer layer 107 is formed using an amorphous semiconductor, it is preferable that an amorphous semiconductor layer does not contain crystal grains. Therefore, when the buffer layer 107 is formed by a high-frequency plasma CVD method with a frequency of several tens to several hundreds of megahertz or a microwave plasma CVD method, formation conditions are preferably controlled so that the amorphous semiconductor layer does not contain crystal grains.

The buffer layer 107 has a depression portion which is formed when part of the buffer layer 107 is etched in a later step of forming a source region and a drain region. The buffer layer 107 is preferably formed to a thickness such that part of the buffer layer 108, which overlaps with the depression portion, remains after etching. It is preferable that the thickness of a remaining portion after etching (a portion overlapping with the depression portion) be approximately half the thickness before etching. Note that the thickness before etching is 100 to 500 nm, preferably 150 to 400 nm, more preferably 200 to 300 nm as described above. Note that since the thickness of part of the buffer layer 108, which overlaps with the impurity semiconductor layer 109, is not decreased in the step of forming a source region and a drain region, the thickness thereof is 100 to 500 nm, preferably 150 to 400 nm, more preferably 200 to 300 nm. When an amorphous semiconductor layer serving as the buffer layer 108 is sufficiently thick as described above, the LPSAS layer 106 can be formed stably. In this manner, the buffer layer 108 prevents the LPSAS layer 106 from being etched.

Note that it is preferable that an impurity imparting one conductivity type, such as phosphorus or boron be not added to the buffer layer 107. In particular, it is preferable that boron added to the LPSAS layer 106 for controlling the threshold voltage or phosphorus contained in the impurity semiconductor layer 110 be not mixed into the buffer layer 108. For example, when the buffer layer 108 contains phosphorus, a PN junction is formed between the LPSAS layer 106 and the buffer layer 108. Alternatively, when the buffer layer 108 contains boron, a PN junction is formed between the buffer layer 108 and the impurity semiconductor layer 110. Alternatively, when the buffer layer 108 contains both boron and phosphorus, a recombination center is generated, which causes leakage current. When the buffer layer 108 does not contain such an impurity imparting one conductivity type, a region where leakage current is generated is not provided, so that leakage current can be reduced. When the buffer layer 108, which is an amorphous semiconductor layer to which an impurity imparting one conductivity type, such as phosphorus or boron is not added, is provided between the impurity semiconductor layer 110 and the LPSAS layer 106, diffusion of the impurity contained in each of the LPSAS layer 106 serving as a channel formation region and the impurity semiconductor layer 110 serving as a source region and a drain region can be prevented.

When an amorphous semiconductor layer and an amorphous semiconductor layer containing hydrogen, nitrogen, or halogen are formed on the surface of the microcrystalline semiconductor layer 105, surfaces of crystal grains contained in the microcrystalline semiconductor layer 105 can be prevented from being oxidized naturally. In particular, in a region where an amorphous semiconductor is in contact with microcrystal grains, a crack is easily generated due to distortion of a crystal lattice. When this crack is exposed to oxygen, the microcrystal grains are oxidized, so that silicon oxide is formed. When the buffer layer 107 is formed on the surface of the microcrystalline semiconductor layer 105, the microcrystal grains can be prevented from being oxidized. Alternatively, although different radicals enter this crack and crystals may grow, crystals tend to grow upward in a needle-like form because crystals grow so as to increase a crystal surface. Further, when the buffer layer 107 is formed, the LPSAS layer 106 can be prevented from being mixed with an etching residue which is generated in forming a source region and a drain region. Therefore, variations in electric characteristics among elements can be reduced, so that a thin film transistor having high reliability can be manufactured with high yield.

The buffer layer 107 is formed using an amorphous semiconductor or an amorphous semiconductor containing hydrogen, nitrogen, or halogen. An amorphous semiconductor has a larger energy gap than a microcrystalline semiconductor (the energy gap of an amorphous semiconductor is 1.6 to 1.8 eV and the energy gap of a microcrystalline semiconductor is 1.1 to 1.5 eV), has higher electric resistance, and has lower mobility, i.e., a fifth to a tenth of that of a microcrystalline semiconductor. Therefore, in a thin film transistor which is formed, the buffer layer 107 formed between the impurity semiconductor layer 109 and the microcrystalline semiconductor layer 105 functions as a high-resistance region, and the microcrystalline semiconductor layer 105 functions as a channel formation region. Accordingly, the buffer layer 108 does not function as a channel formation region. Therefore, off current of the thin film transistor can be reduced. When such a thin film transistor is used as a switching element of a liquid crystal display device, contrast of the liquid crystal display device can be improved.

In the case of forming an n-channel thin film transistor, phosphorus may be added to the impurity semiconductor layer 109 as a typical impurity element, and an impurity gas containing an impurity element imparting one conductivity type, such as $PH_3$ may be added to silicon hydride. Alternatively, in the case of forming a p-channel thin film transistor, boron may be added to the impurity semiconductor layer 109 as a typical impurity element, and an impurity gas such as $B_2H_6$ may be added to silicon hydride. The impurity semiconductor layer 109 can be formed using a microcrystalline semiconductor or an amorphous semiconductor. The impurity semiconductor layer 109 is formed to a thickness of 2 to 50 nm. That is, it is preferable that the thickness of the impurity semiconductor layer 109 be almost equal to that of the LPSAS layer 106. When the impurity semiconductor layer 109 is formed thinly, throughput can be improved.

Figure 6:
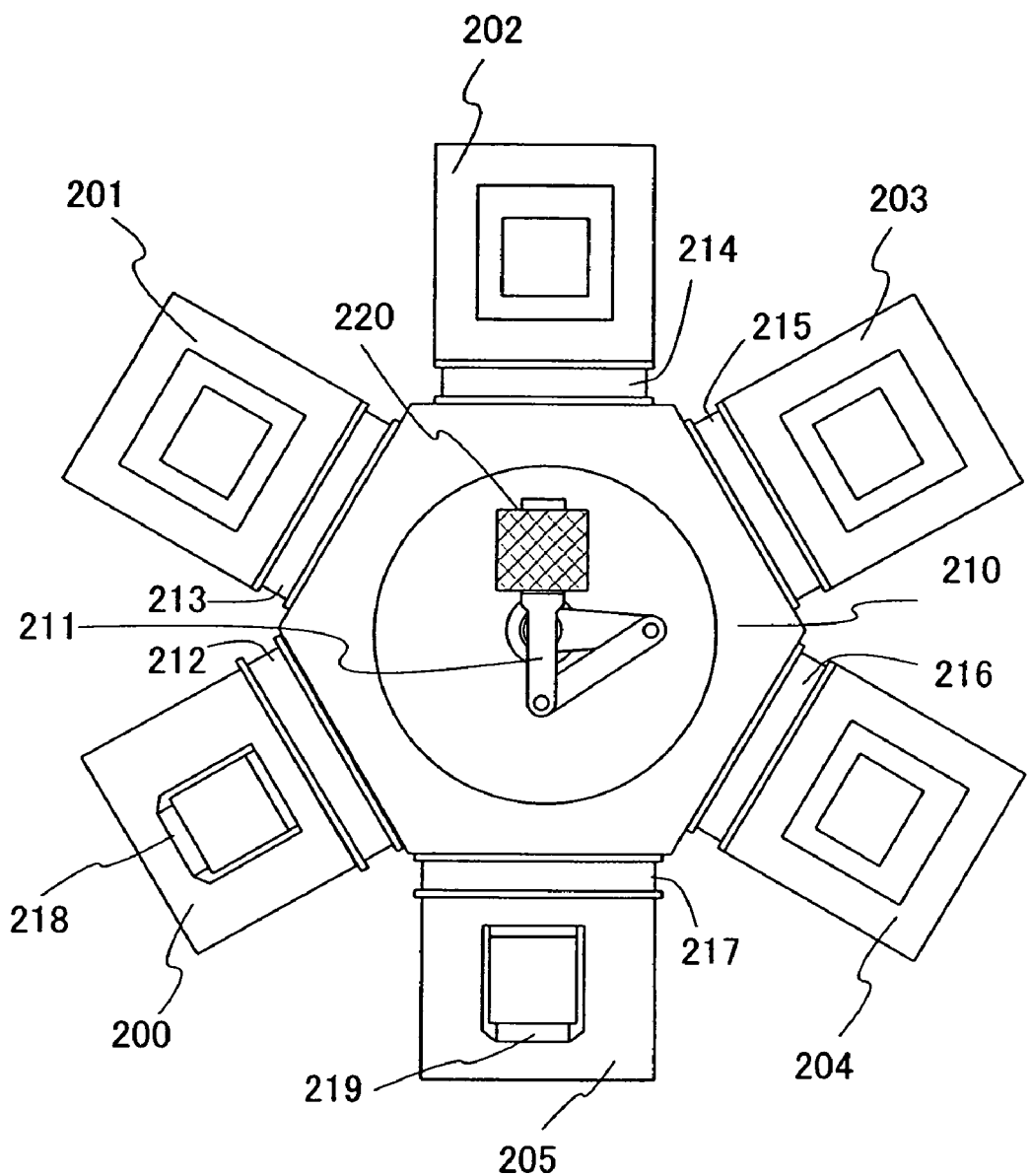
FIG. 6 is a top view of a plasma CVD apparatus used for manufacturing a thin film transistor used in the present invention.

In the present invention, as described above, the first insulating layer 104, the microcrystalline semiconductor layer 105, the LPSAS layer 106, the buffer layer 107, the buffer layer 108, and the impurity semiconductor layer 109 are preferably formed successively. Here, a microwave plasma CVD method, with which the first insulating layer 104 to the impurity semiconductor layer 109 can be formed successively, is described with reference to FIG. 6, for example. Note that a high-frequency plasma CVD method as well as a microwave plasma CVD method may be used in the present invention. FIG. 6 is a schematic diagram showing a top cross section of a microwave plasma CVD apparatus, which includes a loading chamber 200, an unloading chamber 205, and first to fourth reaction chambers 201 to 204 around a common chamber 210 shown in the center. Between the common chamber 210 and the other chambers, gate valves 212 to 217 are provided so that processes performed in the chambers do not interfere with each other. Substrates are loaded into a cassette 218 in the loading chamber 200 and a cassette 219 in the unloading chamber 205 and carried to the first to fourth reaction chambers 201 to 204 with a transport means 211 of the common chamber 210. In this apparatus, a reaction chamber can be allocated for each different kinds of deposition films, and a plurality of different films can be formed successively without being exposed to the atmosphere.

In each of the first to fourth reaction chambers 201 to 204, the first insulating layer 104, the microcrystalline semiconductor layer 105, the buffer layer 107, and the impurity semiconductor layer 109 are stacked. In this case, a plurality of layers of different kinds can be stacked successively by changing of source gases. In this case, after the first insulating layer 104 is formed, silicon hydride such as silane is introduced into the reaction chamber, residual oxygen and silicon hydride are reacted with each other, and the reactant is exhausted from the reaction chamber, so that the concentration of residual oxygen in the reaction chamber can be decreased. Accordingly, the concentration of oxygen contained in the microcrystalline semiconductor layer 105 can be decreased. In addition, crystal grains contained in the microcrystalline semiconductor layer 105 can be prevented from being oxidized.

Alternatively, an insulating layer serving as the first insulating layer 104, the microcrystalline semiconductor layer, and the amorphous semiconductor layer are formed in each of the first reaction chamber 201 and the third reaction chamber 203, and the impurity semiconductor layer 109 is formed in each of the second reaction chamber 202 and the fourth reaction chamber 204. When the impurity semiconductor layer 109 is formed alone, an impurity imparting one conductivity type which remains in the chamber can be prevented from being mixed into another layer.

When a microwave plasma CVD apparatus to which a plurality of chambers are connected as shown in FIG. 6 is used, the first insulating layer 104, the microcrystalline semiconductor layer 105, the buffer layer 107, and the impurity semiconductor layer 109 can be formed successively. Thus, mass productivity (productivity) can be improved. In addition, even when maintenance or cleaning is performed on one of reaction chambers, a film formation process can be performed in other reaction chambers, so that takt time for film formation can be shortened. Further, each interface between stacked layers can be formed without being contaminated by an atmospheric constituent or a contaminant impurity element floating in the atmosphere. Thus, variations in electric characteristics of thin film transistors can be reduced.

Alternatively, the first insulating layer 104 can be formed in the first reaction chamber 201, the microcrystalline semiconductor layer 105 and the amorphous semiconductor layer 107 can be formed in the second reaction chamber 202, and the impurity semiconductor layer 109 can be formed in the third reaction chamber 203. Alternatively, since the formation rate of microcrystalline semiconductor layers is low, the microcrystalline semiconductor layers may be formed by using a plurality of reaction chambers. For example, the first insulating layer 104 may be formed in the first reaction chamber 201, the microcrystalline semiconductor layer 105 may be formed in the second reaction chamber 202 and the third reaction chamber 203, the buffer layer 107 may be formed in the fourth reaction chamber 204, and the impurity semiconductor layer 110 may be formed in a fifth reaction chamber (not shown). In this manner, when the microcrystalline semiconductor layers are formed at the same time by using a plurality of reaction chambers, throughput can be improved. In this case, it is preferable that the inner wall of each reaction chamber be coated with a film of the same kind as a film to be formed therein.

When a microwave plasma CVD apparatus having the structure shown in FIG. 6 is used, layers of similar kinds or a layer of one kind can be formed in each reaction chamber and can be formed successively without being exposed to the atmosphere. Therefore, stacked layers can be formed without contamination of each interface thereof by a residue of the formed layer or an impurity element floating in the atmosphere.

Note that the microwave plasma CVD apparatus shown in FIG. 6 is provided with the loading chamber and the unloading chamber separately, which may be a single loading/unloading chamber. In addition, the microwave plasma CVD apparatus may be provided with a spare chamber. When a substrate is preheated in the spare chamber, heating time needed before film formation in each reaction chamber can be shortened. Thus, throughput can be improved.

Next, a film formation process is described. In the film formation process, a gas to be supplied from a gas supply portion may be selected depending on the purpose.

Here, the case where the first insulating layer 104 is formed with a two-layer structure is described. A method in which a silicon nitride oxide layer is formed as the first insulating layer 104 and a silicon oxynitride layer is formed on the silicon nitride oxide layer is described as an example.

First, the inside of a processing container in a reaction chamber of the microwave plasma CVD apparatus is cleaned with fluorine radicals. Note that the inside of the reaction chamber can be cleaned by introducing fluorine radicals into the reaction chamber, which are generated by introducing carbon fluoride, nitrogen fluoride, or fluorine into a plasma generator provided outside the reaction chamber and dissociating the gas.

When a large amount of hydrogen is introduced into the reaction chamber after the inside of the reaction chamber is cleaned with fluorine radicals, residual fluorine inside the reaction chamber can be reacted with hydrogen, so that the concentration of residual fluorine can be decreased. Thus, the amount of fluorine to be mixed into a protective layer which is to be formed later on the inner wall of the reaction chamber can be decreased, and the thickness of the protective film can be decreased.

Next, on the surface of the inner wall of the processing container in the reaction chamber, or the like, a silicon oxynitride layer is deposited as the protective layer. Here, the pressure in the processing container is 1 to 200 Pa, preferably 1 to 100 Pa, and one or more kinds of rare gases such as helium, argon, xenon, and krypton are introduced as a plasma ignition gas. Further, hydrogen is introduced in addition to any one kind of rare gases. In particular, it is preferable that helium, moreover, a mixed gas of helium and hydrogen be used as a plasma ignition gas.

Although helium has a high ionization energy of 24.5 eV, it has a metastable state at about 20 eV. Thus, helium can be ionized at about 4 eV during discharge. Therefore, discharge starting voltage is low and discharge can be maintained easily. Accordingly, generated plasma can be maintained uniformly, and power can be saved.

Alternatively, as the plasma ignition gas, an oxygen gas may be further introduced. When an oxygen gas as well as a rare gas is introduced into the processing container, plasma ignition can be facilitated.

Next, a microwave generating apparatus is turned on and the output of the microwave generating apparatus is 500 to 6000 W, preferably 4000 to 6000 W to generate plasma. Then, a source gas is introduced into the processing container through a gas pipe. Specifically, when silane, dinitrogen monoxide, and ammonia are introduced as a source gas, a silicon nitride oxide layer is formed as the protective layer on the inner wall of the processing container and on the surfaces of the gas pipe, a dielectric plate, and a support base. Note that nitrogen may be introduced as a source gas instead of ammonia. The protective layer is formed to have a thickness of 500 to 2000 nm.

Next, supply of the source gas is stopped, the pressure in the processing container is decreased, and the microwave generating apparatus is turned off. After that, a substrate is introduced onto the support base in the processing container.

Next, through a process which is similar to that of the protective layer, a silicon nitride oxide layer is deposited over the substrate as the first insulating layer 104.

After the silicon oxynitride layer is deposited to a predetermined thickness, supply of the source gas is stopped, the pressure in the processing container is decreased, and the microwave generating apparatus is turned off.

Next, the pressure in the processing container is 1 to 200 Pa, preferably 1 to 100 Pa, and one or more kinds of rare gases such as helium, argon, xenon, and krypton which are a plasma ignition gas, and dinitrogen monoxide, a rare gas, and silane which are a source gas are introduced. Then, the microwave generating apparatus is turned on, and the output of the microwave generating apparatus is 500 to 6000 W, preferably 4000 to 6000 W to generate plasma. Next, the source gas is introduced into the processing container through the gas pipe, and a silicon nitride oxide layer is formed over the silicon oxynitride layer over the substrate. Then, supply of the source gas is stopped, the pressure in the processing container is decreased, the microwave generating apparatus is turned off, and the film formation process is completed.

Through the above-described process, the silicon nitride oxide layer is formed as the protective layer on the inner wall of the reaction chamber, and the silicon nitride oxide layer and the silicon oxynitride layer are successively formed over the substrate, so that mixture of an impurity element into the silicon oxynitride layer on the upper layer side can be suppressed. When the above-mentioned layers are formed by a microwave plasma CVD method using a power supply apparatus capable of generating a microwave, plasma density can be made higher and dense layers are formed. Therefore, films having high withstand voltage can be formed. When the films are used as gate insulating layers of thin film transistors, variations in the threshold voltage of the thin film transistors can be suppressed. In addition, the number of defects measured by BT (bias temperature) test can be reduced. Further, resistance to static electricity is increased, and a transistor which is not easily damaged even when high voltage is applied thereto can be manufactured. Furthermore, a transistor which is not easily damaged over time can be manufactured. Moreover, a transistor with less hot carrier damage can be manufactured.

In the case where the silicon oxynitride layer which is formed as the first insulating layer 104 by using the microwave plasma CVD method is a single layer, the above-described formation method of the protective layer and the formation method of the silicon oxynitride layer are used. In particular, when the flow ratio of dinitrogen monoxide to silane is 100:1 to 300:1, preferably 150:1 to 250:1, a silicon oxynitride layer having high withstand voltage can be formed.

Next, a film formation process is described in which a microcrystalline semiconductor layer formed by a microwave plasma CVD method and an amorphous semiconductor film functioning as a buffer layer are successively formed. First, in a manner similar to the formation of the insulating layers, the inside of the reaction chamber is cleaned. Next, a silicon layer is deposited as a protective layer inside the processing container. As the silicon layer, an amorphous semiconductor layer is formed to a thickness of 0.2 to 0.4 μm. Here, the pressure in the processing container is 1 to 200 Pa, preferably 1 to 100 Pa, and one or more kinds of rare gases such as helium, argon, xenon, and krypton are introduced as a plasma ignition gas. Note that hydrogen may be introduced together with the rare gas.

Then, the microwave generating apparatus is turned on, and the output of the microwave generating apparatus is 500 to 6000 W, preferably 4000 to 6000 W to generate plasma. Next, a source gas is introduced into the processing container through the gas pipe. Specifically, when a silicon hydride gas and a hydrogen gas are introduced as a source gas, a microcrystalline silicon layer is formed as a protective layer on the inner wall of the processing container and on the surfaces of the gas pipe, the dielectric plate, and the support base. Alternatively, a microcrystalline semiconductor layer can be formed from a dilution of a silicon hydride gas and a hydrogen gas with one or more kinds of rare gas elements selected from helium, argon, krypton, and neon. Here, the flow ratio of hydrogen to silicon hydride is 5:1 to 200:1, preferably 50:1 to 150:1, more preferably 100:1. In addition, the thickness of the protective layer at this time is 500 to 2000 nm. Note that before the microwave generating apparatus is turned on, a silicon hydride gas and a hydrogen gas may be introduced into the processing container in addition to the above-mentioned rare gas.

Alternatively, an amorphous semiconductor layer can be formed as the protective layer from a dilution of a silicon hydride gas with one or more kinds of rare gas elements selected from helium, argon, krypton, and neon.

Then, supply of the source gas is stopped, the pressure in the processing container is decreased, and the microwave generating apparatus is turned off. After that, the substrate is introduced onto the support base in the processing container.

Next, hydrogen plasma treatment is performed on the surface of the first insulating layer 104 which functions as a gate insulating layer and is formed over the substrate. When hydrogen plasma treatment is performed on the surface of the first insulating layer 104 before the microcrystalline semiconductor layer is formed, lattice distortion at the interface between the first insulating layer 104 and the LPSAS layer 106 can be decreased, and interface characteristics between the first insulating layer 104 and the LPSAS layer 106 can be improved. Thus, electric characteristics of a thin film transistor which is to be formed can be improved.

In the hydrogen plasma treatment, hydrogen plasma treatment is also performed on the amorphous semiconductor layer or the microcrystalline semiconductor layer which is formed as the protective layer inside the processing container, so that the protective layer is etched and a slight amount of semiconductor is deposited on the surface of the first insulating layer 104. The slight amount of semiconductor serves as a nucleus of crystal growth, and with the nucleus, the microcrystalline semiconductor layer is formed. Accordingly, lattice distortion at the interface between the first insulating layer 104 and the LPSAS layer 106 can be decreased, and interface characteristics between the first insulating layer 104 and the LPSAS layer 106 can be improved. Therefore, electric characteristics of a thin film transistor which is to be formed can be improved.

Next, in a manner similar to that of the protective layer, a microcrystalline semiconductor is deposited over the substrate. The thickness of a microcrystalline silicon layer is 2 to 50 nm, preferably 10 to 30 nm. Note that silicon is used as a microcrystalline semiconductor.

Note that crystals of the microcrystalline semiconductor layer grow from a bottom portion of the layer toward an upper portion of the layer and needle-like crystals are formed. This is because crystals grow so as to increase a crystal surface. However, even when crystal growth is generated in this manner, the formation rate of the microcrystalline semiconductor layer is a tenth to a hundredth of the formation rate of an amorphous semiconductor layer.

After the microcrystalline semiconductor layer is deposited to a predetermined thickness, supply of the source gas is stopped, the pressure in the processing container is decreased, the microwave generating apparatus is turned off, and the film formation process for the microcrystalline semiconductor layer is completed.

Next, laser light is delivered to the microcrystalline semiconductor layer from the surface side of the microcrystalline semiconductor layer. This step is described below.

As for the formation of a microcrystalline semiconductor layer in the present invention, after a microcrystalline semiconductor layer is deposited over a gate insulating layer, laser light may be delivered from the surface side of the microcrystalline semiconductor layer. The laser light is delivered at energy density such that the semi-amorphous silicon layer does not melt. That is, LP treatment in the present invention refers to laser treatment by which solid-phase crystallization growth which is performed by radiation heating without melting the semi-amorphous silicon layer is generated. In other words, LP treatment in the present invention refers to laser treatment utilizing a critical region where the deposited semi-amorphous silicon layer is not in a liquid phase. Therefore, LP treatment in the present invention can also be referred to as critical growth.

The laser light can be delivered to an interface between the semi-amorphous silicon layer and the gate insulating layer. Thus, solid-phase crystallization growth proceeds from a surface toward the interface between the semi-amorphous silicon layer and the gate insulating layer with a crystal formed on the surface side of the semi-amorphous silicon layer used as a nucleus, and an almost columnar crystal is formed. The solid-phase crystallization growth by the LP treatment does not increase a crystal grain size but improves crystallinity in a direction of layer thickness.

In the LP treatment, when a laser beam is condensed in a long rectangular shape (is shaped into a linear laser beam), a 730 mm×920 mm semi-amorphous silicon layer over a glass substrate can be treated by one laser beam scanning. In this case, the LP treatment is performed with a ratio of overlapping linear laser beams (an overlapping ratio) of 0 to 90%, preferably 0 to 67%. Thus, treatment time for one substrate is shortened, so that productivity can be improved. Note that the shape of a laser beam is not limited to a linear shape, and similar treatment can be performed when the shape of a laser beam is a plane shape. Further, the LP treatment is not limited by the size of the glass substrate, and the LP treatment can be used for substrates with various sizes. When the LP treatment is performed, crystallinity of a region of the interface between the microcrystalline semiconductor layer and the gate insulating layer is improved, so that electric characteristics of a transistor having a bottom-gate structure is improved.

Through such a critical growth, unevenness (convexity called a ridge) generated on the surface of conventional low-temperature polysilicon is not formed, and the surface of silicon, on which LP treatment is performed, is kept smoothed.

Therefore, an LPSAS layer of the present invention, which is obtained by directly delivering laser light to a formed semi-amorphous silicon layer has growth mechanism and film quality of a layer to be formed which are greatly different from those of a microcrystalline silicon layer remaining deposited in a conventional technique or a microcrystalline silicon layer modified by conduction heating (see Reference 5).

After the LPSAS layer is formed, an amorphous semiconductor layer is formed at a temperature of 300 to 400° C. by plasma CVD. With this film formation treatment, hydrogen is supplied to the LPSAS layer and an effect which is similar to that in the case of hydrogenating the LPSAS layer can be obtained. That is, when the amorphous semiconductor layer is deposited over the LPSAS layer, hydrogen is diffused into the LPSAS layer so that a dangling bond can be terminated.

Next, the pressure in the processing container is reduced so as to adjust the flow rate of a source gas. Specifically, the flow rate of a hydrogen gas is considerably decreased comparing film formation conditions of the microcrystalline semiconductor layer. Typically, a hydrogen gas at a flow rate which is 1 to 20 times, preferably 1 to 10 times, more preferably 1 to 5 times higher than that of silicon hydride is introduced. Alternatively, not a hydrogen gas but a silicon hydride gas may be introduced into the processing container. When the flow rate of hydrogen to silicon hydride is decreased in this manner, the formation rate of the amorphous semiconductor layer which is formed as a buffer layer can be increased. Alternatively, a silicon hydride gas is diluted with one or more kinds of rare gas elements selected from helium, argon, krypton, and neon. Then, the microwave generating apparatus is turned on, and the output of the microwave generating apparatus is 500 to 6000 W, preferably 4000 to 6000 W to generate plasma. Thus, an amorphous semiconductor layer can be formed. Since the formation rate of an amorphous semiconductor is higher than that of a microcrystalline semiconductor, the pressure in the processing container can be set low. The thickness of the amorphous semiconductor layer at this time is 100 to 400 nm.

After the amorphous semiconductor layer is deposited to a predetermined thickness, supply of the source gas is stopped, the pressure in the processing container is decreased, the microwave generating apparatus is turned off, and the film formation process for the amorphous semiconductor layer is completed.

Note that the microcrystalline semiconductor layer 105 and an amorphous semiconductor layer serving as the buffer layer 107 may be formed while plasma is ignited. Specifically, the microcrystalline semiconductor layer 105 and an amorphous semiconductor layer serving as the buffer layer 107 may be formed with the flow rate of hydrogen to silicon hydride gradually decreased. With such a method, an impurity is not deposited at an interface between the microcrystalline semiconductor layer 105 and the buffer layer 107 and an interface with little distortion can be formed. Thus, electric characteristics of a thin film transistor which is to be formed later can be improved.

Plasma which is generated by a microwave plasma CVD apparatus with a frequency of 1 GHz or more has high electron density and many radicals are generated from a source gas and are supplied to a substrate 220. Thus, radical reaction on the substrate surface is promoted and the formation rate of a microcrystalline semiconductor can be increased. Further, a microwave plasma CVD apparatus which includes a plurality of microwave generating apparatuses and a plurality of dielectric plates can generate wide plasma stably. Therefore, a layer having uniform film quality can be formed over a large substrate and mass productivity (productivity) can be improved.

In addition, when the microcrystalline semiconductor layer and the amorphous semiconductor layer are successively formed in the same processing container, an interface with little distortion can be formed and an atmosphere component which may be mixed into an interface can be reduced, which is preferable.

Note that in each of the manufacturing steps of these insulating layer and semiconductor layers, when a protective layer having a thickness of 500 to 2000 nm is formed on the inner wall of the reaction chamber, the cleaning treatment and the treatment for forming a protective layer can be omitted.

Next, the resist mask 140 is formed (see FIG. 4A). The resist mask 140 is a mask having a plurality of regions of different thickness and is formed by a photolithography technique using a multi-tone mask or an inkjet method.

Figure 4B:
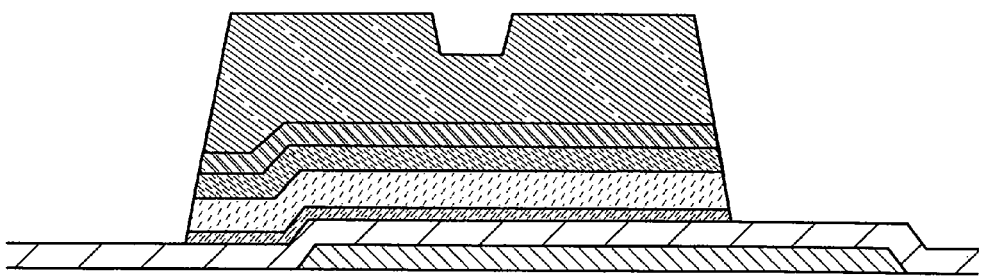

Next, etching is performed by using the resist mask 140 with the microcrystalline semiconductor layer, the amorphous semiconductor layer, the impurity semiconductor layer, and the conductive layer formed. With this treatment, the microcrystalline semiconductor layer 105, the buffer layer 107, the impurity semiconductor layer 109, and the conductive layer 111 are separated into each element (see FIG. 4B).

Note that the etching is performed so that an end portion of a layer where the microcrystalline semiconductor layer, the amorphous semiconductor, and the impurity semiconductor layer ate stacked has a tapered shape. The taper angle is 30 to 90°, preferably 40 to 80°. When the etching is performed so that the end portion has a tapered shape, the impurity semiconductor layer 109 and the microcrystalline semiconductor layer 105 can be prevented from being directly in contact with each other. In addition, a distance between the layers at the end portion can be sufficiently ensured. Thus, leakage current at the end portion can be reduced.

In addition, when the end portion has a tapered shape, coverage of a layer which is to be formed thereover in a later step can be improved. Therefore, disconnection at a step can be prevented.

Figure 7:
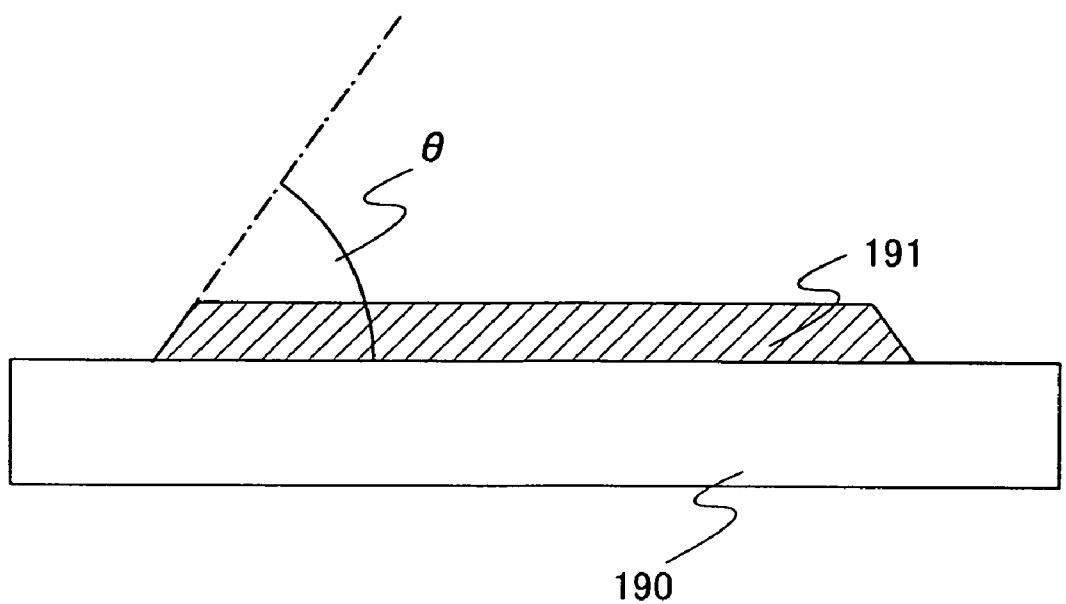
FIG. 7 defines a taper angle in this specification.

Note that the taper angle refers to an angle θ shown in FIG. 7. In FIG. 7, a layer 191 having a tapered end portion is formed over a substrate 190. The taper angle of the layer 191 is θ.

Figure 4C:
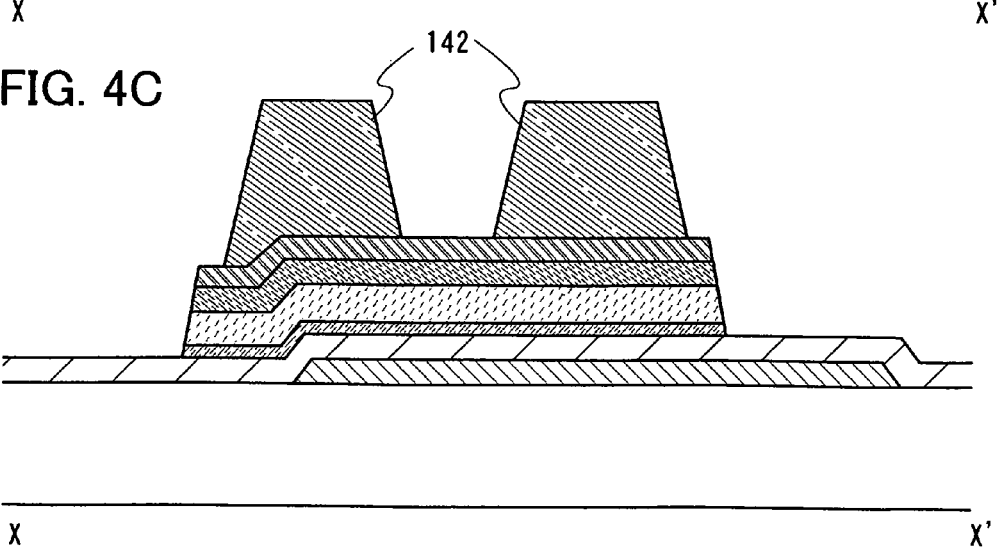

Next, a resist mask 142 is formed over the conductive layer 111 (see FIG. 4C). The resist mask 142 can be formed by performing ashing on the resist mask 140 by oxygen plasma or the like.

The conductive layer 111 is formed of a single-layer structure or a stacked-layer structure of aluminum, copper, or an aluminum alloy to which an element to improve heat resistance such as silicon, titanium, neodymium, scandium, or molybdenum or an element to prevent a hillock is added (e.g., an Al—Nd alloy which can be used for the first conductive layer 102). Alternatively, crystalline silicon to which an impurity element imparting one conductivity type is added may be used. The conductive layer 111 may have a stacked-layer structure where a layer on the side which is in contact with a semiconductor layer to which an impurity imparting one conductivity type is added is formed using titanium, tantalum, molybdenum, tungsten, or nitride of any of these elements and aluminum or an aluminum alloy is formed thereover. Further alternatively, the conductive layer 111 may have a stacked-layer structure where an upper side and a lower side of aluminum or an aluminum alloy is sandwiched with titanium, tantalum, molybdenum, tungsten, or nitride of any of these elements. For example, the conductive layer 111 preferably has a three-layer structure in which an aluminum layer is sandwitched with molybdenum layers.

The conductive layer 111 is formed by sputtering or a vacuum evaporation method. Alternatively, the conductive layer 111 may be formed by discharge of a conductive nanopaste of silver, gold, copper, or the like by using a screen printing method, an inkjet method, or the like and by baking thereof.

The resist mask 142 can be formed by performing ashing on the resist mask 140 by oxygen plasma or the like.

Next, the conductive layer 111 is etched by using the resist mask 142 and is patterned. Then, the impurity semiconductor region 109 to which an impurity imparting one conductivity type is added and the buffer layer 107 are etched by using the resist mask 142 to form the impurity semiconductor layer 110 forming a source region and a drain region, and the buffer layer 108 (see FIG. 5A). Note that the buffer layer 108 is etched only partly and covers the surface of the LPSAS layer 106. Further, as is apparent from FIG. 5A, end portions of the source region and the drain region of the impurity semiconductor layer 110 are almost aligned with end portions of the conductive layer 111.

Next, the conductive layer 111 is further etched partly to form the second conductive layer 112 with the resist mask 142 remaining. The second conductive layer 112 functions as a source electrode or a drain electrode. Here, wet etching is performed on the conductive layer 111 by using a mask. By wet etching, the end portions of the conductive layer 111 are selectively etched. Accordingly, since the conductive layer is etched anisotropically, the second conductive layer 112 having smaller areas than the resist mask 142 can be formed. End portions of the second conductive layer 112 are not aligned with the end portions of the impurity semiconductor layer 110, and the end portions of the impurity semiconductor layer 110 are formed outside the end portions of the second conductive layer 112 (see FIG. 5B). After that, the resist mask 142 is removed. In addition, the second conductive layer functioning as a source electrode and a drain electrode also functions as a signal line.

When the end portions of the second conductive layer 112 are not aligned with the end portions of the impurity semiconductor layer 110, a distance between the end portions of the second conductive layer 112 is increased, so that a distance between one of the source electrode and the drain electrode and the other of the source electrode and the drain electrode is sufficiently large. Thus, leakage current can be reduced and short-circuit can be prevented. Further, since the buffer layer 108 which is a high-resistance region is provided, a distance between the first conductive layer 102 and the second conductive layer 112 is sufficiently large. Therefore, generation of parasitic capacitance can be suppressed and leakage current can be reduced, so that a thin film transistor which has high reliability, small off current, and high withstand voltage can be formed.

Through above-described process, a channel-etched thin film transistor of the present invention can be formed.

In the thin film transistor shown in this embodiment mode, the first insulating layer 104 functioning as a gate insulating layer, the LPSAS layer 106 functioning as a channel formation region, the buffer layer 108, the impurity semiconductor layer 110 serving as a source region and a drain region, and the second conductive layer 112 functioning as a source electrode and a drain electrode are stacked over the first conductive layer 102 functioning as a gate electrode. The surface of the LPSAS layer 106 functioning as a channel formation region is covered with the buffer layer 108.

The buffer layer 108 is formed between the LPSAS layer 106 functioning as a channel formation region and the impurity semiconductor layer 110 to which an impurity element imparting one conductivity is added. The surface of the LPSAS layer 106 is covered with the buffer layer 108. The buffer layer 108, which is formed using an amorphous semiconductor layer or the like and has electrically higher resistance than a microcrystalline semiconductor layer, is formed.

In addition, the buffer layer 108 is formed between the LPSAS layer 106 and the second conductive layer 112. Therefore, leakage current generated in the thin film transistor can be reduced. In addition, deterioration of the thin film transistor due to application of high voltage can be prevented. Further, the buffer layer 108 covers the surface of the LPSAS layer 106 with an amorphous semiconductor layer, the surface of which is terminated with hydrogen. Thus, the LPSAS layer 106 can be prevented from being oxidized. Furthermore, an etching residue which is generated in forming the impurity semiconductor layer 110 can be prevented from being mixed into the LPSAS layer 106. Accordingly, the thin film transistor used in the present invention is a thin film transistor which has high electric characteristics and high withstand voltage In addition, a depression portion (a groove) is formed in part of the buffer layer 108, and regions other than the depression portion are covered with the impurity semiconductor layer 110 serving as a source region and a drain region. That is, due to the depression portion formed in the buffer layer 108, a leak path between the source region and the drain region has a sufficient distance. Thus, leakage current between the source region and the drain region can be reduced. Further, when the depression is formed in part of the buffer layer 108, an etching residue which is generated in the formation step of the impurity semiconductor layer 110 serving as a source region and a drain region can be easily removed. Accordingly, leakage current which can be generated between the source region and the drain region due the etching residue can be reduced. Note that the depression portion of the buffer layer 108 is formed in the formation step of the impurity semiconductor layer 110 serving as a source region and a drain region. Therefore, the side surfaces of the source region and the drain region are provided so as to be provided almost over the same plane as a side surface of the depression portion of the buffer layer 108.

If the LPSAS layer 106 is oxidized, mobility of the thin film transistor is decreased and subthreshold swing is increased, so that electric characteristics of the thin film transistor deteriorates. Since hydrogen and fluorine are mixed into the buffer layer 108, transmission of oxygen through the buffer layer 108 can be prevented and the LPSAS layer 106 can be prevented from being oxidized.

In addition, when the buffer layer 108 is formed, generation of parasitic channel can be prevented.

Further, when the end portions of the source electrode and the drain electrode are not aligned with the end portions of the source region and the drain region, a sufficient distance between an end portion of one of the source electrode and the drain electrode and an end portion of the other of the source electrode and the drain electrode is ensured, leakage current between one of the source electrode and the drain electrode and the other of the source electrode and the drain electrode is reduced, so that short-circuit can be prevented.

Figure 5A:
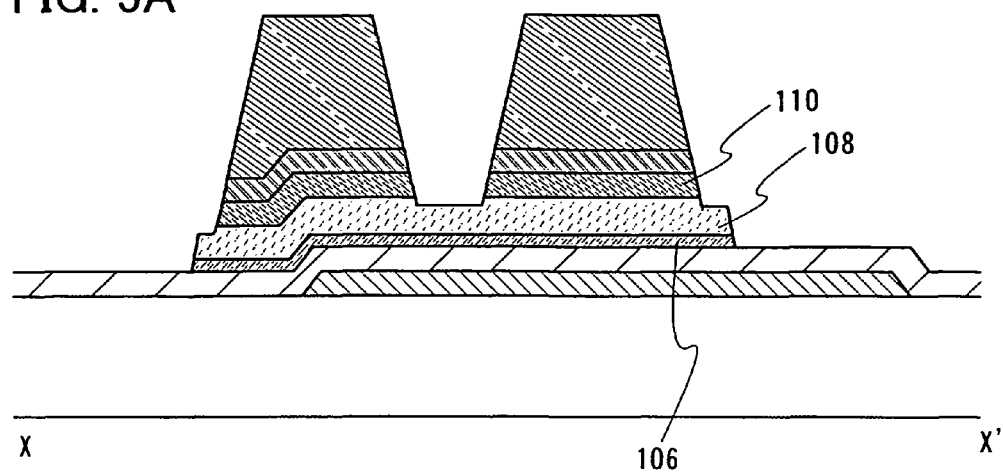
FIG. 5A to 5C illustrate an example of the method for manufacturing the thin film transistor used in the present invention.
Figure 5B:
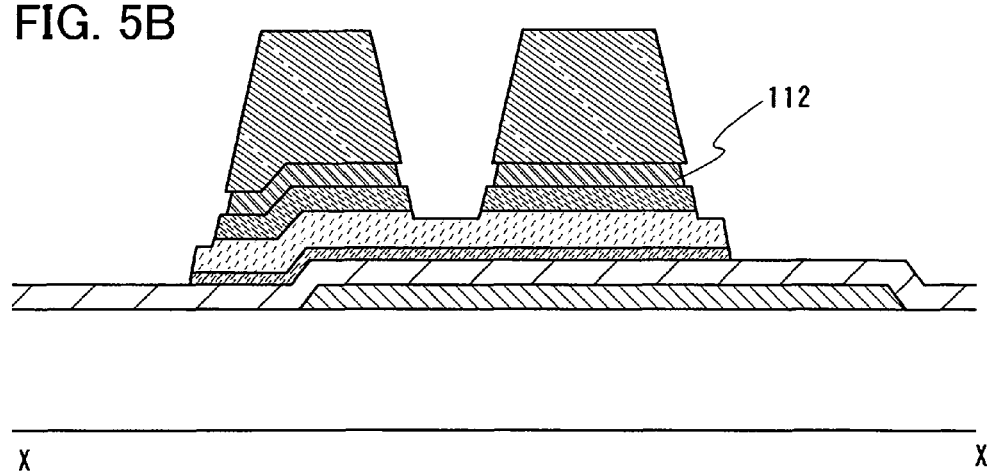

Although FIGS. 5A and 5B show an example in which after the buffer layer 108 having a depression (groove) in its part is formed, etching is performed so that the sufficient distance between the end portions of the source electrode and the drain electrode is ensured, the present invention is not limited to this. For example, the process may be performed in the following order; a conductive layer serving as the second conductive layer 112 is separated by etching to expose the impurity semiconductor layer 110; etching is performed so that the sufficient distance between an end portion of one of the source electrode and the drain electrode and an end portion of the other of the source electrode and the drain electrode is ensured; the semiconductor layer is etched using a mask to separate the source region and the drain region; and the depression (groove) is formed in part of the buffer layer 108. Alternatively, after etching is performed so that the sufficient distance between one of the end portions of the source electrode and the drain electrode and the other of the end portions of the source electrode and the drain electrode is ensured, the mask may be removed and etching may be performed using the second conductive layer 112 as a mask.

Note that the end portions of the impurity semiconductor layer 110 serving as a source region and a drain region are aligned with end portions of the depression portion formed in the buffer layer 108 (see FIG. 1). This is because the depression portion is formed through the same step as etching of the impurity semiconductor layer 110.

Figure 5C:
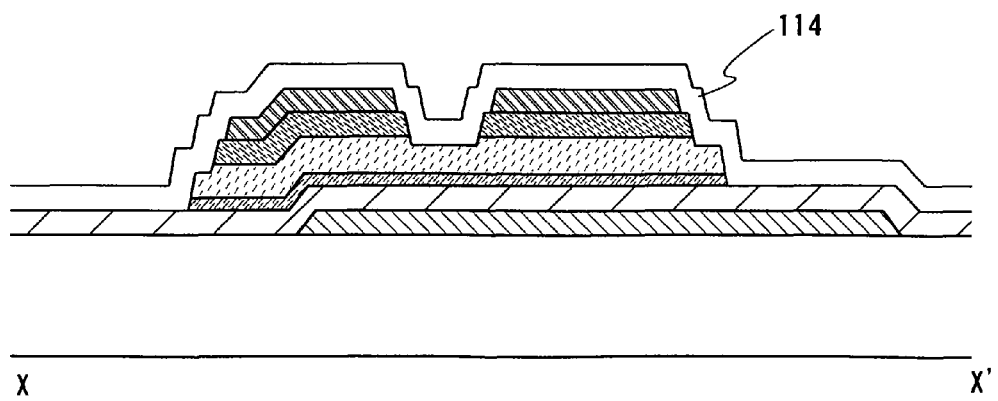

Next, as shown in FIG. 5C, the second insulating layer 114 is formed over the second conductive layer 112, the impurity semiconductor layer 110, the LPSAS layer 106, the first insulating layer 104, and the like. Note that the second insulating layer 114 can be formed in a manner similar to that of the first insulating layer 104. Note that since the second insulating layer 114 is provided in order to prevent entry of a contaminant impurity such as an organic substance, a metal substance, or moisture floating in the atmosphere, the second insulating layer 114 is preferably formed precisely. In addition, the carbon, nitrogen and oxygen concentrations in the buffer layer 108 is preferably $1\times10^{19}$ $cm^{-3}$ or less, more preferably $5\times10^{18}$ $cm^{-3}$ or less.

Next, the first opening portion 118 and the second opening portion 120 are formed in the second insulating layer 114, and the third conductive layer 116 is formed. In the first opening portion 118, the third conductive layer 116 is connected to the second conductive layer 112. In the second opening portion 120, the third conductive layer 116 is connected to the first conductive layer 102. In a manner similar to the second conductive layer 112, after the third conductive layer 116 is formed over the entire surface, the third conductive layer 116 may be patterned by using a resist mask or the like. Note that the third conductive layer 116 is preferably formed at the same time as a pixel electrode which is provided for a pixel portion, and the case where the third conductive layer 116 is formed in the same layer as the pixel electrode is described below.

For the third conductive layer 116, a light-transmitting conductive material such as indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added can be used.

Alternatively, the third conductive layer 116 can be formed using a conductive composition containing a conductive high-molecular compound (also referred to as a conductive polymer). It is preferable that the third conductive layer 116 formed using the conductive composition have a sheet resistance of 10000 Ω/square or less and a light transmittance of 70% or more at a wavelength of 550 nm. The sheet resistance of the third conductive layer 116 is preferably lower. In addition, it is preferable that the resistivity of the conductive high-molecular compound contained in the conductive composition be 0.1 Ω·cm or less.

Note that as the conductive high-molecular compound, a so-called π electron conjugated conductive high-molecular compound can be used. Examples of the conductive high-molecular compound are polyaniline and its derivatives, polypyrrole and its derivatives, polythiophene and its derivatives, copolymers of two or more kinds of them, and the like.

The case where the third conductive layer 116 is formed in the same layer as the pixel electrode is described above, the present invention is not limited to this. The third conductive layer 116 may be formed by using a material and a formation method which are similar to those of the first conductive layer 102 and the second conductive layer 112. However, a thin film transistor used for the protection circuit of the present invention is formed over the same substrate and by the same step as a thin film transistor used for a pixel circuit. Therefore, when the third conductive layer 116 is formed by using any of the above-described materials at the same time as a so-called pixel electrode, which is connected to the thin film transistor used for the pixel circuit, the number of manufacturing steps can be reduced and yield can be improved.

Further, when the first conductive layer 102 and the second conductive layer 112 are diode-connected by the third conductive layer 116 as shown in FIG. 1, the diode-connected thin film transistor (protection diode) used for the protection circuit of the present invention can be formed.

Note that although the case where the gate electrode and the scan line are formed in the same step and the source electrode, the drain electrode and the signal line are formed in the same step is described, the present invention is not limited to this. An electrode and a wiring connected to the electrode may be formed in different steps.

Note that although the mode where the LPSAS layer 106 is provided is described in this embodiment mode, in the thin film transistor of the present invention, a microcrystalline semiconductor layer which is obtained without being irradiated with a laser may be provided instead of the LPSAS layer.

Through the above-described process, a channel-etched thin film transistor can be formed. In this channel-etched thin film transistor, the number of manufacturing steps is small, so that cost can be reduced. When a channel formation region is formed using a microcrystalline semiconductor layer, a field-effect mobility of 1 to 20 $cm^2/V \cdot sec$ can be obtained. Accordingly, this thin film transistor can be used as a switching element of a pixel in a pixel portion and as an element included in a scan line (a gate line) side driver circuit.

As described in this embodiment mode, a thin film transistor which has excellent electric characteristics and high reliability can be formed. When a protection circuit is provided for a display device by using such a thin film transistor, discharge of charge which is stored in an interlayer insulating layer or the like and noise which is input to a wiring with a signal or power supply voltage can be suppressed, so that deterioration or damage of a semiconductor element can be prevented. Further, a protection circuit which has higher withstand voltage and smaller parasitic capacitance than a conventional protection circuit can be provided. Therefore, even when large current or high voltage such that a protection circuit itself is damaged in a conventional protection circuit is applied, damage of the semiconductor element can be effectively prevented by providing the protection circuit described in this embodiment mode, and a highly reliable display device can be manufactured.

Note that although a multi-tone mask is used for forming a mask in this embodiment mode, it is needless to say that a thin film transistor can be formed without using a multi-tone mask.

Embodiment Mode 2

In this embodiment mode, a liquid crystal display device including a protection circuit using the thin film transistor shown in Embodiment Mode 1 is described.

First, a VA (vertical alignment)-mode liquid crystal display device is described. A VA-mode is a mode in which liquid crystal molecules are aligned vertically to a panel surface when voltage is not applied. In particular, in this embodiment mode, it is devised that a pixel is divided into several regions (subpixels) so that molecules are aligned in different directions. This is referred to as domain multiplication or multi-domain. In the following description, a multi-domain liquid crystal display device is described.

Figure 8:
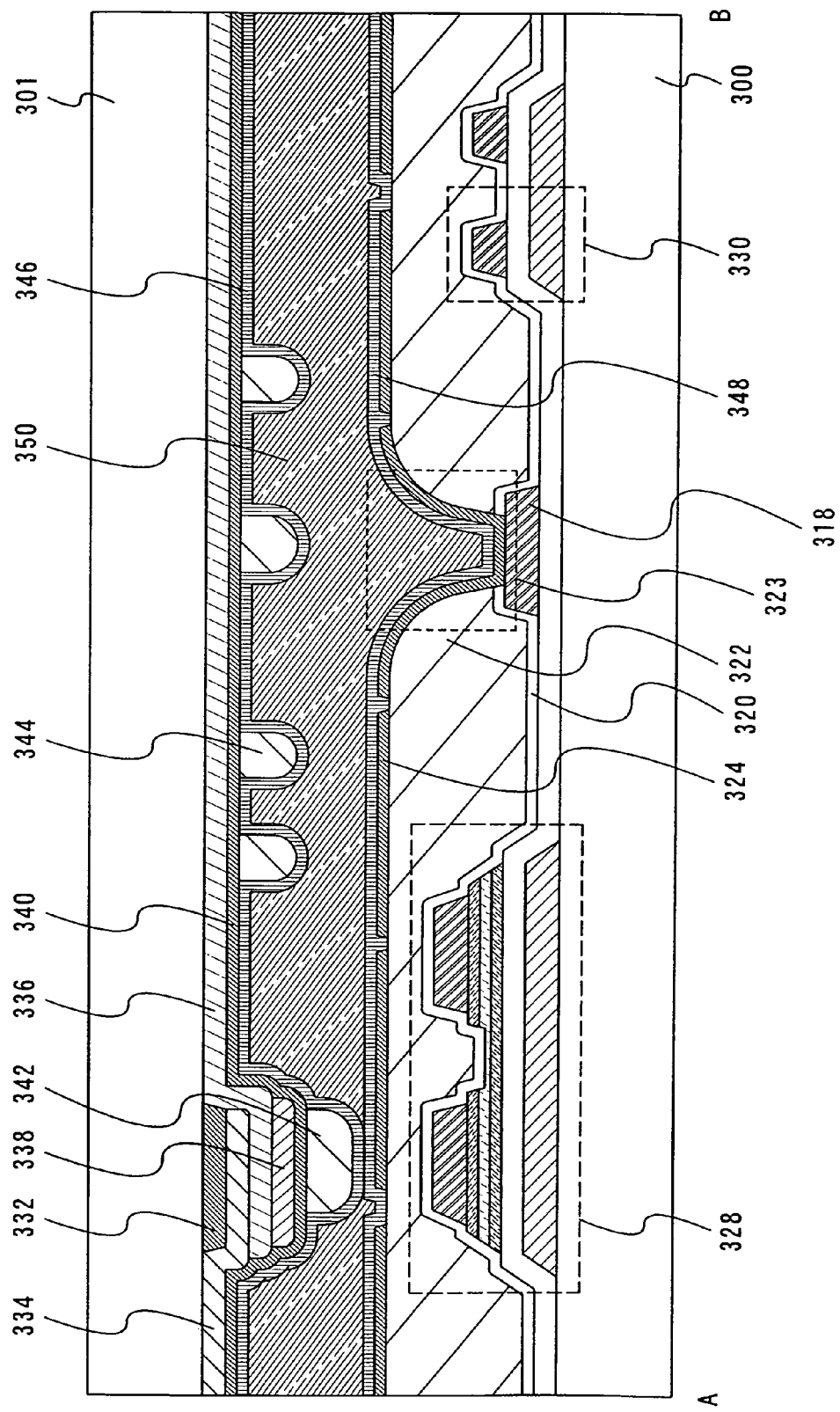
FIG. 8 illustrates a liquid crystal display device to which the present invention can be applied.
Figure 9:
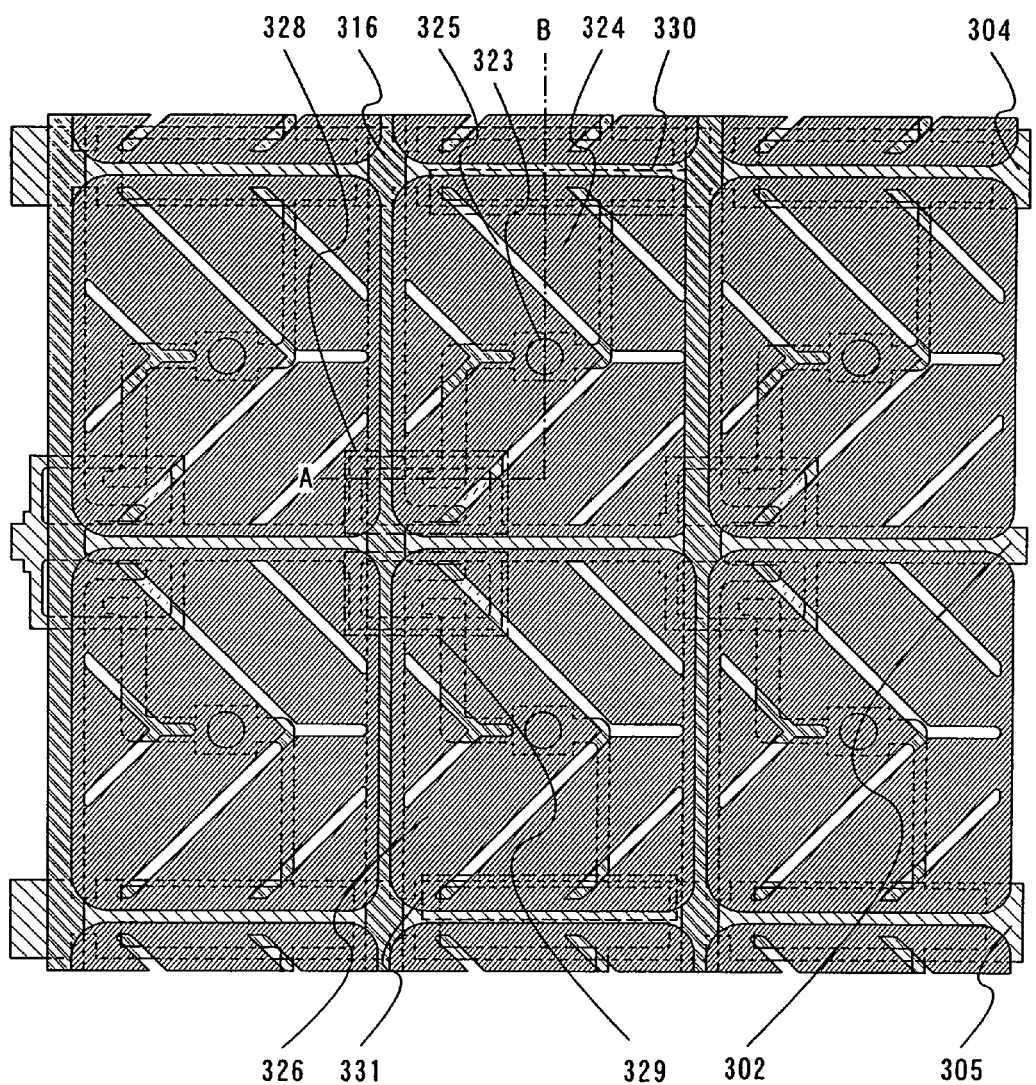
FIG. 9 illustrates the liquid crystal display device to which the present invention can be applied.
Figure 10:
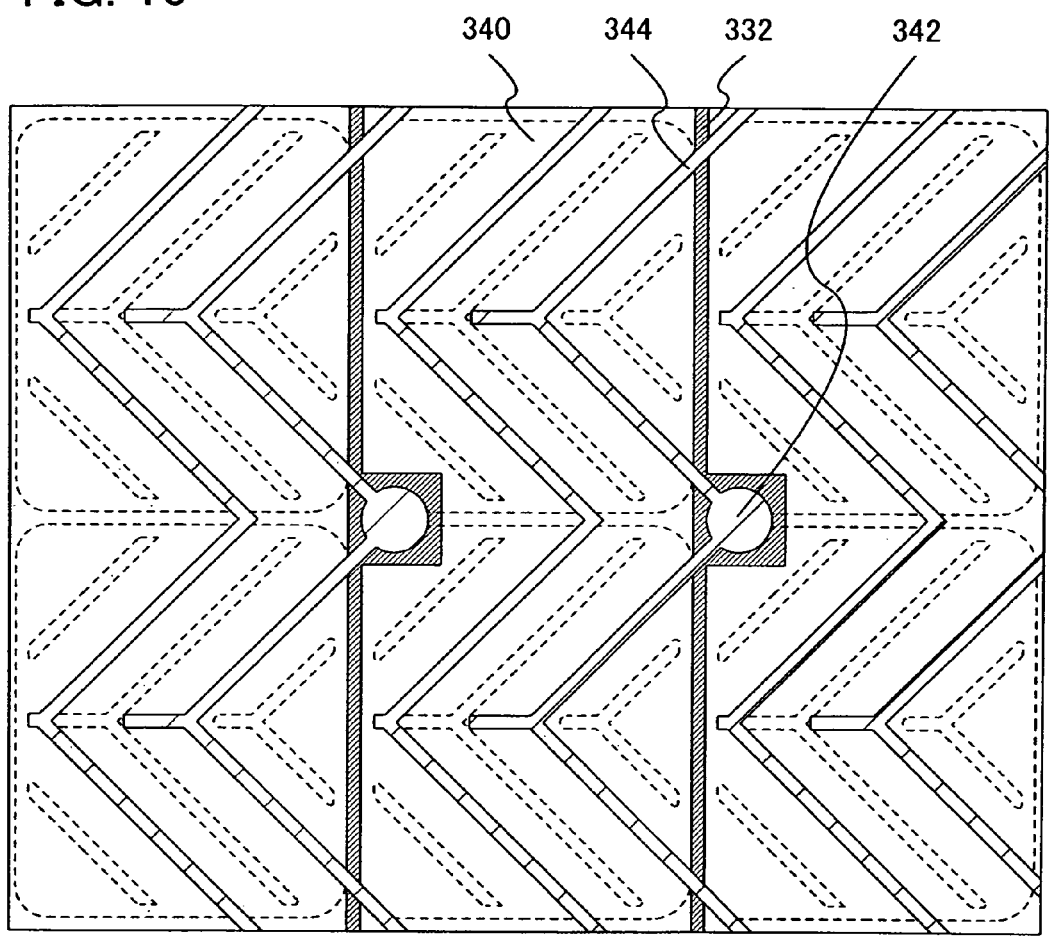
FIG. 10 illustrates the liquid crystal display device to which the present invention can be applied.

FIG. 9 is a plan view of a side of a substrate over which a pixel electrode is formed. FIG. 8 shows a cross-sectional structure taken along the line A-B in FIG. 9. In addition, FIG. 10 is a plan view of a side of a substrate on which a counter electrode is formed. Hereinafter, description is made with reference to these drawings.

FIG. 8 shows a state in which a substrate 300 and a substrate 301 face with each other, and liquid crystals are injected therebetween. A thin film transistor 328, a pixel electrode 324 connected to the thin film transistor 328, and a storage capacitor portion 330 are provided over the substrate 300. A counter electrode 340 is provided on the substrate 301.

At a position where a spacer 342 is formed over the substrate 301, a light-shielding layer 332, a first colored layer 334, a second colored layer 336, a third colored layer 338, and the counter electrode 340 are formed. With this structure, the height of a protrusion 344 for controlling alignment of the liquid crystals and the height of the spacer 342 are varied. An alignment layer 348 is formed over the pixel electrode 324. An alignment layer 346 is provided on the counter electrode 340. A liquid crystal layer 350 is provided between the alignment layer 346 and the alignment layer 348.

Although a post spacer (a columnar spacer) is used as the spacer 342 in FIG. 8, the present invention is not limited to this. A bead spacer (a spherical spacer) may be dispersed as the spacer. Further, the spacer 342 may be provided on the pixel electrode 324 provided over the substrate 300.

The thin film transistor 328, the pixel electrode 324 connected to the thin film transistor 328, and the storage capacitor portion 330 are provided over the substrate 300. The pixel electrode 324 and a wiring 318 are connected through an opening portion 323 which penetrates an insulating layer 320 and an insulating layer 322. The insulating layer 320 is provided so as to cover the thin film transistor 328, the wiring 318, and the storage capacitor portion 330. The insulating layer 322 is provided so as to cover the insulating layer 320. A thin film transistor which is similar to the thin film transistor functioning as the protection diode described in Embodiment Mode 1 can be used as the thin film transistor 328 as appropriate. In addition, the storage capacitor portion 330 is formed by sandwiching a gate insulating layer of the thin film transistor 328 between a conductive layer which is formed in the same step and in a manner similar to that of a gate electrode of the thin film transistor 328 and a scan line, and a conductive layer which is formed in the same step and in a manner similar to that of a source electrode of the thin film transistor 328 and a signal line.

A liquid crystal element is formed by overlapping of the pixel electrode 324, the liquid crystal layer 350, and the counter electrode 340 which has the alignment layer 346.

FIG. 9 is a plan view of the substrate 300 side. The pixel electrode 324 is formed using a material which is similar to that of the third conductive layer 116 described in Embodiment Mode 1. The pixel electrode 324 is provided with a slit 325. The slit 325 is used for controlling alignment of the liquid crystals.

A thin film transistor 329, a pixel electrode 326 connected to the thin film transistor 329, and a storage capacitor portion 331 shown in FIG. 9 can be formed in a manner similar to those of the thin film transistor 328, the pixel electrode 324, and the storage capacitor portion 330, respectively. Both the thin film transistor 328 and the thin film transistor 329 are connected to a wiring 316. A pixel of this liquid crystal panel includes the pixel electrode 324 and the pixel electrode 326. Each of a region of the pixel electrode 324 and a region of the pixel electrode 326 is a subpixel.

FIG. 10 is a plan view of the substrate 301 side. The counter electrode 340 is formed on the light-shielding layer 332. The counter electrode 340 is preferably formed using a material which is similar to that of the pixel electrode 324. The protrusion 344 for controlling alignment of the liquid crystals is formed on the counter electrode 340. In addition, the spacer 342 is formed in accordance with the position of the light-shielding layer 332. Note that in FIG. 10, hatching is performed only on the light-shielding layer 332, the spacer 342, and the protrusion 344.

Figure 11:
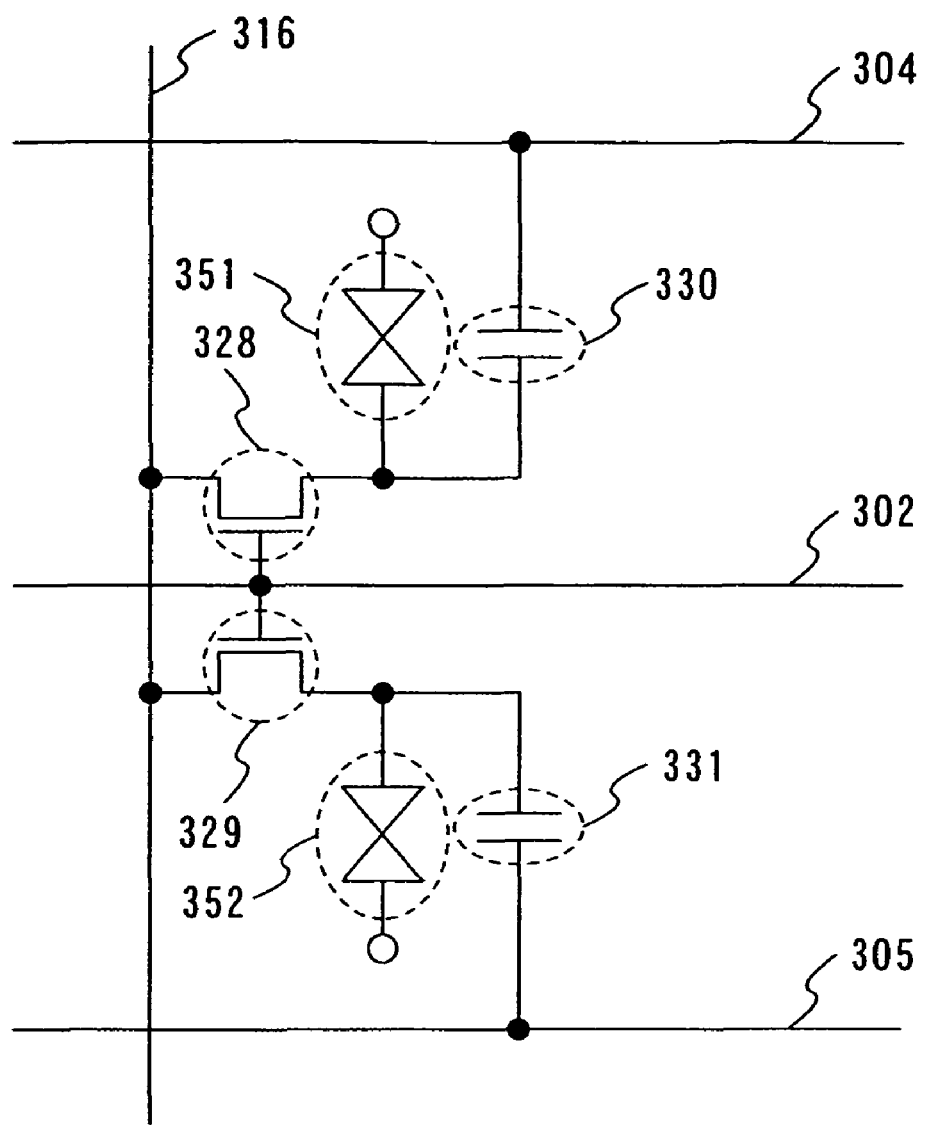
FIG. 11 illustrates the liquid crystal display device to which the present invention can be applied.

FIG. 11 shows an equivalent circuit of the above-described pixel structure. Both the thin film transistor 328 and the thin film transistor 329 are connected to a wiring 302 functioning as a scan line and the wiring 316. In FIG. 11, when a potential of a wiring 304 functioning as a capacitor line and a potential of a wiring 305 functioning as a capacitor line are varied, operations of a liquid crystal element 351 and a liquid crystal element 352 can be varied. That is, alignment of the liquid crystals is precisely controlled and the viewing angle is increased by individually controlling the potentials of the wiring 304 and the wiring 305.

When voltage is applied to the pixel electrode 324 provided with the slit 325, electric field distortion (an oblique electric field) is generated near the slit 325. When the slits 325 and the protrusions 344 on the substrate 301 side are provided so as to alternately engage with each other, an oblique electric field is effectively generated, so that alignment of the liquid crystals can be controlled. Therefore, directions of alignment of the liquid crystals are varied depending on location. That is, the viewing angle of the liquid crystal panel is increased by domain multiplication.

Next, a VA-mode liquid crystal display device, which is different from the above-described device, is described with reference to FIGS. 12 to 15.

Figure 12:
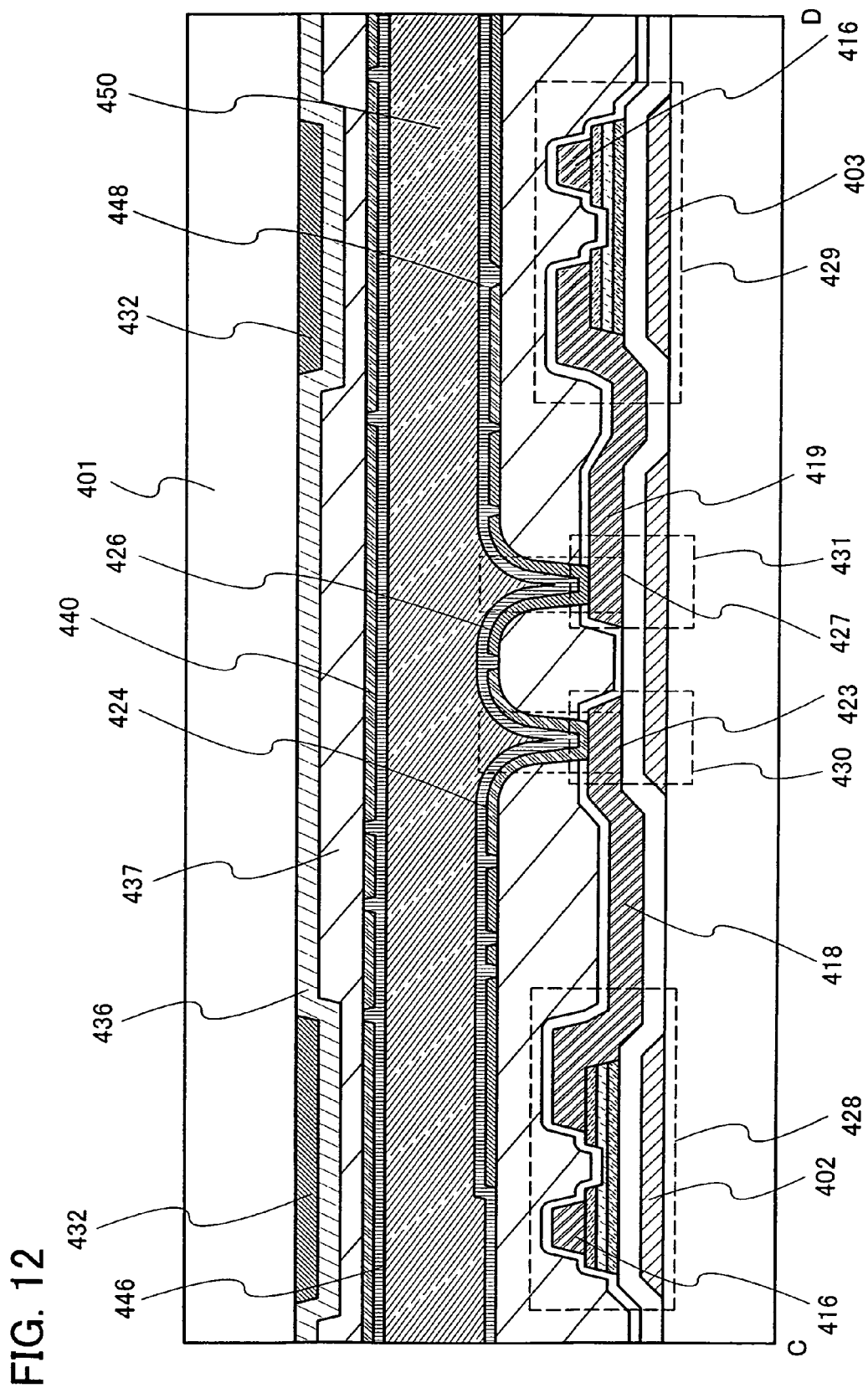
FIG. 12 illustrates a liquid crystal display device to which the present invention can be applied.
Figure 13:
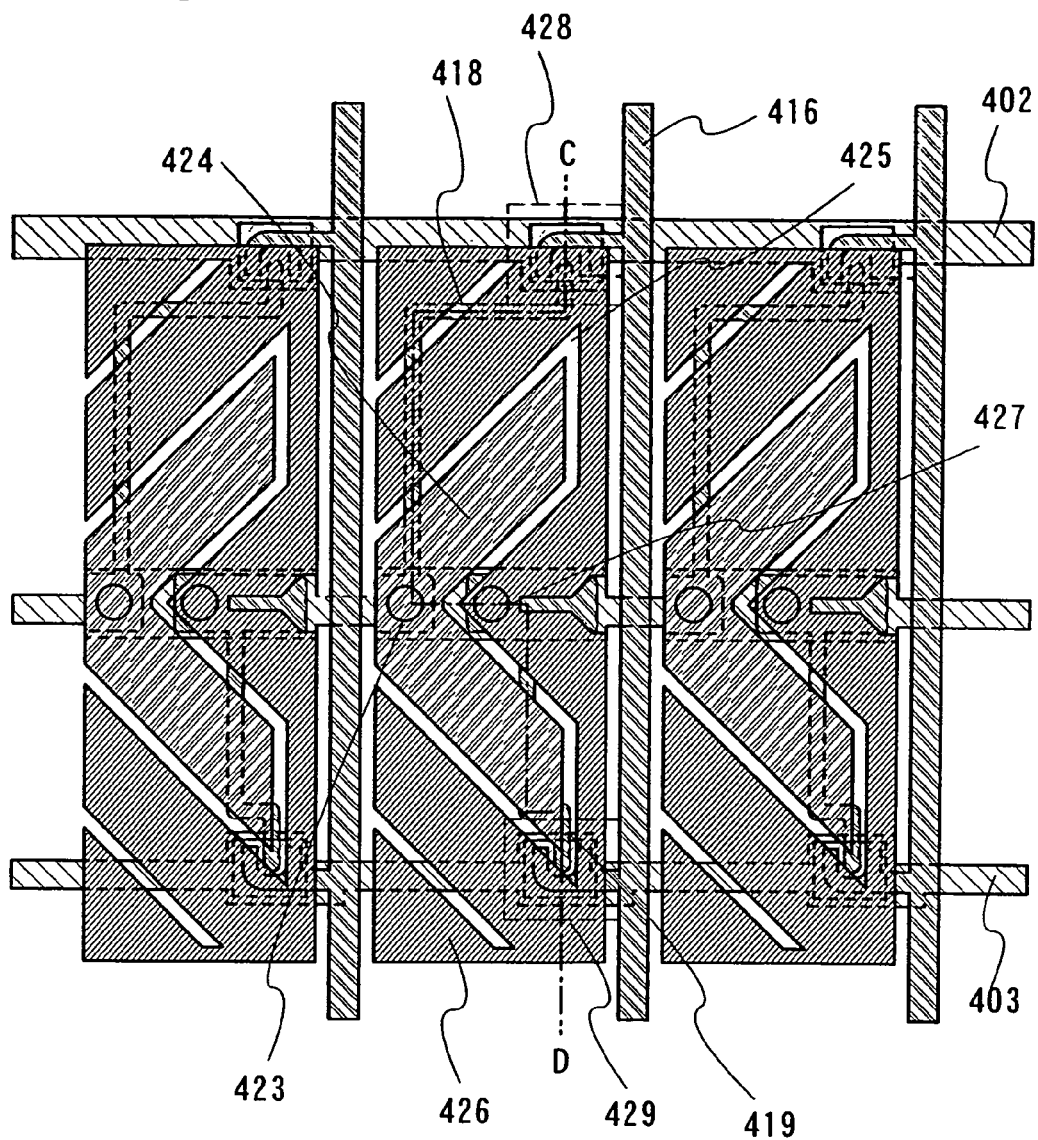
FIG. 13 illustrates the liquid crystal display device to which the present invention can be applied.
Figure 14:
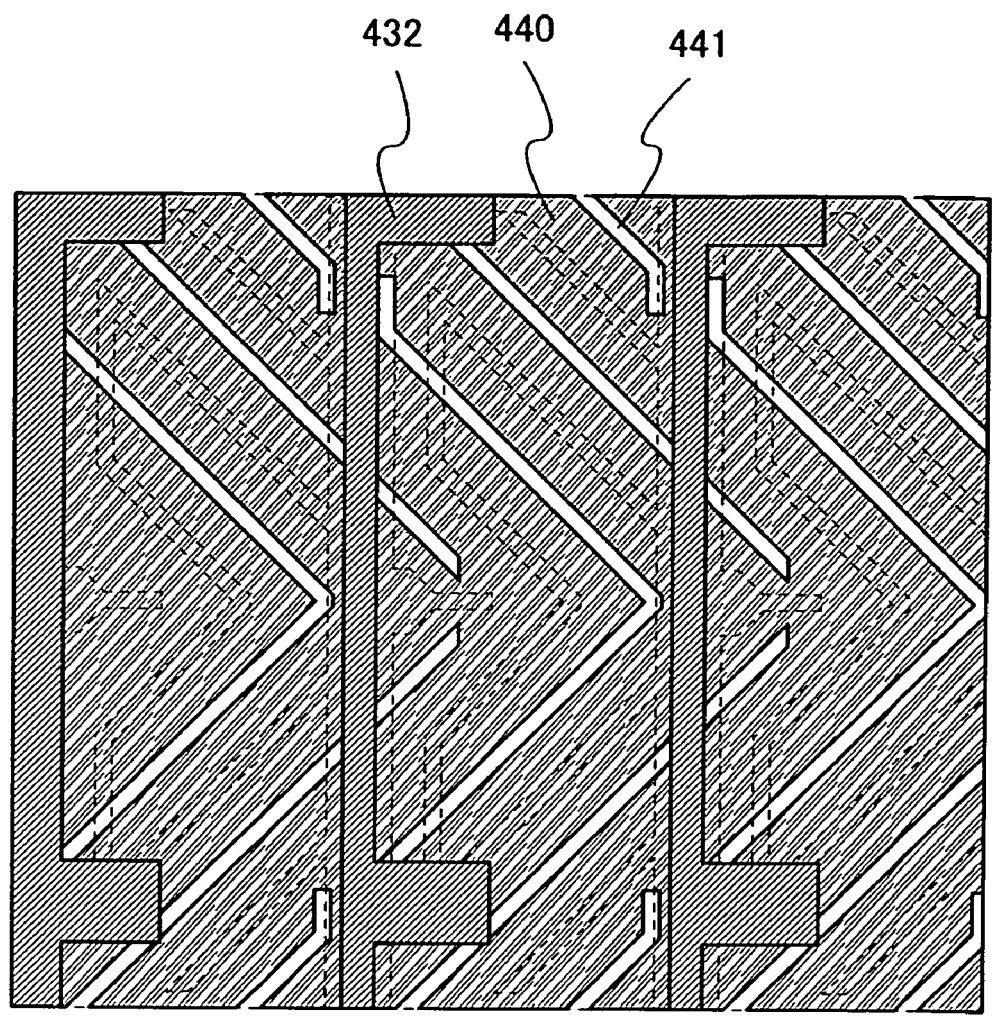
FIG. 14 illustrates the liquid crystal display device to which the present invention can be applied.

FIG. 13 is a plan view of a side of a substrate over which a pixel electrode is formed. FIG. 12 shows a cross-sectional structure taken along the line C-D in FIG. 13. In addition, FIG. 14 is a plan view of a side of a substrate on which a counter electrode is formed. Hereinafter, description is made with reference to these drawings.

In each of the pixel structures of the liquid crystal display device, which are shown in FIGS. 12 to 15, one pixel includes a plurality of pixel electrodes and a thin film transistor is connected to each of the plurality of pixel electrodes. That is, the pixel is a multi-domain pixel. The thin film transistors are driven by different gate signals. In other words, signals supplied to the respective pixel electrodes can be controlled separately (see FIG. 15).

A pixel electrode 424 is connected to a thin film transistor 428 by a wiring 418 through an opening portion 423. A pixel electrode 426 is connected to a thin film transistor 429 by a wiring 419 through an opening portion 427. A wiring 402 functioning as a scan line which is connected to a gate electrode of the thin film transistor 428 and a wiring 403 functioning as a scan line which is connected to a gate electrode of the thin film transistor 429 are separated so that different gate signals can be supplied. On the other hand, as for a signal line, a wiring 416 is shared between the thin film transistor 428 and the thin film transistor 429. As each of the thin film transistor 428 and the thin film transistor 429, a thin film transistor which is similar to the thin film transistor functioning as the protection diode described in Embodiment Mode 1 can be used as appropriate.

Note that a storage capacitor portion 430 is connected to the thin film transistor 428. A storage capacitor portion 431 is connected to the thin film transistor 429.

Figure 15:
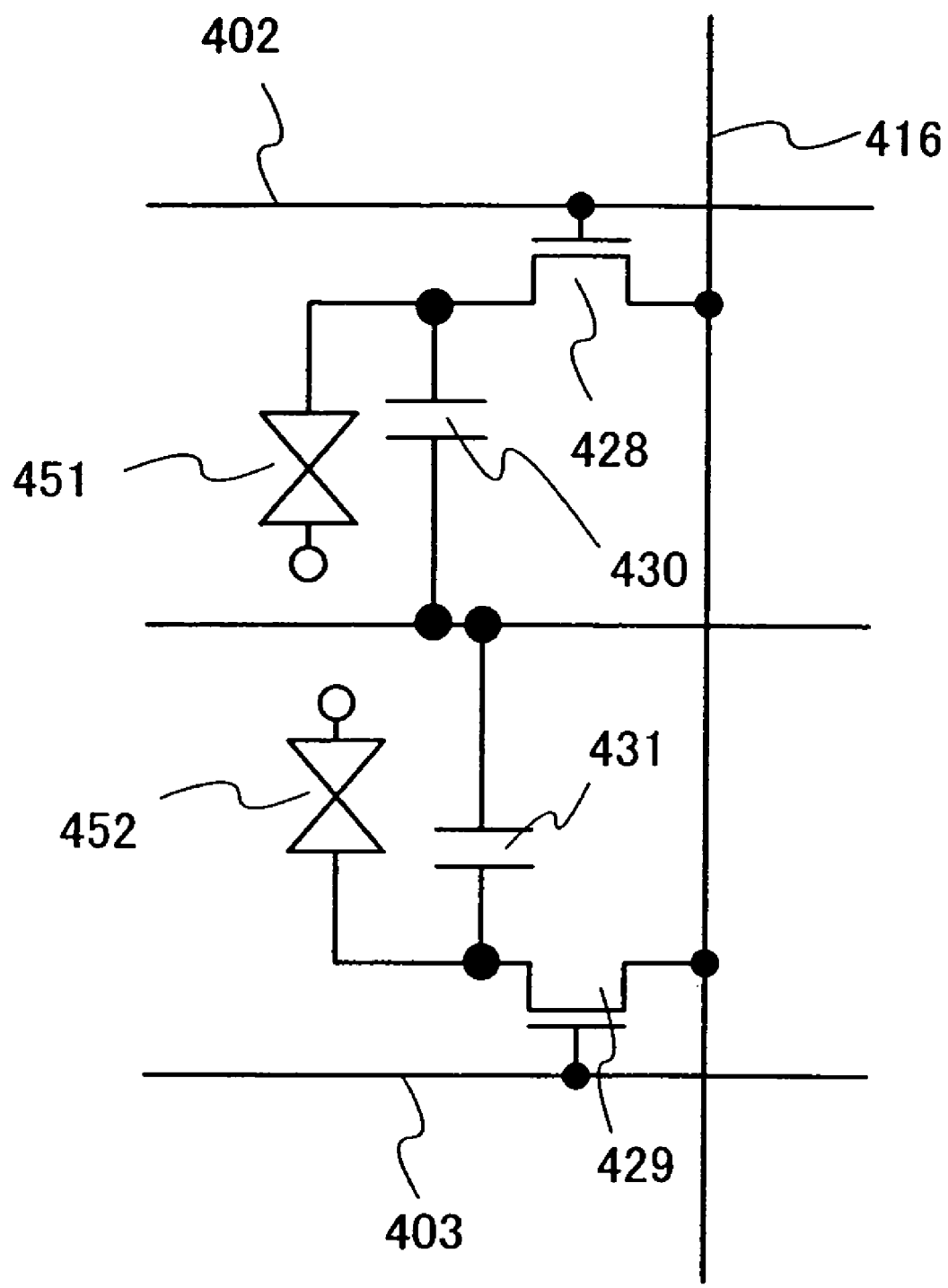
FIG. 15 illustrates the liquid crystal display device to which the present invention can be applied.

The pixel electrode 424 and the pixel electrode 426 have different shapes and are separated by the slit 425. The pixel electrode 426 is provided so as to surround the external side of the pixel electrode 424 which is spread in a V shape. Timings of voltage application are varied between the pixel electrode 424 and the pixel electrode 426 by the thin film transistor 428 and the thin film transistor 429, so that alignment of liquid crystals is controlled. FIG. 15 shows an equivalent circuit of this pixel structure. The thin film transistor 428 is connected to the wiring 402 functioning as a scan line. The thin film transistor 429 is connected to the wiring 403 functioning as a scan line. When different gate signals are supplied to the wiring 402 and the wiring 403, operation timings of the thin film transistor 428 and the thin film transistor 429 can be varied.

A light-shielding layer 432, a colored layer 436, and a counter electrode 440 are provided over a substrate 401 which is a counter substrate. In addition, a planarization layer 437 is formed between the colored layer 436 and the counter electrode 440 and prevents alignment disorder of the liquid crystals. FIG. 14 is a plan view of the counter substrate side. The counter electrode 440 is shared between different pixels and has a slit 441. When the slit 441 and the slit 425 on the pixel electrodes 424 and 426 side are provided so as alternately engage with each other, an oblique electric field is effectively generated, so that alignment of the liquid crystals can be controlled. Therefore, directions of alignment of the liquid crystals can be varied depending on location, and a wide viewing angle can be realized.

A first liquid crystal element 451 is formed by overlapping of the pixel electrode 424 having an alignment layer 448, a liquid crystal layer 450, and the counter electrode 440 having an alignment layer 446. In addition, a second liquid crystal element 452 is formed by overlapping of the pixel electrode 426 having the alignment layer 448, the liquid crystal layer 450, and the counter electrode 440 having an alignment layer 446. Therefore, in each of the pixel structures shown in FIGS. 12 to 15, a multi-domain structure in which the first liquid crystal element 451 and the second liquid crystal element 452 are provided in one pixel is formed.

The present invention can also be applied to a horizontal electric field-mode liquid crystal display device. A horizontal electric field-mode is a mode in which liquid crystals are driven to express grayscale by horizontally applying an electric field to liquid crystal molecules in a cell. According to a horizontal electric field-mode, the viewing angle can be widened to approximately 180 degrees. Hereinafter, a horizontal electric field-mode liquid crystal display device to which the present invention is applied is described with reference to FIGS. 16 and 17.

Figure 16:
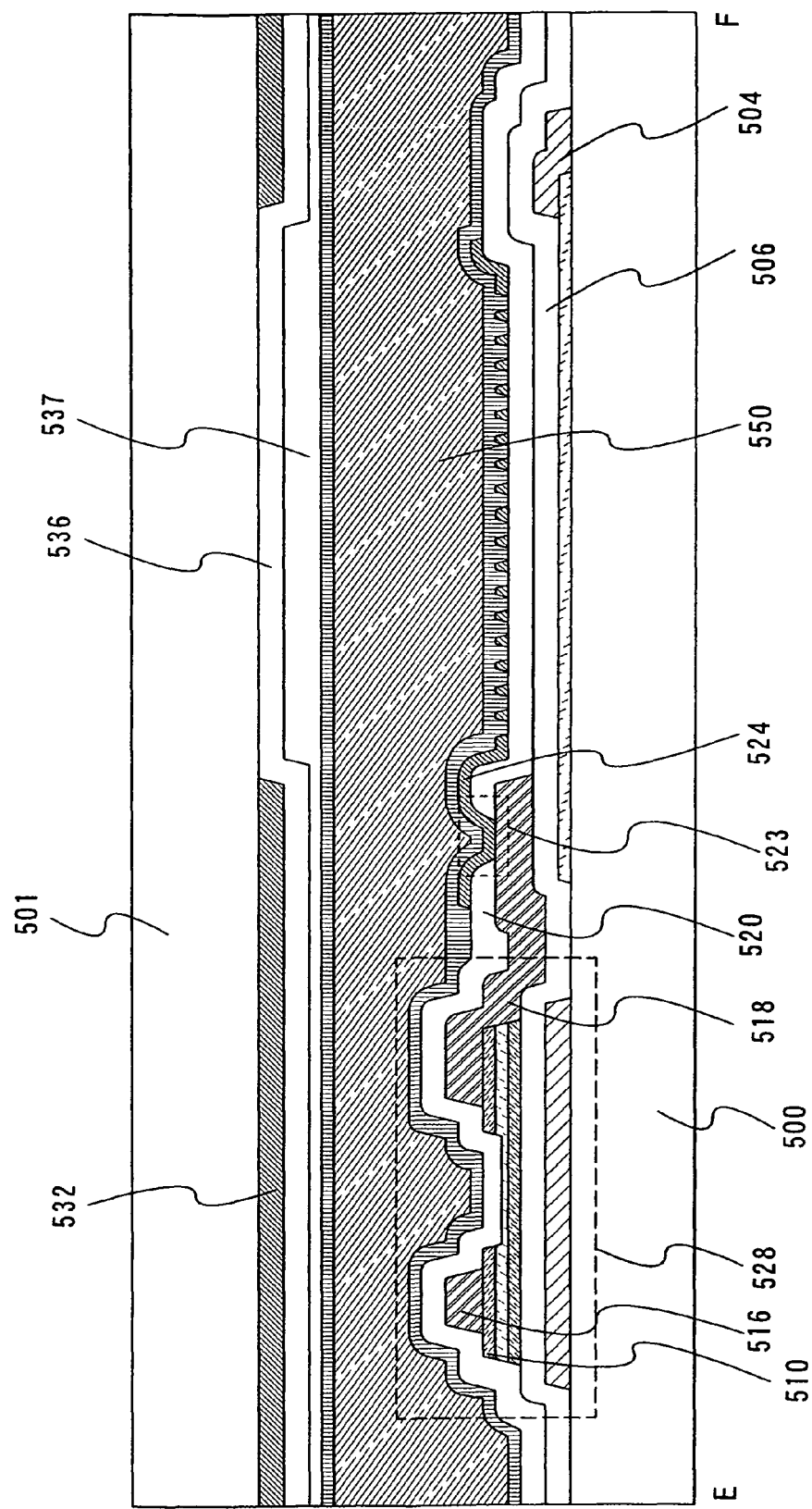
FIG. 16 illustrates a liquid crystal display device to which the present invention can be applied.

FIG. 16 shows a state in which a substrate 500 over which a first pixel electrode 507, a thin film transistor 528, and a second pixel electrode 524 connected to the thin film transistor 528 are provided and a substrate 501 face with each other, and liquid crystals are injected therebetween. A light-shielding layer 532, a colored layer 536, and a planarization layer 537 are provided over the substrate 501. Although a pixel electrode is provided over the substrate 500, a pixel electrode is not provided on the substrate 501. A liquid crystal layer 550 is provided between the substrate 500 and the substrate 501.

The first pixel electrode 507, a wiring 504 functioning as a capacitor line which is connected to the first pixel electrode 507, and the thin film transistor 528 are formed over the substrate 500. A thin film transistor which is similar to the thin film transistor functioning as the protection diode described in Embodiment Mode 1 can be used as the thin film transistor 528 as appropriate. The first pixel electrode 507 can be formed using a material which is similar to that of the third conductive layer described in Embodiment Mode 1. In addition, the first pixel electrode 507 is formed in a shape which is compartmentalized roughly in a pixel shape. Note that a gate insulating layer 506 is formed over the first pixel electrode 507 and the wiring 504.

A source electrode and a drain electrode of the thin film transistor 528 and a wiring 516 and a wiring 518 which are connected to the source electrode and the drain electrode of the thin film transistor 528 are formed over the gate insulating layer 506. The wiring 516 is a signal line to which a video signal is input in a liquid crystal display device. The wiring 516 is a wiring extending in one direction and is connected to a source region 510 and one of the source electrode and the drain electrode. The wiring 518 is connected to the other of the source electrode and the drain electrode and the second pixel electrode 524.

A second insulating layer 520 is formed over the wiring 516 and the wiring 518. In addition, the second pixel electrode 524 connected to the wiring 518 through an opening portion 523 formed in the second insulating layer 520 is formed over the second insulating layer 520. The second pixel electrode 524 is formed using a material which is similar to that of the third conductive layer described in Embodiment Mode 1.

As described above, the thin film transistor 528 and the second pixel electrode 524 connected to the thin film transistor 528 are provided over the substrate 500. Note that a storage capacitor is formed between the first pixel electrode 507 and the second pixel electrode 524.

Figure 17:
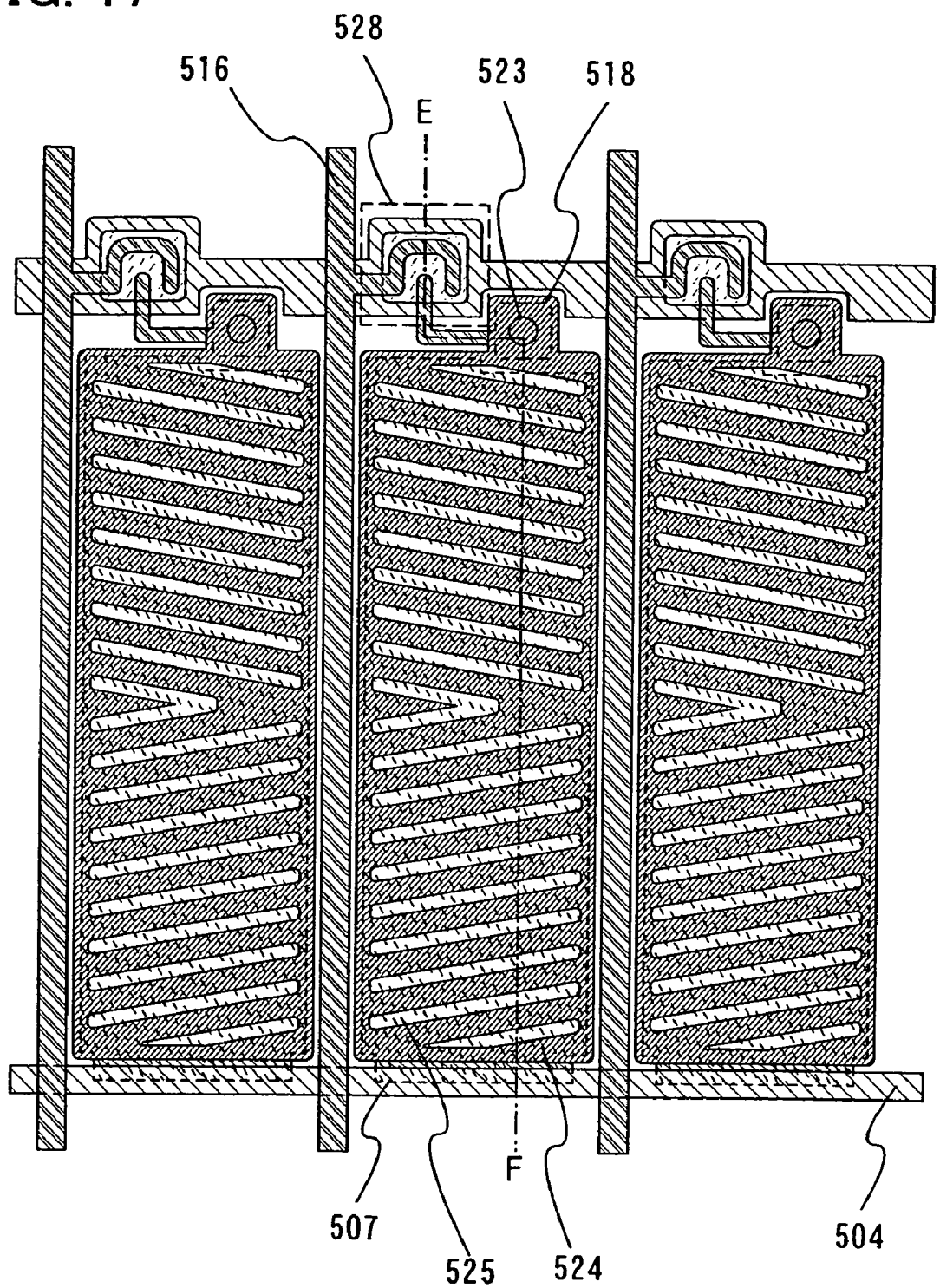
FIG. 17 illustrates the liquid crystal display device to which the present invention can be applied.

FIG. 17 is a plan view showing the structure of the pixel electrodes. The second pixel electrode 524 is provided with a slit 525. The slit 525 is used for controlling alignment of the liquid crystals. In this case, an electric field is generated between the first pixel electrode 507 and the second pixel electrode 524. The gate insulating layer 506 is formed between the first pixel electrode 507 and the second pixel electrode 524 and has a thickness of approximately 50 to 200 nm, which is thin enough compared to the liquid crystal layer having a thickness of 2 to 10 µm. Accordingly, an electric field is generated substantially in a parallel direction (in a horizontal direction) to the substrate 500. Alignment of the liquid crystals is controlled by the electric field. The liquid crystal molecules are horizontally rotated by utilizing the electric field which is approximately parallel to the substrate. In this case, since the liquid crystal molecules are parallel to the substrate in any state, contrast or the like is hardly affected by change in angle of viewing. That is, a wide viewing angle can be realized. Further, since both the first pixel electrode 507 and the second pixel electrode 524 are light-transmitting electrodes, a high aperture ratio can be obtained.

Next, a horizontal electric field-mode liquid crystal display device, which is different from the above-described device, is described with reference to FIGS. 18 and 19.

Figure 18:
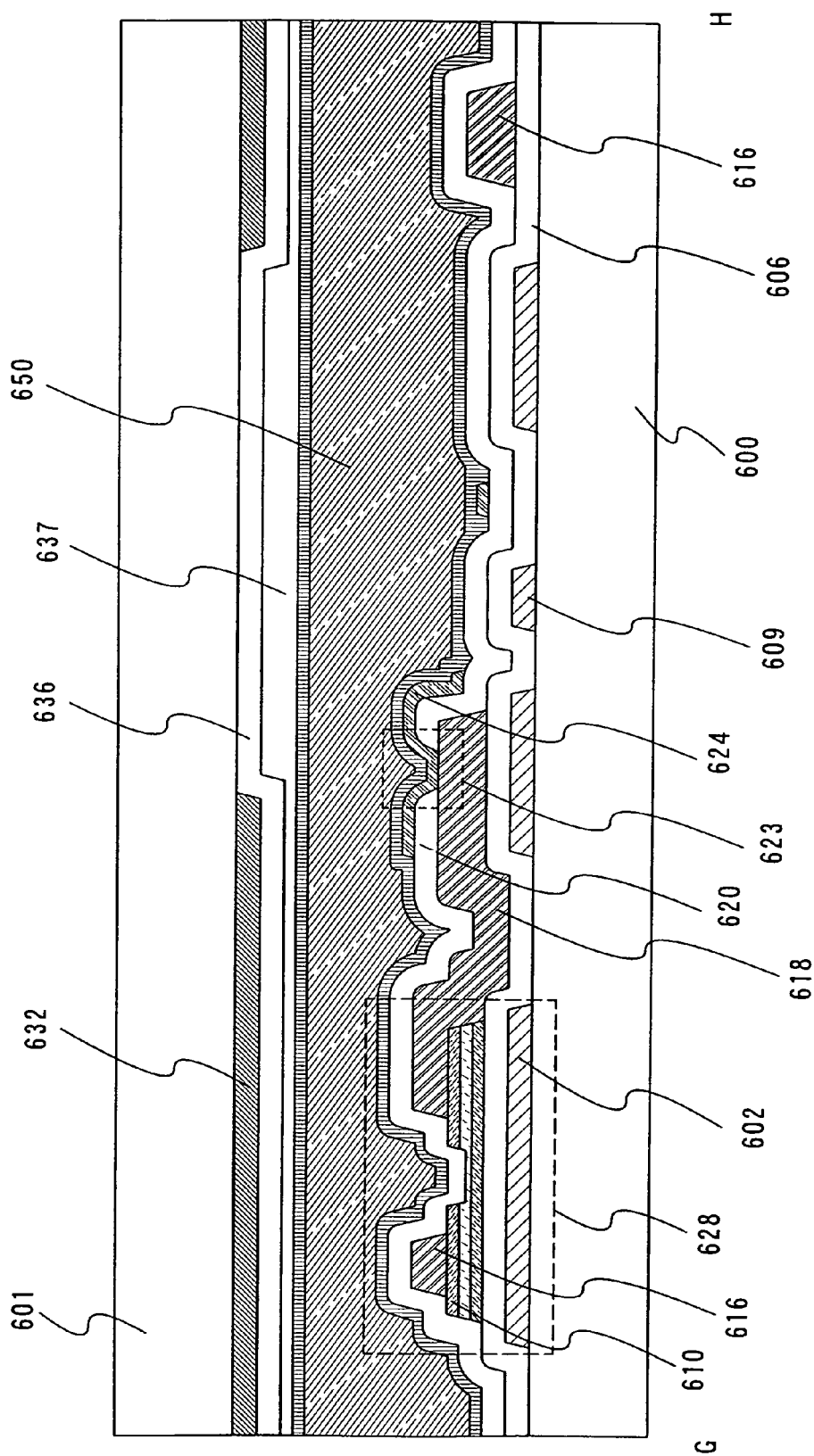
FIG. 18 illustrates a liquid crystal display device to which the present invention can be applied.
Figure 19:
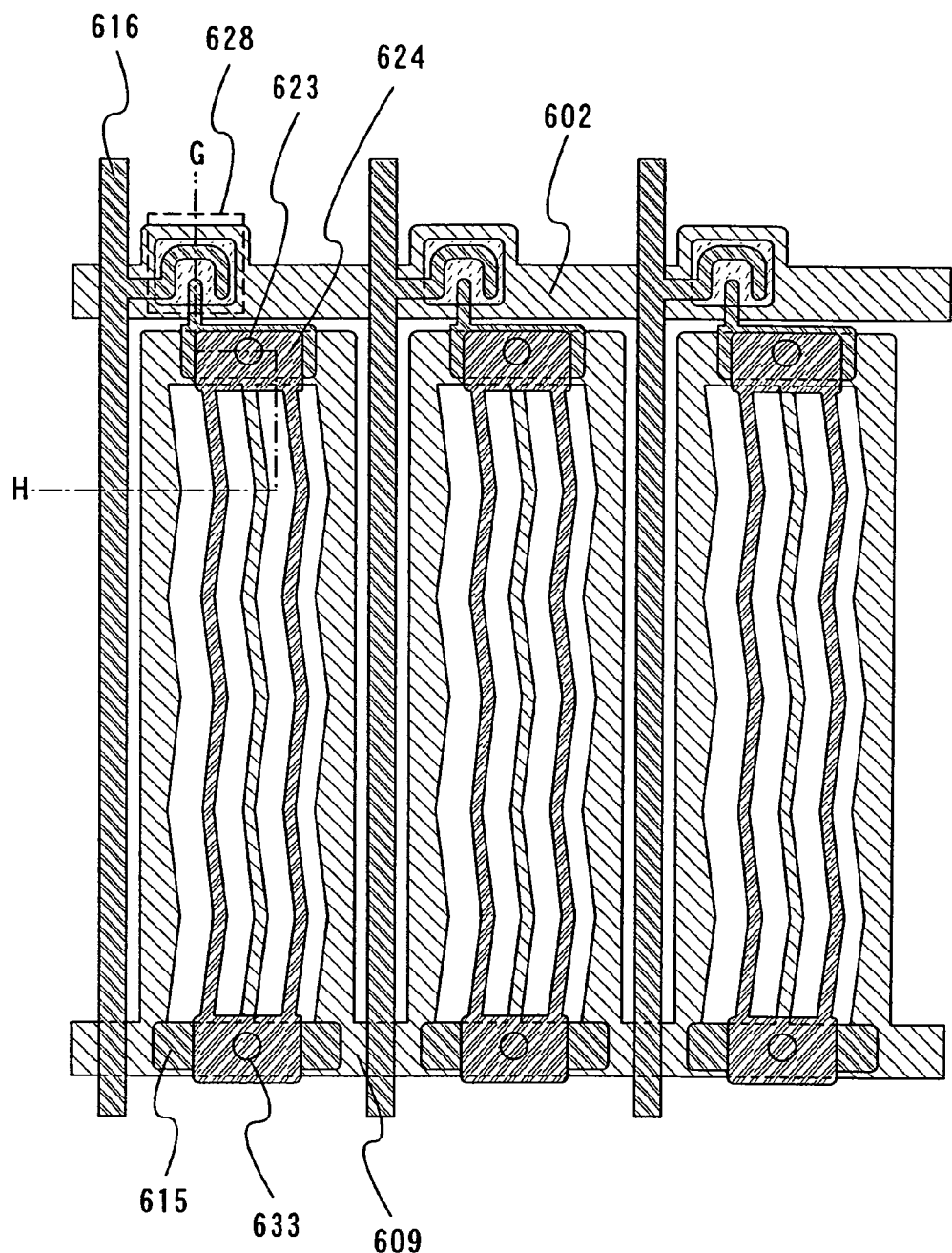
FIG. 19 illustrates the liquid crystal display device to which the present invention can be applied.

FIGS. 18 and 19 each show a pixel structure of an IPS-mode liquid crystal display device. FIG. 19 is a plan view. FIG. 18 shows a cross-sectional structure taken along the line G-H in FIG. 19. Hereinafter, description is made with reference to FIGS. 18 and 19.

FIG. 18 shows a state in which a substrate 600 over which a thin film transistor 628 and a second pixel electrode 624 connected to the thin film transistor 628 are provided and a substrate 601 face with each other, and liquid crystals are injected therebetween. A light-shielding layer 632, a colored layer 636, a planarization layer 637, and the like are provided over the substrate 601. Although a pixel electrode is provided over the substrate 600, a pixel electrode is not provided on the substrate 601. A liquid crystal layer 650 is provided between the substrate 600 and the substrate 601.

A wiring 609 serving as a common potential line and the thin film transistor 628 are formed over the substrate 600. The wiring 609 can be formed at the same time and in the same step as a scan line 602 of the thin film transistor 628. A first pixel electrode is formed in the same step as the scan line 602 and formed in a shape which is compartmentalized roughly in a pixel shape.

A wiring 616 and a wiring 618 which are connected to a source electrode and a drain electrode of the thin film transistor 628 are formed over a gate insulating layer 606. The wiring 616 is a signal line to which a video signal is input in a liquid crystal display device. The wiring 616 is a wiring extending in one direction and is connected to a source region 610 and one of the source electrode and the drain electrode. The wiring 618 is connected to the other of the source electrode and the drain electrode and the second pixel electrode 624. Note that a thin film transistor which is similar to the thin film transistor functioning as the protection diode described in Embodiment Mode 1 can be used as the thin film transistor 628 as appropriate.

A second insulating layer 620 is formed over the wiring 616 and the wiring 618. In addition, the second pixel electrode 624 connected to the wiring 618 though an opening portion 623 formed in the second insulating layer 620 is formed over the second insulating layer 620. The second pixel electrode 624 is formed using a material which is similar to that of the third conductive layer described in Embodiment Mode 1. Note that as shown in FIG. 19, the second pixel electrode 624 is formed so as to generate a horizontal electric field between the second pixel electrode 624 and a comb-shaped electrode (first pixel electrode) which is formed at the same time as the wiring 609. Further, the second pixel electrode 624 is formed so that comb-shaped portions of the second pixel electrode 624 are alternately engaged with the comb-shaped electrode (first pixel electrode) which is formed at the same time as the wiring 609.

Alignment of the liquid crystals is controlled by an electric field generated between a potential applied to the second pixel electrode 624 and a potential of the wiring 609. The liquid crystal molecules are horizontally rotated by utilizing the electric field which is approximately parallel to the substrate. In this case, since the liquid crystal molecules are parallel to the substrate in any state, contrast or the like is hardly affected by change in angle of viewing. Therefore, a wide viewing angle can be realized.

As described above, the thin film transistor 628 and the second pixel electrode 624 connected to the thin film transistor 628 are provided over the substrate 600. A storage capacitor is formed by providing the gate insulating layer 606 between the wiring 609 and a capacitor electrode 615 which is formed at the same time as the wiring 616. The capacitor electrode 615 and the second pixel electrode 624 are connected through an opening portion 623.

The present invention can also be applied to a TN-mode liquid crystal display device. Thus, a mode of a TN-mode liquid crystal display device to which the present invention is applied is described below.

Figure 20:
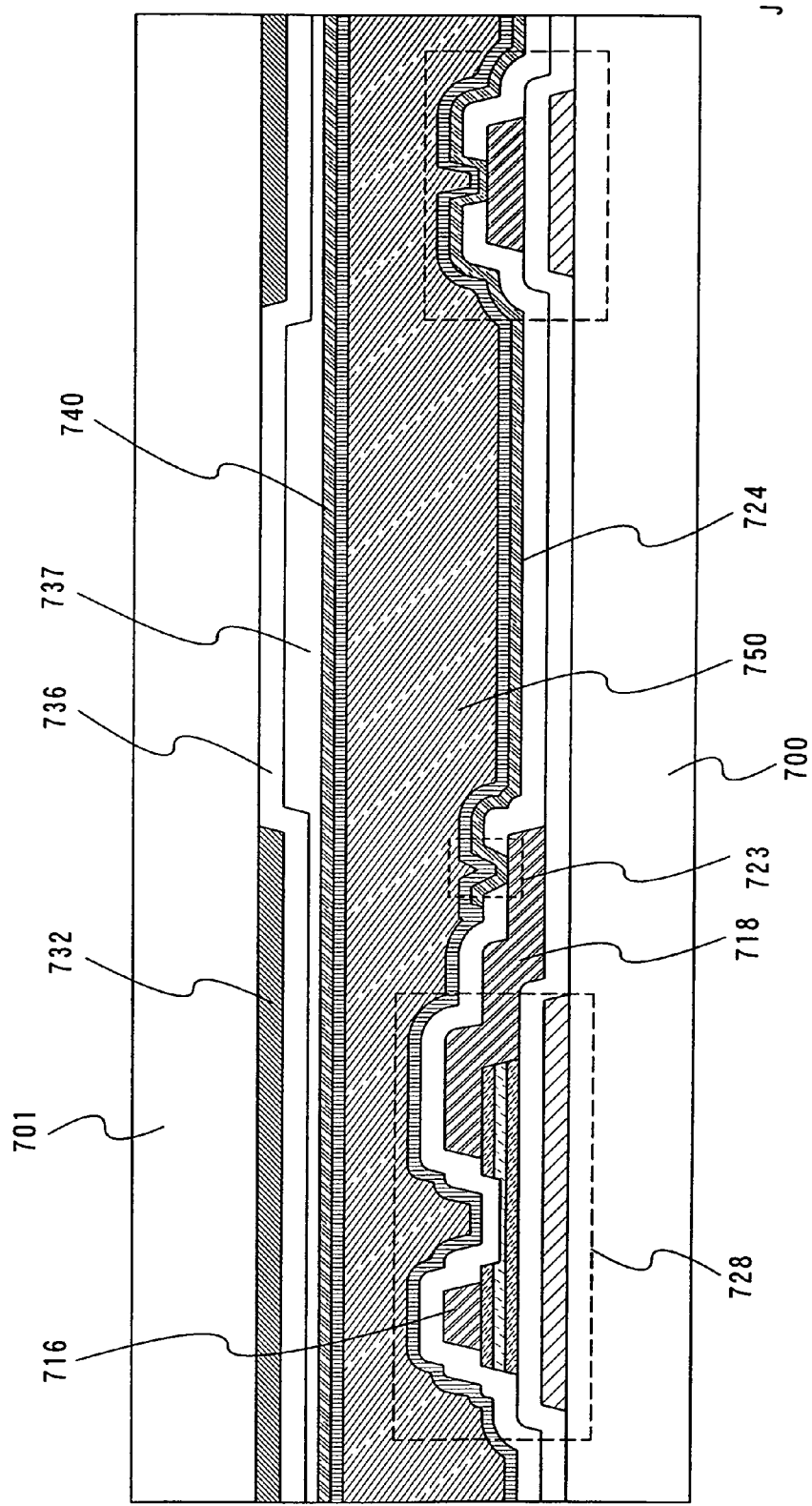
FIG. 20 illustrates a liquid crystal display device to which the present invention can be applied.
Figure 21:
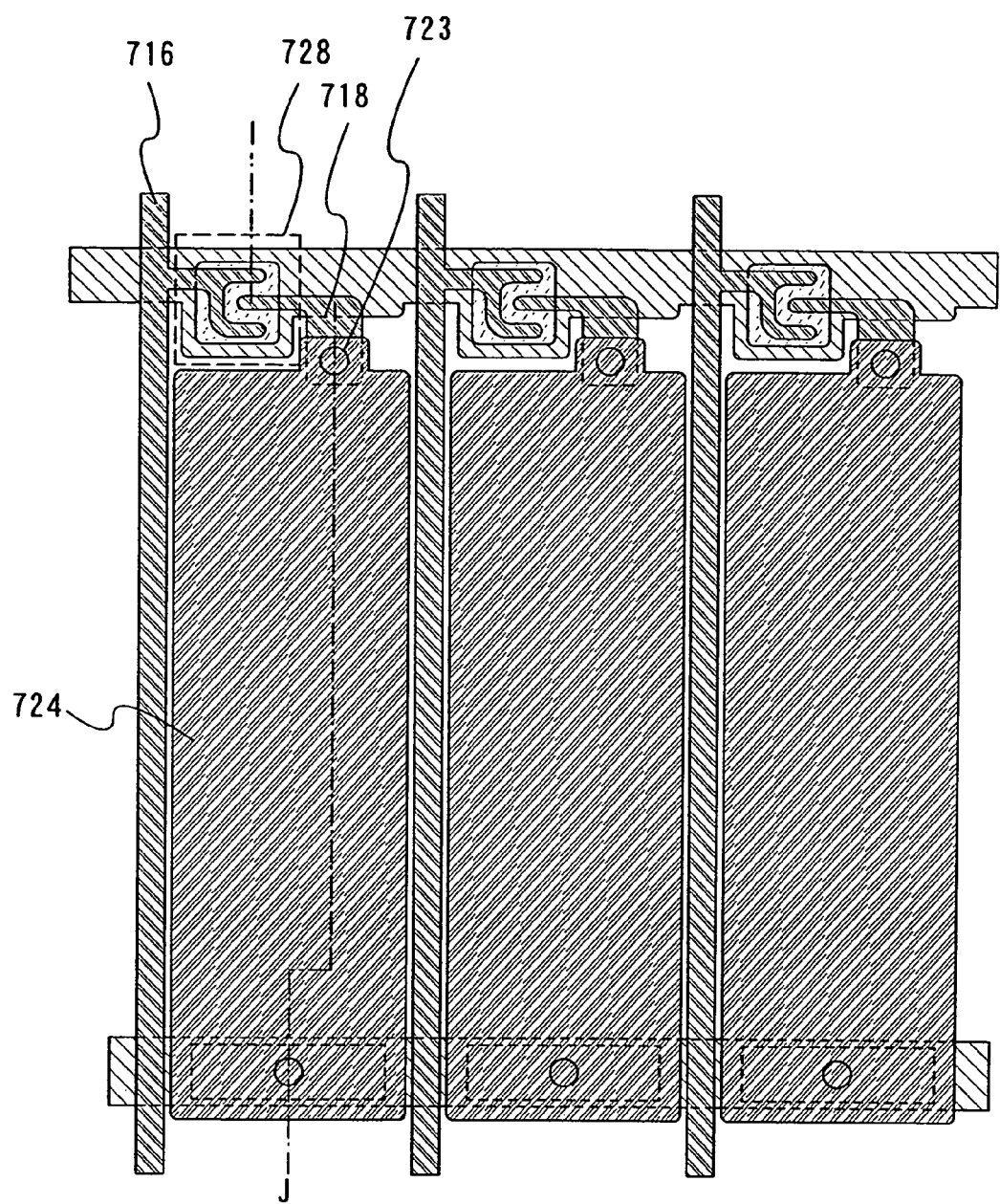
FIG. 21 illustrates the liquid crystal display device to which the present invention can be applied.

FIGS. 20 and 21 each show a pixel structure of a TN-mode liquid crystal display device. FIG. 21 is a plan view. FIG. 20 shows a cross-sectional structure taken along the line I-J in FIG. 21. Hereinafter, description is made with reference to FIGS. 20 and 21.

A pixel electrode 724 is connected to a thin film transistor 728 by a wiring 718 through an opening portion 723. The wiring 716 functioning as a data line is connected to the thin film transistor 728. Note that a thin film transistor which is similar to the thin film transistor functioning as the protection diode described in Embodiment Mode 1 can be used as the thin film transistor 728 as appropriate.

The pixel electrode 724 is formed using a material which is similar to that of the third conductive layer described in Embodiment Mode 1.

A light-shielding layer 732, a colored layer 736, and a counter electrode 740 are provided over a substrate 701 which is a counter substrate. In addition, a planarization layer 737 is formed between the colored layer 736 and the counter electrode 740 and prevents alignment disorder of the liquid crystals. A liquid crystal layer 750 is provided between the pixel electrode 724 and the counter electrode 740.

A liquid crystal element is formed by overlapping of the pixel electrode 724, the liquid crystal layer 750, and the counter electrode 740.

A shielding layer (a black matrix) or a colored layer serving as a color filter may be provided over a substrate 700. Further, a polarizing plate is attached to a surface of the substrate 700, which is opposite to a surface over which the thin film transistor and the like are provided. A polarizing plate is attached to a surface of the counter substrate 701, which is opposite to a surface on which the counter electrode 740 and the like are formed.

A material which is similar to that of the pixel electrode 724 can be used as the counter electrode 740 as appropriate. A liquid crystal element is formed by overlapping of the pixel electrode 724, the liquid crystal layer 750, and the counter electrode 740.

Note that in the referred drawings in the above description, gate electrodes and scan lines are formed in the same layers. Similarly, source electrodes, drain electrodes, and signal lines are formed in the same layers.

Through the above-described steps, the liquid crystal display device can be manufactured. A thin film transistor which is similar to the thin film transistor functioning as the protection diode described in Embodiment Mode 1 is used as the thin film transistor included in the liquid crystal display device of this embodiment mode. Therefore, since the thin film transistor has small off current and high reliability in electric characteristics, the liquid crystal display device described in this embodiment mode can have high contrast and high visibility.

Embodiment Mode 3

The present invention can be applied not only to a liquid crystal display device but also a light-emitting device. In this embodiment mode, a manufacturing process and the like of light-emitting devices are described with reference to FIGS. 22A and 22B and FIGS. 23A to 23C. A light-emitting element utilizing electroluminescence is used for a light-emitting device. Light-emitting elements utilizing electroluminescence are classified according to whether a light-emitting material is an organic compound or an inorganic compound. In general, the former is referred to as organic EL elements and the latter as inorganic EL elements.

In an organic EL element, when voltage is applied to a light-emitting element, electrons and holes are injected from a pair of electrodes into a layer containing a light-emitting organic compound, and current flows. Then, recombination of these carriers (the electrons and holes) makes the light-emitting organic compound to form an excited state and to emit light when it returns from the excited state to a ground state. Due to such a mechanism, such a light-emitting element is referred to as a current-excitation light-emitting element.

Inorganic EL elements are classified into a dispersion type inorganic EL element and a thin-film type inorganic EL element depending on their element structures. A dispersion type inorganic EL element has a light-emitting layer where particles of a light-emitting material are dispersed in a binder, and its light emission mechanism is donor-acceptor recombination type light emission which utilizes a donor level and an acceptor level. A thin-film type inorganic EL element has a structure where a light-emitting layer is sandwiched between dielectric layers, which are further sandwiched between electrodes, and its light emission mechanism is localized type light emission which utilizes inner-shell electron transition of metal ions. Note that here, an organic EL element is used as a light-emitting element. In addition, a thin film transistor which is similar to the thin film transistor functioning as the protection diode described in Embodiment Mode 1 is used as a thin film transistor which controls driving of a light-emitting element.

Figure 22A:
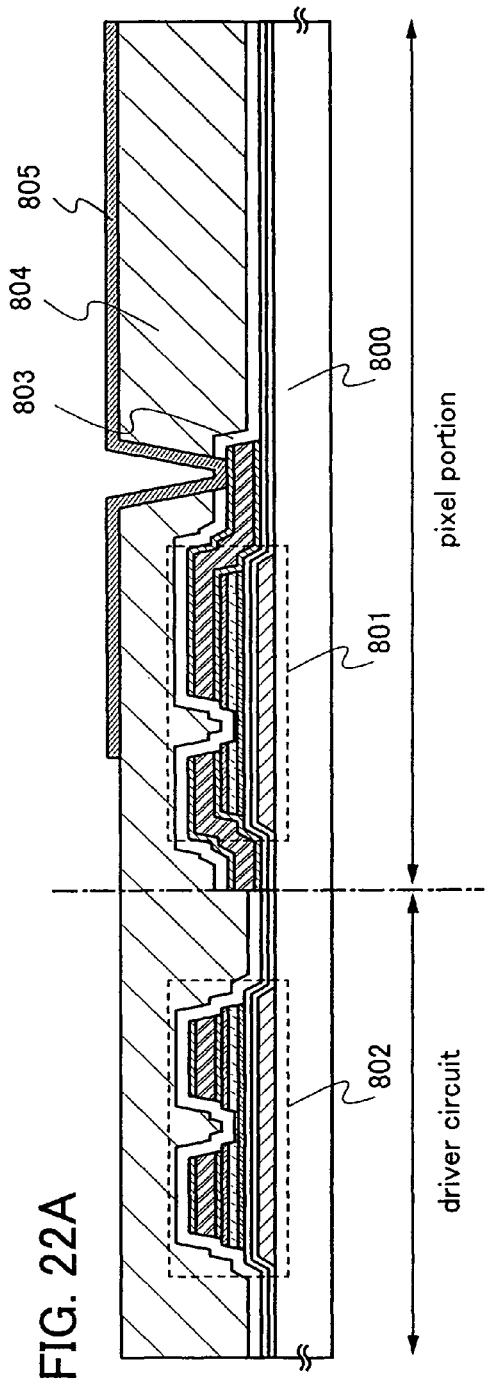
FIGS. 22A and 22B illustrate an example of a method for manufacturing a light-emitting device to which the present invention can be applied.

Through the process of FIGS. 4A to 4C and FIGS. 5A to 5C as described in Embodiment Mode 1, thin film transistors are formed over a substrate 800, as shown in FIG. 22A. In FIG. 22A, an insulating layer 803 functioning as a protective layer is formed over thin film transistors 801 and 802, and an insulating layer 804 is formed over the insulating layer 803. The insulating layer 804 is provided for flattening a top surface. The insulating layer 804 is preferably formed using an organic resin such as acrylic, polyimide, or polyamide, or siloxane.

A conductive layer 805 is formed over the insulating layer 804. The conductive layer 805 functions as a pixel electrode. In the case where the thin film transistor of a pixel is an n-channel transistor, it is preferable to form a cathode as the pixel electrode. On the other hand, in the case where the thin film transistor is a p-channel transistor, it is preferable to form an anode as the pixel electrode. Specifically, as a cathode, a known material with low work function, such as Ca, Al, CaF, MgAg, or AlLi, may be used.

Figure 22B:
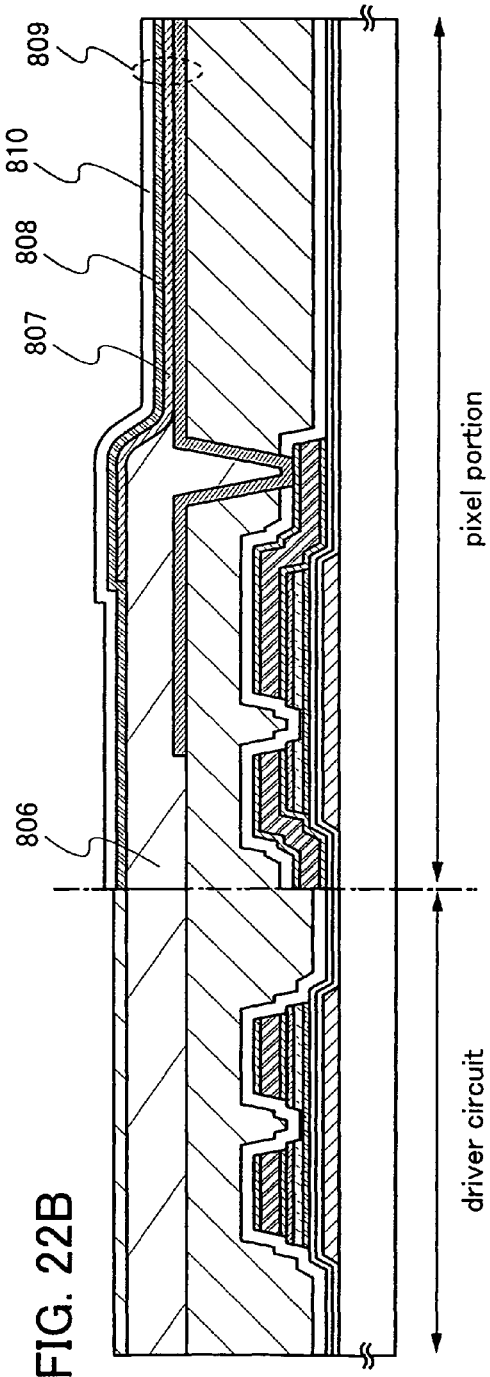

Next, as shown in FIG. 22B, a partition 806 is formed over the insulating layer 804 and an end portion of the conductive layer 805. The partition 806 has an opening portion and the conductive layer 805 is exposed through the opening portion. The partition 806 is formed using an organic resin, an inorganic insulating material, or organic polysiloxane. It is particularly preferable that the partition 806 be formed using a photosensitive material to have an opening portion over the conductive layer 805 so that a sidewall of the opening portion is formed as a tilted surface with continuous curvature.

Next, a light-emitting layer 807 is formed so as to be in contact with the conductive layer 805 in the opening portion of the partition 806. The light-emitting layer 807 may be formed using either a single-layer structure or a stacked-layer structure of a plurality of layers.

Then, a conductive layer 808 is formed so as to cover the light-emitting layer 807. The conductive layer 808 is referred to as a common electrode. The conductive layer 808 can be formed of a light-transmitting conductive layer using any of the light-transmitting conductive materials described in Embodiment Mode 1 for the third conductive layer 116. As the conductive layer 808, a titanium nitride layer or a titanium layer may be used. In FIG. 22B, ITO is used for the conductive layer 808. In the opening portion of the partition 806, a light-emitting element 809 is formed by overlapping of the conductive layer 805, the light-emitting layer 807, and the conductive layer 808. After that, it is preferable to form a protective layer 810 over the conductive layer 808 and the partition 806 so that oxygen, hydrogen, moisture, carbon dioxide, or the like does not enter the light-emitting element

809. As the protective layer 810, a silicon nitride layer, a silicon nitride oxide layer, a DLC layer, or the like can be used.

In practice, after the steps to FIG. 22B are completed, it is preferable that packaging (encapsulation) be performed using a protective film (a laminate film, an ultraviolet curable resin film, or the like) or a cover material, which has high airtightness and causes less degassing so as to prevent exposure to the air.

Next, structures of light-emitting elements are described with reference to FIGS. 23A to 23C. Here, the case where a driving transistor is an n-channel transistor is illustrated, and cross-sectional structures of pixels are described.

In a light-emitting element, it is acceptable as long as at least one of an anode and a cathode is transparent in order to extract light emission. There are light-emitting elements having the following structures: a top emission structure where a thin film transistor and a light-emitting element is formed over a substrate and light is extracted from a side opposite to the substrate; a bottom emission structure where light is extracted from the substrate side; and a dual emission structure where light is extracted from both the substrate side and the side opposite to the substrate. The present invention can be applied to a light-emitting element with any of the emission structures.

Figure 23A:
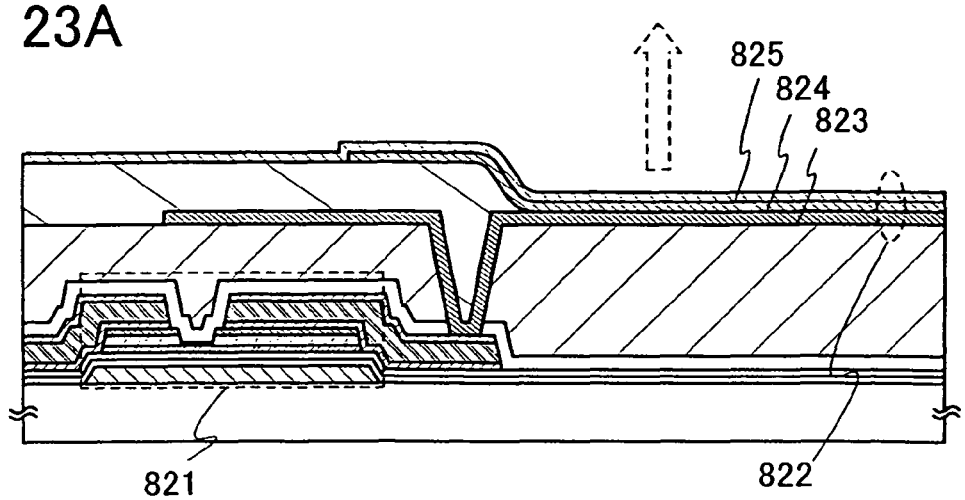
FIGS. 23A to 23C each illustrate a light-emitting device to which the present invention can be applied.

FIG. 23A shows a light-emitting element having a top emission structure. FIG. 23A is a cross-sectional view of a pixel in the case where a driving transistor 821 is an n-channel transistor and light is emitted from a light-emitting element 822 to an anode 825 side. In FIG. 23A, a cathode 823 of the light-emitting element 822 is electrically connected to the driving transistor 821, and a light-emitting layer 824 and the anode 825 are sequentially stacked over the cathode 823. The cathode 823 is formed using any conductive layer as long as it has a low work function and reflects light, and a known material can be used. For example, calcium, aluminum, calcium fluoride, a silver magnesium alloy, a lithium aluminum alloy, or the like is preferable. The light-emitting layer 824 may be formed using either a single-layer structure or a stacked-layer structure of a plurality of layers. In the case of using a plurality of layers, an electron injection layer, an electron transport layer, a light-emitting layer, a hole transport layer, and a hole injection layer are stacked in that order over the cathode 823. Note that all these layers are not necessarily provided. The anode 825 is formed using a light-transmitting conductive material which transmits light, and for example, a light-transmitting conductive layer of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, indium tin oxide to which silicon oxide is added, or the like may be used.

A region where the light-emitting layer 824 is sandwiched between the cathode 823 and the anode 825 corresponds to the light-emitting element 822. In the case of the pixel shown in FIG. 23A, light is emitted from the light-emitting element 822 to the anode 825 side, as indicated by an outlined arrow.

Figure 23B:
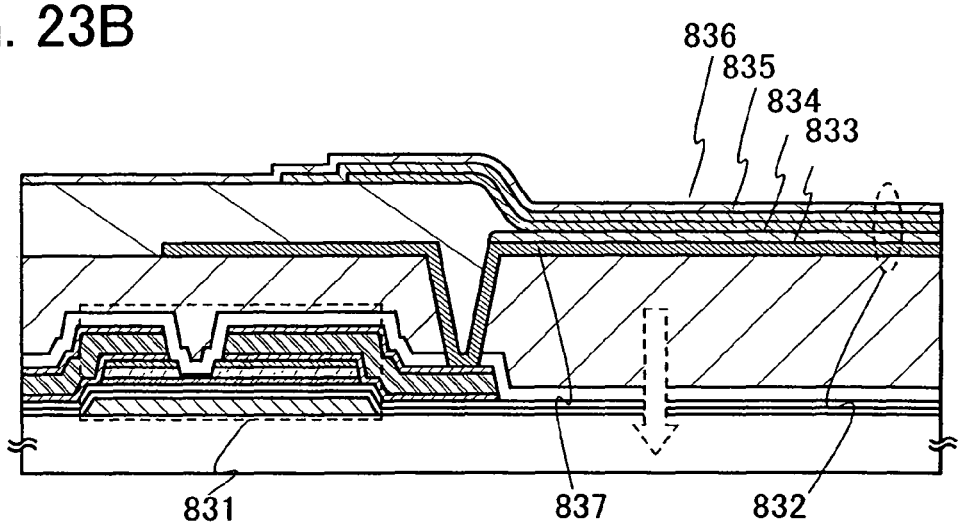

FIG. 23B shows a light-emitting element having a bottom emission structure. FIG. 23B is a cross-sectional view of a pixel in the case where a driving transistor 831 is an n-channel transistor and light is emitted from a light-emitting element 832 to a cathode 833 side. In FIG. 23B, the cathode 833 of the light-emitting element 832 is formed over a light-transmitting conductive material 837 which is electrically connected to the driving transistor 831, and a light-emitting layer 834 and an anode 835 are sequentially stacked over the cathode 833. Note that in the case where the anode 835 has light-transmitting properties, a shielding layer 836 for reflecting or shielding light may be formed so as to cover the anode. In a manner similar to that of the case of FIG. 23A, the cathode 833 is formed using any conductive layer as long as it has a low work function, and a known material can be used. Note that the thickness is set so that light is transmitted therethrough (preferably about 5 to 30 nm). For example, aluminum having a thickness of 20 nm can be used as the cathode 833. In a manner similar to that of the case of FIG. 23A, the light-emitting layer 834 can be formed using either a single-layer structure or a stacked-layer structure of a plurality of layers. Although the anode 835 does not need to be able to transmit light, the anode 835 can be formed using a light-transmitting conductive material in a manner similar to that of FIG. 23A. The shielding layer 836 can be formed using, for example, a metal layer which reflects light, or the like. However, the present invention is not limited to this. For example, a resin to which a black pigment is added can also be used.

A region where the light-emitting layer 834 is sandwiched between the cathode 833 and the anode 835 corresponds to the light-emitting element 832. In the case of the pixel shown in FIG. 23B, light is emitted from the light-emitting element 832 to the cathode 833 side as indicated by an outlined arrow.

Figure 23C:
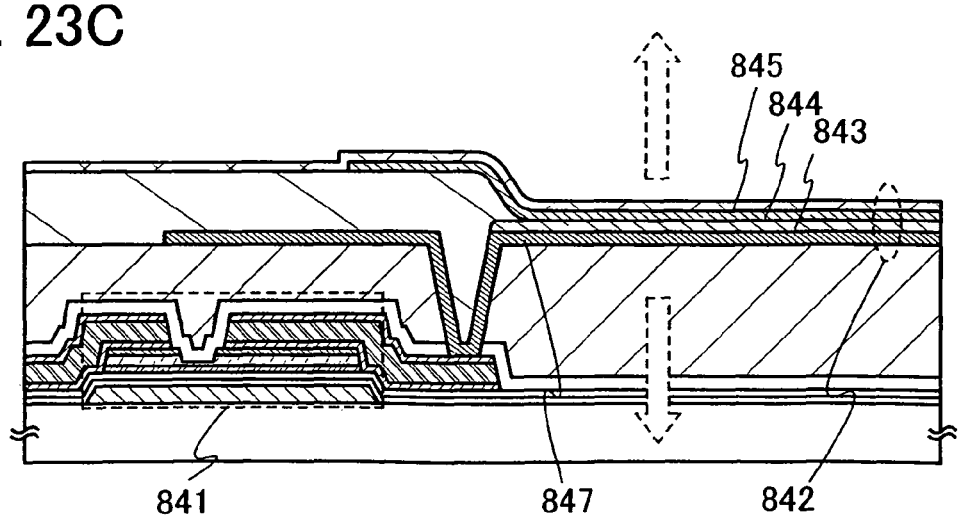

Next, FIG. 23C shows a light-emitting element having a dual emission structure. In FIG. 23C, a cathode 843 of a light-emitting element 842 is formed over a light-transmitting conductive material 847 which is electrically connected to a driving transistor 841, and a light-emitting layer 844 and an anode 845 are sequentially stacked over the cathode 843. In a manner similar to that of FIG. 23A, the cathode 843 is formed using any conductive layer as long as it has a low work function, and a known material can be used. Note that the thickness is set so that light is transmitted therethrough. For example, an Al film having a thickness of 20 nm can be used as the cathode 843. In a manner similar to that of FIG. 23A, the light-emitting layer 844 may be formed using either a single-layer structure or a stacked-layer structure of a plurality of layers. In a manner similar to that of FIG. 23A, the anode 845 can be formed using a light-transmitting conductive material.

A region where the cathode 843, the light-emitting layer 844, and the anode 845 overlap with each other corresponds to the light-emitting element 842. In the case of the pixel shown in FIG. 23C, light is emitted from the light-emitting element 842 to both the anode 845 side and the cathode 843 side as indicated by outlined arrows.

Note that although an organic EL element is described here as a light-emitting element, an inorganic EL element can also be used as a light-emitting element.

Note that although the example in which a thin film transistor (a driving transistor) which controls driving of a light-emitting element is directly connected to the light-emitting element is described in this embodiment mode, a transistor for controlling current may be connected between the driving transistor and the light-emitting element.

Note that the light-emitting device described in this embodiment mode is not limited to the structures shown in FIGS. 23A to 23C, and can be modified in various ways based on the technical idea of the present invention. For example, although the first insulating layer and the second conductive layer have stacked-layer structures in FIGS. 22A and 22B and FIGS. 23A to 23C, the first insulating layer and the second may have single-layer structures.

Through the above-described steps, the light-emitting device can be manufactured. A thin film transistor which is similar to the thin film transistor functioning as the protection diode described in Embodiment Mode 1 is used as the thin film transistor included in the light-emitting device of this embodiment mode. Therefore, since the thin film transistor has small off current and high reliability in electric characteristics, the light-emitting device described in this embodiment mode can have high contrast and high visibility.

Embodiment Mode 4

Next, a mode of a display panel which is incorporated in the display device described in Embodiment Mode 2 or a light-emitting panel which is incorporated in the light-emitting device described in Embodiment Mode 3 is described with reference to the drawings.

In a display device or light-emitting device of the present invention, a signal line driver circuit and a scan line driver circuit which are connected to a pixel portion are preferably provided over a different substrate (e.g., a semiconductor substrate or an SOI substrate) and connected, as shown in FIG. 2. However, the signal line driver circuit and the scan line driver circuit may be formed over the same substrate as a pixel circuit, instead of separately providing the signal line driver circuit and the scan line driver circuit.

Note that in this embodiment mode, a liquid crystal display device and a light-emitting device are collectively referred to as a display device.

Note that a connection method of a substrate which is separately formed is not particularly limited, and a known COG method, wire bonding method, TAB method, or the like can be used. Further, a connection position is not particularly limited to a certain position as long as electric connection is possible. Moreover, a controller, a CPU, a memory, or the like may be formed separately and connected to the pixel circuit.

Figure 24:
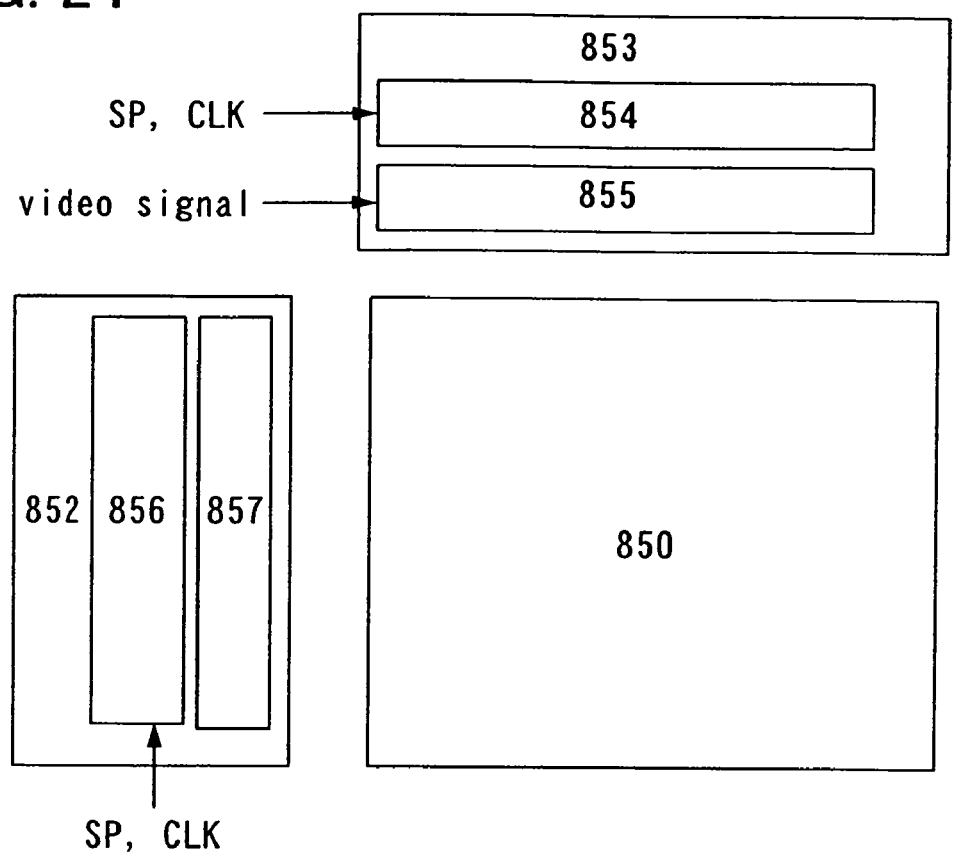
FIG. 24 is a block diagram illustrating a structure of a display device to which the present invention can be applied.

FIG. 24 is a block diagram of a display device of the present invention. The display device shown in FIG. 24 includes a pixel portion 850 including a plurality of pixels each provided with a display element, a scan line driver circuit 852 which selects each pixel, and a signal line driver circuit 853 which controls input of a video signal to a selected pixel.

The signal line driver circuit 853 shown in FIG. 24 includes a shift register 854 and an analog switch 855. A clock signal (CLK) and a start pulse signal (SP) are input to the shift register 854. When the clock signal (CLK) and the start pulse signal (SP) are input, a timing signal is generated in the shift register 854 and is input to the analog switch 855.

Note that the display device of the present invention is not limited to the structure shown in FIG. 24. That is, a signal line driver circuit used in the present invention is not limited to a structure including only a shift register and an analog switch. In addition to the shift register and the analog switch, another circuit such as a buffer, a level shifter, or a source follower may be included. Further, the shift register and the analog switch are not necessarily provided. For example, another circuit such as a decoder circuit by which a signal line can be selected may be used instead of the shift register, or a latch or the like may be used instead of the analog switch.

In addition, a video signal is supplied to the analog switch 855. The analog switch 855 samples the video signal in accordance with the input timing signal and supplies the sampled signal to a signal line of the next stage.

The scan line driver circuit 852 shown in FIG. 24 includes a shift register 856 and a buffer 857. The scan line driver circuit 852 may also include a level shifter in some cases. In the scan line driver circuit 852, when the clock signal (CLK) and the start pulse signal (SP) are input to the shift register 856, a selection signal is generated. The generated selection signal is buffered and amplified by the buffer 857, and the buffered and amplified signal is supplied to a corresponding scan line. Gates of transistors in pixels of one line are connected to the scan line. Further, since the transistors in the pixels of one line should be turned on at the same time, a buffer through which large current can flow is used as the buffer 857.

In a full-color display device, when video signals corresponding to R (red), G (green), and B (blue) are sequentially sampled and supplied to a corresponding signal line, the number of terminals for connecting the shift register 854 and the analog switch 855 corresponds to approximately ⅓ of the number of terminals for connecting the analog switch 855 and the signal line of the pixel portion 850. Accordingly, when the analog switch 855 and the pixel portion 850 are formed over the same substrate, the number of terminals used for connecting substrates which are separately formed can be suppressed compared to the case where the analog switch 855 and the pixel portion 850 are formed over different substrates. Thus, occurrence probability of bad connection can be suppressed, and yield can be improved.

Note that although the scan line driver circuit 852 in FIG. 24 includes the shift register 856 and the buffer 857, the present invention is not limited to this. The scan line driver circuit 852 may be formed using only the shift register 856.

Note that the structures of the signal line driver circuit and the scan line driver circuit are not limited to the structure shown in FIG. 24, which are merely one mode of the display device of the present invention.

Figure 25:
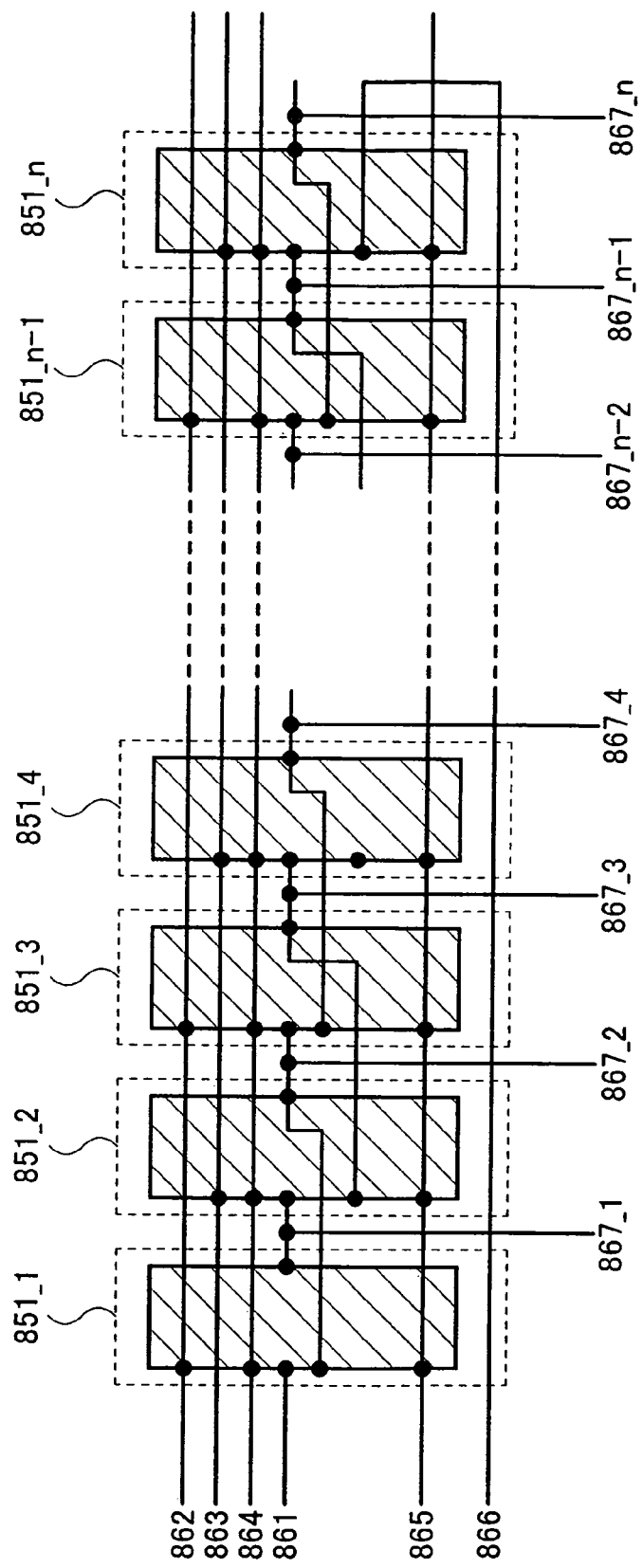
FIG. 25 is an equivalent circuit diagram illustrating a driver circuit of a display device to which the present invention can be applied.

Next, one mode of a shift register including thin film transistors with the same polarity which use microcrystalline semiconductor layers is described with reference to FIGS. 25 and 26. FIG. 25 shows the structure of a shift register of this embodiment mode. The shift register shown in FIG. 25 includes a plurality of flip-flops 851_$i$ (i=any one of 1 to n). The shift register is operated when a first clock signal, a second clock signal, a start pulse signal, and a reset signal are input.

Connection relations of the shift register in FIG. 25 are described. In an i-th stage flip-flop 851_$i$ (i=any one of 1 to n) in the shift register in FIG. 25, a first wiring 881 shown in FIG. 26 is connected to a seventh wiring 867_(i−1); a second wiring 882 shown in FIG. 26 is connected to a seventh wiring 867_(i+1); a third wiring 883 shown in FIG. 26 is connected to a seventh wiring 867_$i$; and a sixth wiring 886 shown in FIG. 26 is connected to a fifth wiring 865.

Figure 26:
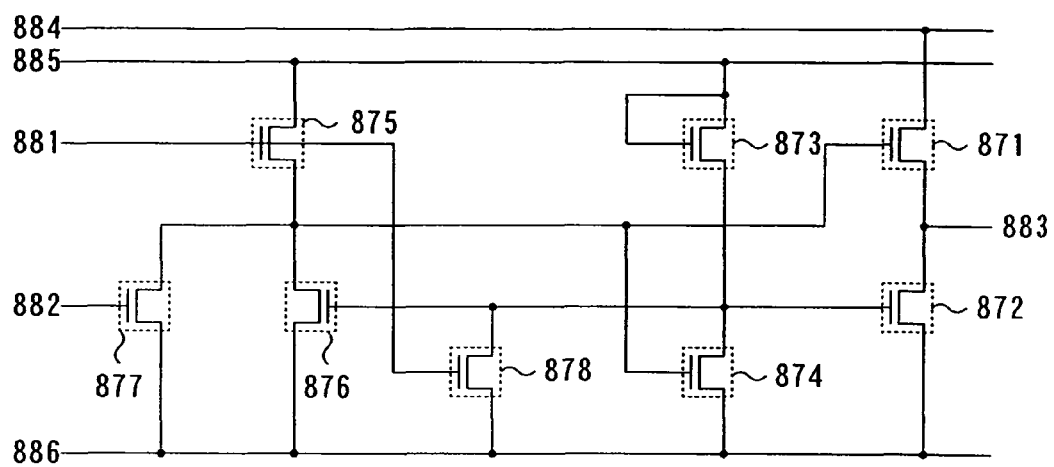
FIG. 26 is an equivalent circuit diagram illustrating a driver circuit of a display device to which the present invention can be applied.

Further, a fourth wiring 884 shown in FIG. 26 is connected to a second wiring 862 in odd-numbered stages, and is connected to a third wiring 863 in even-numbered stages. A fifth wiring 885 shown in FIG. 26 is connected to a fourth wiring 864.

Note that the first wiring 881 of the first stage flip-flop 851_1 shown in FIG. 26 is connected to a first wiring 861. The second wiring 882 of the n-th stage flip-flop 851_$n$ shown in FIG. 26 is connected to a sixth wiring 866.

Note that the first wiring 861, the second wiring 862, the third wiring 863, and the sixth wiring 866 may be referred to as a first signal line, a second signal line, a third signal line, and a fourth signal line, respectively. Further, the fourth wiring 864 and the fifth wiring 865 may be referred to as a first power supply line and a second power supply line, respectively.

Next, FIG. 26 shows details of the flip-flop shown in FIG. 25. The flip-flop shown in FIG. 26 includes a first transistor 871, a second transistor 872, a third transistor 873, a fourth transistor 874, a fifth transistor 875, a sixth transistor 876, a seventh transistor 877, and an eighth transistor 878. In this embodiment mode, each of the first transistor 871, the second transistor 872, the third transistor 873, the fourth transistor 874, the fifth transistor 875, the sixth transistor 876, the seventh transistor 877, and the eighth transistor 878 is an n-channel transistor and is turned on when gate-source voltage ($V_{gs}$) exceeds the threshold voltage ($V_{th}$). Connection structures of the flip-flop shown in FIG. 25 are described. Note that in the following description, a first electrode refers to one of a source electrode and a drain electrode, and a second electrode refers to the other of the source electrode and the drain electrode.

A first electrode of the first transistor 871 is connected to the fourth wiring 884. A second electrode of the first transistor 871 is connected to the third wiring 883.

A first electrode of the second transistor 872 is connected to the sixth wiring 886. A second electrode of the second transistor 872 is connected to the third wiring 883.

A first electrode of the third transistor 873 is connected to the fifth wiring 885. A second electrode of the third transistor 873 is connected to a gate electrode of the second transistor 872. A gate electrode of the third transistor 873 is connected to the fifth wiring 885.

A first electrode of the fourth transistor 874 is connected to the sixth wiring 886. A second electrode of the fourth transistor 874 is connected to the gate electrode of the second transistor 872. A gate electrode of the fourth transistor 874 is connected to a gate electrode of the first transistor 871.

A first electrode of the fifth transistor 875 is connected to the fifth wiring 885. A second electrode of the fifth transistor 875 is connected to the gate electrode of the first transistor 871. A gate electrode of the fifth transistor 875 is connected to the first wiring 881.

A first electrode of the sixth transistor 876 is connected to the sixth wiring 886. A second electrode of the sixth transistor 876 is connected to the gate electrode of the first transistor 871. A gate electrode of the sixth transistor 876 is connected to the gate electrode of the second transistor 872.

A first electrode of the seventh transistor 877 is connected to the sixth wiring 886. A second electrode of the seventh transistor 877 is connected to the gate electrode of the first transistor 871. A gate electrode of the seventh transistor 877 is connected to the second wiring 882. A first electrode of the eighth transistor 878 is connected to the sixth wiring 886. A second electrode of the eighth transistor 878 is connected to the gate electrode of the second transistor 872. A gate electrode of the eighth transistor 878 is connected to the first wiring 881.

Note that the first wiring 881, the second wiring 882, the third wiring 883, and the fourth wiring 884 may be referred to as a first signal line, a second signal line, a third signal line, and a fourth signal line, respectively. Further, the fifth wiring 885 and the sixth wiring 886 may be referred to as a first power supply line and a second power supply line, respectively.

When the circuits as shown in FIGS. 24 to 26 include a transistor using a microcrystalline semiconductor layer, the circuits can be operated at high speed. For example, mobility of a transistor using a microcrystalline semiconductor layer is higher than that of a transistor using an amorphous semiconductor layer, so that driving frequency of a driver circuit (e.g., the shift register 856 in the scan line driver circuit 852) can be increased. Further, since the scan line driver circuit 852 can be operated at high speed, frame rate can be increased or black frame insertion can be realized, for example.

When the frame rate is increased, data for a frame is preferably generated in accordance with a direction of motion of an image. That is, motion compensation is preferably performed to interpolate data. When the frame rate is increased and image data is interpolated in this manner, display characteristics of moving images are improved, and smooth display can be performed. For example, when frame rate is double (e.g., 120 Hz or 100 Hz) or more, preferably fourfold (e.g., 240 Hz or 200 Hz) or more, motion blur and afterimages can be reduced. In that case, when the driving frequency of the scan line driver circuit 852 is also increased and operated, the frame rate can be increased.

When black frame insertion is performed, image data or data for black display is made to be supplied to the pixel portion 850. Accordingly, display is made closer to impulse driving, and afterimages can be reduced. In that case, when the driving frequency of the scan line driver circuit 852 is also increased and operated, black frame insertion can be performed.

In addition, when the channel width of the transistor in the scan line driver circuit 852 is increased or a plurality of scan line driver circuits are provided, for example, higher frame rate can be realized. For example, frame rate can be eightfold (e.g., 480 Hz or 400 Hz) or more. When a plurality of scan line driver circuits are provided, a scan line driver circuit for driving even-numbered scan lines is provided on one side and a scan line driver circuit for driving odd-numbered scan lines is provided on the opposite side. Thus, the frame rate can be increased.

When the circuits as shown in FIGS. 24 to 26 are formed of a transistors using microcrystalline semiconductors, the layout area can be reduced. Therefore, the frame of the display device can be reduced. For example, since mobility of a transistor using a microcrystalline semiconductor layer is higher than that of a transistor using an amorphous semiconductor layer, the channel width of the transistor can be reduced. Accordingly, the frame of the display device can be narrowed.

Note that in the second transistor 872 in FIG. 26, a period during which a low-level signal is output to the third wiring 883 is long. In this period, the second transistor 872 is on. Therefore, strong stress is applied to the second transistor 872, and characteristics of the transistor easily deteriorate. When the characteristics of the transistor deteriorate, the threshold voltage is gradually increased. Accordingly, a current value is decreased. Thus, in order to supply enough current even when the transistor deteriorates, the channel width of the second transistor 872 is preferably large. Alternatively, deterioration of the transistor is preferably compensated so that a circuit operation is not affected even when the transistor deteriorates. For example, it is preferable that a transistor be provided in parallel with the second transistor 872, and the transistor and the second transistor 872 be alternately turned on, so that the circuit is not easily affected by deterioration.

However, a transistor using a microcrystalline semiconductor layer does not easily deteriorate compared to a transistor using an amorphous semiconductor layer. Accordingly, when the microcrystalline semiconductor layer is used, the channel width of the transistor can be reduced. Alternatively, when a thin film transistor which is similar to that shown in Embodiment Mode 1 is used, deterioration of the transistor can be considerably reduced and the transistor can be normally operated even when a circuit for compensation for deterioration is not provided. Thus, the layout area can be reduced.

Figure 27A:
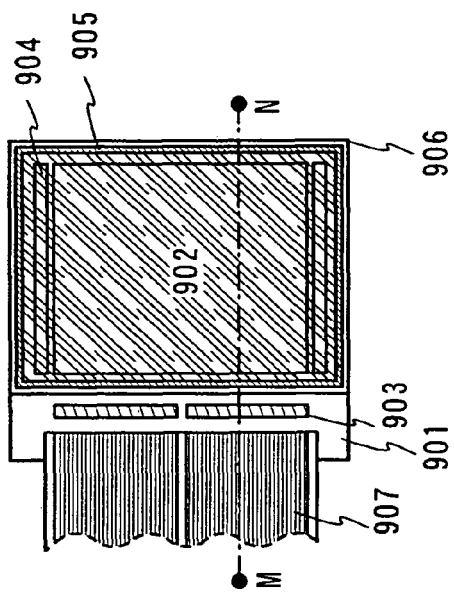
FIG. 27A is a top view of a liquid crystal display panel of the present invention.
Figure 27B:
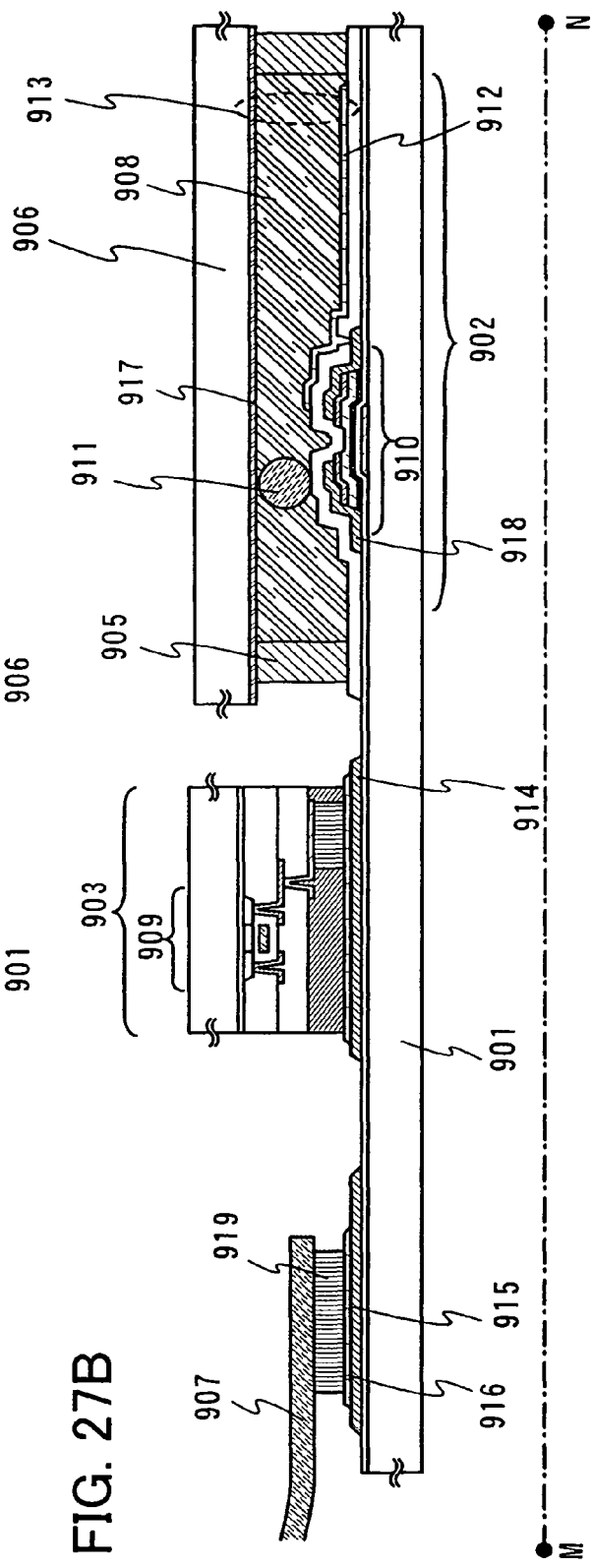
FIG. 27B is a cross-sectional view of the liquid crystal display panel of the present invention.
Figure 28A:
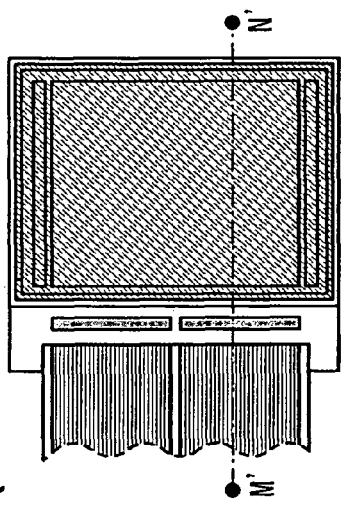
FIG. 28A is a top view of a light-emitting display panel of the present invention.
Figure 28B:
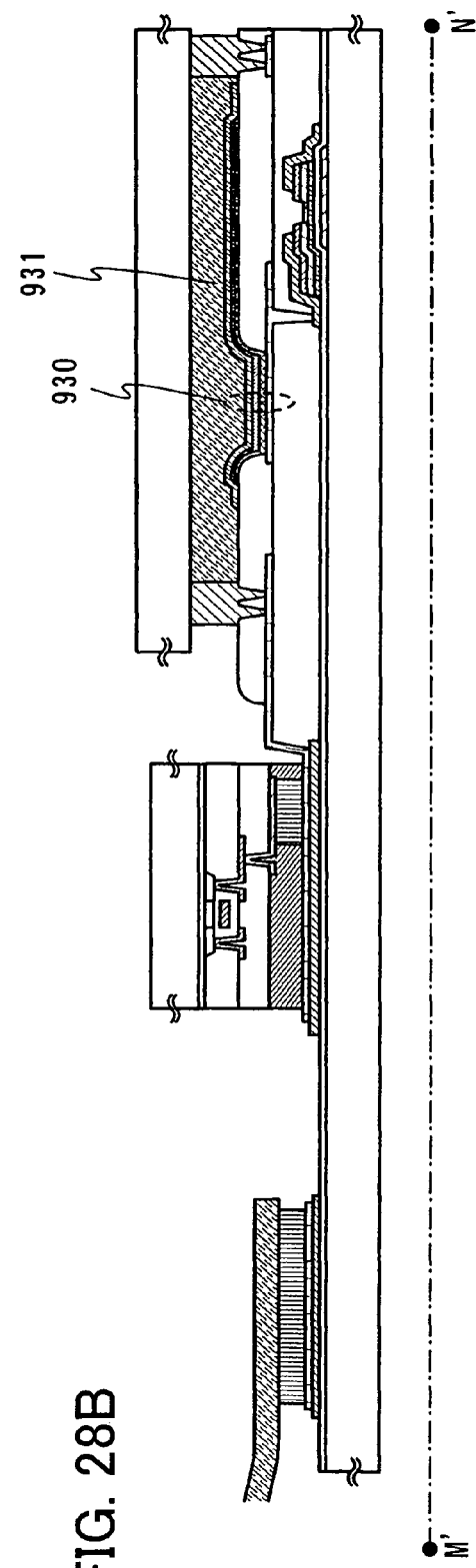
FIG. 28B is a cross-sectional view of the light-emitting display panel of the present invention.

Next, the appearance and cross sections of a liquid crystal display panel, which is one mode of the liquid crystal display device of the present invention, and a light-emitting panel are described with reference to FIGS. 27A and 27B and FIGS. 28A and 28B. FIG. 27A is a top view of a panel, in which a transistor 910 having a microcrystalline semiconductor layer and a liquid crystal element 913 which are formed over a first substrate 901 are sealed between the first substrate 901 and a second substrate 906 by a sealant 905. FIG. 27B is a cross-sectional view taken along the line M-N in FIG. 27A. FIGS. 28A and 28B show a light-emitting device. Note that only portions which are different from those in FIGS. 27A and 27B are denoted by reference numerals.

The sealant 905 is provided so as to surround a pixel portion 902 and a scan line driver circuit 904 which are provided over the first substrate 901. The second substrate 906 is provided over the pixel portion 902 and the scan line driver circuit 904. Thus, the pixel portion 902 and the scan line driver circuit 904 are sealed together with a liquid crystal 908 or a filler 931 by the first substrate 901, the sealant 905, and the second substrate 906. Further, a signal line driver circuit 903 formed using a polycrystalline semiconductor layer over a different substrate is mounted on a region over the first substrate 901, which is different from the region surrounded by the sealant 905. Note that although an example in which the signal line driver circuit including a transistor using a polycrystalline semiconductor layer is attached to the first substrate 901 is described in this embodiment mode, a signal line driver circuit may be formed using a transistor using a single crystalline semiconductor and attached to the first substrate 901. FIG. 27B illustrates a transistor 909 formed using a polycrystalline semiconductor layer, which is included in the signal line driver circuit 903.

Each of the pixel portion 902 and the scan line driver circuit 904 which are provided over the first substrate 901 includes a plurality of transistors. FIG. 27B illustrates the transistor 910 included in the pixel portion 902. Note that although it is assumed that the transistor 910 is a driving transistor in this embodiment mode, the transistor 910 may be either a current control transistor or an erasing transistor in a light-emitting device. The transistor 910 corresponds to a transistor using a microcrystalline semiconductor layer.

A pixel electrode 912 included in the liquid crystal element 913 is electrically connected to a wiring 918 of the transistor 910. Further, the wiring 918 is electrically connected to a lead wiring 914. A counter electrode 917 of the liquid crystal element 913 is formed on the second substrate 906. A portion where the pixel electrode 912, the counter electrode 917, and the liquid crystal 908 overlap with each other corresponds to the liquid crystal element 913.

In addition, a pixel electrode included in a light-emitting element 930 is electrically connected to a source electrode or a drain electrode of the transistor 910 through a wiring. In addition, in this embodiment mode, a common electrode of the light-emitting element 930 and a light-transmitting conductive material layer are electrically connected. Note that the structure of the light-emitting element 930 is not limited to the structure shown in this embodiment mode. The structure of the light-emitting element 930 can be changed as appropriate in accordance with a direction of light extracted from the light-emitting element 930, polarity of the transistor 910, or the like.

Note that as a material of each of the first substrate 901 and the second substrate 906, glass, metal (typically stainless steel), ceramics, plastics, or the like can be used. As plastics, a FRP (fiberglass-reinforced plastics) plate, a PVF (polyvinyl fluoride) film, a polyester film, or an acrylic resin film can be used. Alternatively, a sheet in which aluminum foil is interposed between PVF films or polyester films can be used.

A spacer 911 is a bead spacer and is provided for controlling a distance (a cell gap) between the pixel electrode 912 and the counter electrode 917. Note that a spacer obtained by selectively etching an insulating film may be used. That is, a post spacer may be used.

A variety of signals and potentials supplied to the pixel portion 902 or the scan line driver circuit 904, and the signal line driver circuit 903 which is formed separately are supplied from an FPC 907 through the lead wiring 914.

In this embodiment mode, a connection terminal 916 is formed using the same conductive layer as the pixel electrode 912 included in the liquid crystal element 913. Further, the lead wiring 914 is formed using the same conductive layer as the wiring 918.

The connection terminal 916 is electrically connected to a terminal included in the FPC 907 through an anisotropic conductive layer 919.

Note that although not shown, the liquid crystal display device shown in this embodiment mode includes alignment layers and olarizing plates, and may also include a color filter or a shielding layer.

Although the variety of signals and potentials supplied to the scan line driver circuit 904 or the pixel portion 902, and the signal line driver circuit 903 which is formed separately are not shown in the cross-sectional view in FIG. 27B, the variety of signals and potentials are supplied from the FPC 907 through the lead wiring 914 and a lead wiring 915.

In this embodiment mode, the connection terminal 916 is formed using the same conductive layer as the pixel electrode 912. Further, the lead wiring 915 is formed using the same conductive layer as the wiring 918.

Note that the second substrate which is in a direction from which light from the light-emitting element 930 is extracted should be transparent. For example, a light-transmitting substrate such as a glass substrate, a plastic substrate, a polyester film, or an acrylic film is used.

As the filler 931, as well as an inert gas such as nitrogen or argon, an ultraviolet curable resin, a thermosetting resin, or the like can be used. For example, PVC (polyvinyl chloride), acrylic, polyimide, an epoxy resin, a silicone resin, PVB (polyvinyl butyral), or EVA (ethylene vinyl acetate) can be used. In this embodiment mode, nitrogen may be used as the filler.

If necessary, an optical film such as a polarizing plate, a circular polarizing plate (including an oval polarizing plate), a retardation plate (a λ/4 plate or a λ/2 plate), or a color filter may be provided as appropriate over a light-emitting surface of the light-emitting element. Further, an anti-reflection layer may be provided over a polarizing plate or a circularly polarizing plate.

This embodiment mode can be combined with any of the structures described in other embodiment modes.

Embodiment Mode 5

Figure 29A:
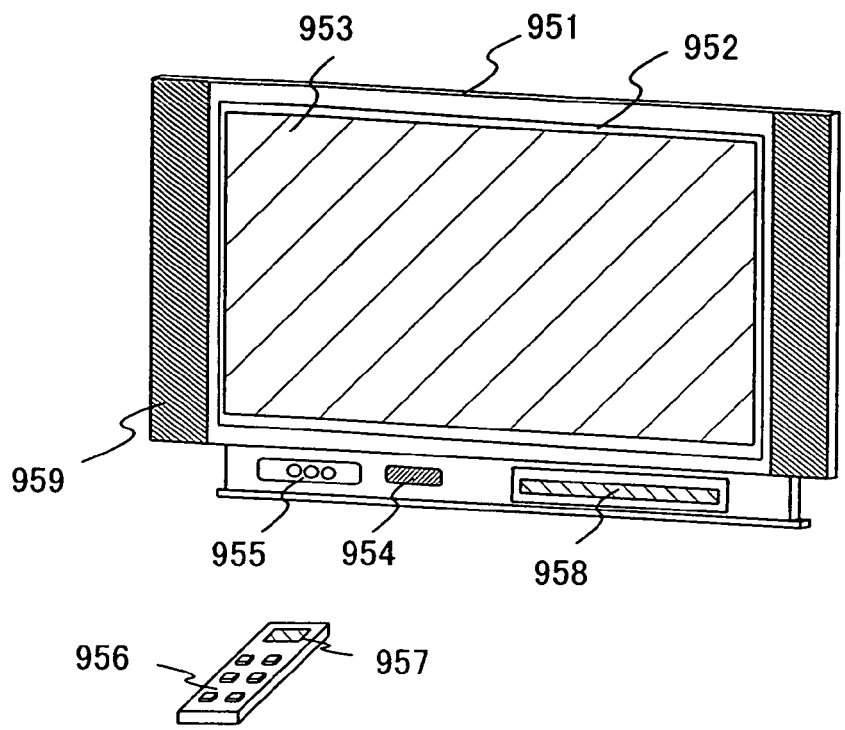
FIGS. 29A to 29C each illustrate an electronic device using a display device of the present invention.
Figure 29B:
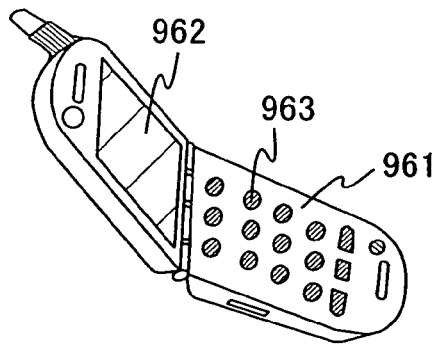
Figure 29C:
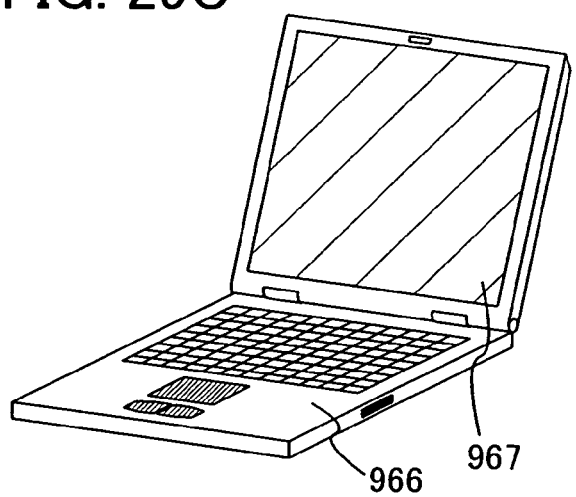

The liquid crystal display device obtained by using the present invention can be used for an active matrix liquid crystal module. That is, the present invention can be applied to any of electronic devices in which such an active matrix liquid crystal module is incorporated in a display portion. Examples of such electronic devices are cameras such as a video camera and a digital camera, a head-mounted display (a goggle-type display), a car navigation system, a projector, a car stereo, a personal computer, a portable information terminal (e.g., a mobile computer, a mobile phone, or an electronic book), and the like. FIGS. 29A to 29C show examples of such electronic devices.

FIG. 29A shows a television set. A television set can be completed when a display module is incorporated in a housing, as shown in FIG. 29A. A display panel on which an FPC is mounted is also referred to as a display module. A main screen 953 is formed using the display module, and a speaker portion 959, operation switches, and the like are provided as its accessory equipment. Thus, a television set can be completed.

As shown in FIG. 29A, a display panel 952 using a display element is incorporated in a housing 951. When a receiver 955 is used, including reception of general TV broadcast, communication of information can also be performed in one way (from a transmitter to a receiver) or in two ways (between a transmitter and a receiver or between receivers) by connection to a wired or wireless communication network through a modem 954. The television set can be operated by switches incorporated in the housing or by a remote controller 956 separated from the main body. A display portion 957 displaying information to be output may also be provided in this remote controller 956.

In addition, in the television set, a structure for displaying a channel, sound volume, or the like may be added by forming a subscreen 958 with a second display panel in addition to the main screen 953. In this structure, one of the main screen 953 and the subscreen 958 may be a liquid crystal display panel, and the other thereof may be a light-emitting display device. In order to prioritize low power consumption, a light-emitting display device has an advantage over a liquid crystal display device. In the case where the subscreen 958 is formed using a liquid crystal display panel, the subscreen 958 may flash on and off, for example.

Figure 30:
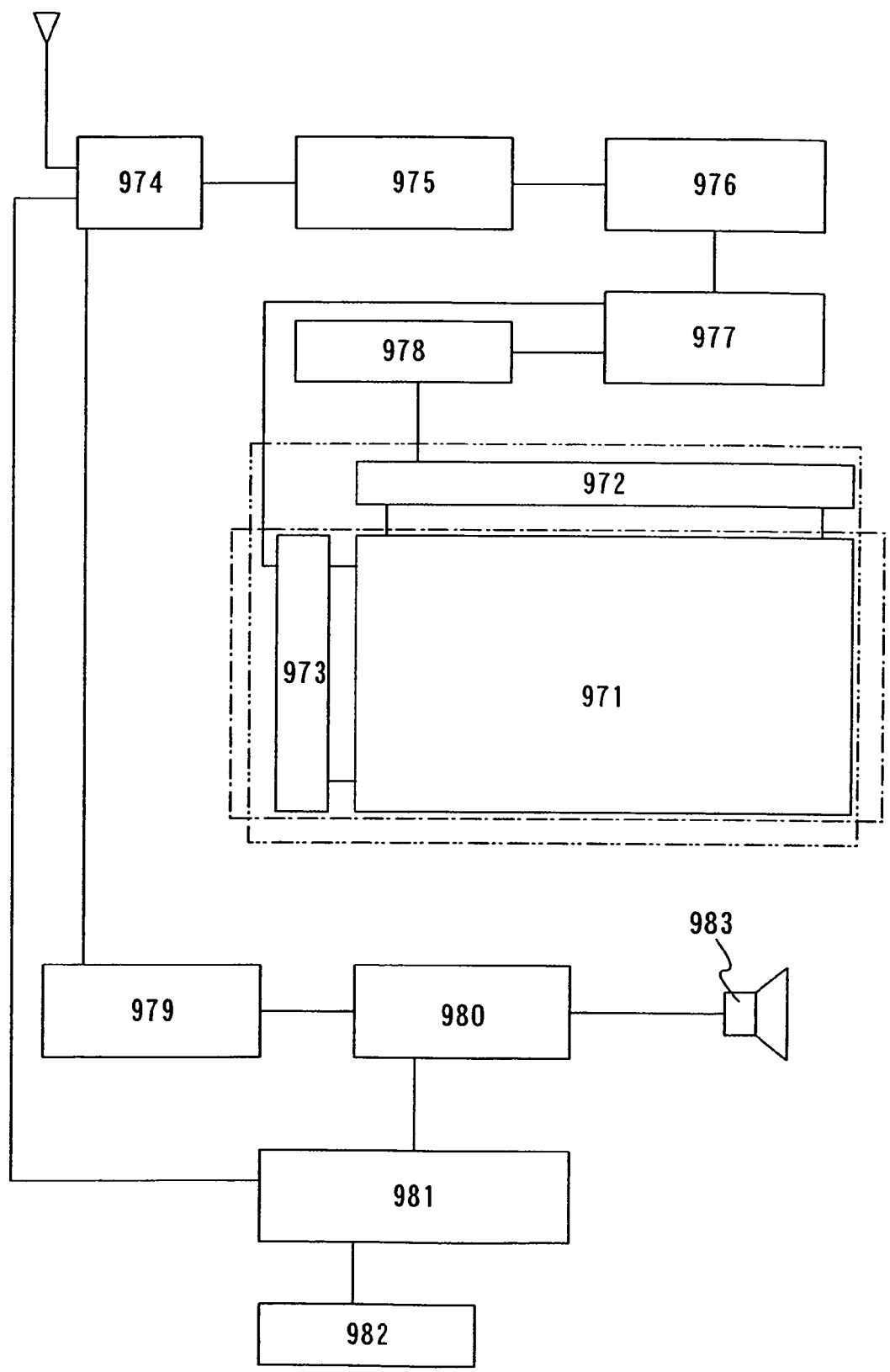
FIG. 30 illustrates an electronic device using a display device of the present invention.

FIG. 30 is a block diagram showing a main structure of a television set. A pixel portion 971 is formed over a display panel. A signal line driver circuit 972 and a scan line driver circuit 973 may be connected as described in other embodiment modes.

As structures of other external circuits, a video signal amplifier circuit 975 amplifying a video signal among signals received by a tuner 974, a video signal processing circuit 976 converting signals output from the video signal amplifier circuit 975 into chrominance signals corresponding to respective colors of red, green, and blue, a control circuit 977 for converting the video signal into a signal which meets input specifications of a driver IC, and the like are provided on an input side of the video signal. The control circuit 977 outputs signals to both a scan line side and a signal line side. In the case of digital driving, a signal dividing circuit 978 may be provided on the signal line side and an input digital signal may be divided into m pieces to be supplied.

Among the signals received by the tuner 974, an audio signal is transmitted to an audio signal amplifier circuit 979, and output thereof is supplied to a speaker 983 through an audio signal processing circuit 980. A control circuit 981 receives control information on a receiving station (receiving frequency) or sound volume from an input portion 982 and transmits the signal to the tuner 974 or the audio signal processing circuit 980.

Needless to say, the present invention is not limited to the television set, and can be applied to various uses particularly as a large display medium such as an information display board at a train station, an airport, or the like, or an advertisement display board on the street, as well as a monitor of a personal computer.

FIG. 29B shows an example of a mobile phone 961. The mobile phone 961 includes a display portion 962, an operation portion 963, and the like. When the liquid crystal display device described in any of the aforementioned embodiment modes is applied to the display portion 962, mass productivity can be improved.

A mobile computer shown in FIG. 29C includes a main body 966, a display portion 967, and the like. When the liquid crystal display device described in any of the aforementioned embodiment modes is applied to the display portion 967, mass productivity can be improved.

This application is based on Japanese Patent Application serial no. 2007-195252 filed with Japan Patent Office on Jul. 26, 2007, the entire contents of which are hereby incorporated by reference.

What is claimed is:

1. A display device comprising:
   an input terminal;
   a pixel portion; and
   a protection circuit including at least a thin film transistor between the input terminal and the pixel portion;
   wherein the thin film transistor includes:
   a gate electrode;
   a gate insulating layer covering the gate electrode;
   a microcrystalline semiconductor layer over the gate insulating layer;
   a buffer layer over the microcrystalline semiconductor layer;
   a source region and a drain region over the buffer layer;
   a source electrode being in contact with the source region; and
   a drain electrode being in contact with the drain region,
   wherein regions of the buffer layer overlapping with the source region and the drain region are thicker than a region of the buffer layer overlapping with a channel formation region,
   wherein a protective insulating layer, including a first opening portion and a second opening portion is provided over the source electrode and the drain electrode,
   wherein the first opening portion is provided so as to reach one of the source electrode and the drain electrode,
   wherein the second opening portion is provided so as to reach the gate electrode, and
   wherein an electrode connecting the first opening portion and the second opening portion is provided over the protective insulating layer.

2. The display device according to claim 1, wherein the buffer layer is an amorphous semiconductor layer.

3. The display device according to claim 2, wherein the amorphous semiconductor layer includes nitrogen.

4. The display device according to claim 2, wherein the amorphous semiconductor layer includes hydrogen.

5. The display device according to claim 2, wherein the amorphous semiconductor layer includes at least one of fluorine, chlorine, and iodine.

6. The display device according to claim 1, wherein end portions of the source region and the drain region are almost aligned with a depression portion of the buffer layer.

7. The display device according to claim 1, wherein the display device is a liquid crystal display device including a liquid crystal element.

8. The display device according to claim 1, wherein the display device is a light-emitting device including a light-emitting element.

9. A display device comprising:
   an input terminal;
   a pixel portion; and
   a protection circuit including at least a thin film transistor between the input terminal and the pixel portion, wherein the thin film transistor includes:
a first conductive layer;
a first insulating layer covering the first conductive layer;
a microcrystalline semiconductor layer over the first insulating layer;
an amorphous semiconductor layer over the microcrystalline semiconductor layer;
a first impurity semiconductor layer and a second impurity semiconductor layer over the microcrystalline semiconductor layer;
a second conductive layer being in contact with the first impurity semiconductor layer; and
a third conductive layer being in contact with the second impurity semiconductor layer,
wherein regions of the amorphous semiconductor layer overlapping with the first impurity semiconductor layer and the second impurity semiconductor layer are thicker than a region of the amorphous semiconductor layer overlapping with a channel formation region,
wherein a second insulating layer including a first opening portion and a second opening portion is provided over the second conductive layer and the third conductive layer,
wherein the first opening portion is provided so as to reach the second conductive layer,
wherein the second opening portion is provided so as to reach the first conductive layer and the third conductive layer, and
wherein a fourth conductive layer connecting the first opening portion and the second opening portion is provided over the second insulating layer.

10. The display device according to claim 9, wherein the amorphous semiconductor layer includes nitrogen.

11. The display device according to claim 9, wherein the amorphous semiconductor layer includes hydrogen.

12. The display device according to claim 9, wherein the amorphous semiconductor layer includes at least one of fluorine, chlorine, and iodine.

13. The display device according to claim 9, wherein end portions of the first impurity semiconductor layer and the second impurity semiconductor layer are almost aligned with a depression portion of the amorphous semiconductor layer.

14. The display device according to claim 9, wherein the display device is a liquid crystal display device including a liquid crystal element.

15. The display device according to claim 9, wherein the display device is a light-emitting device including a light-emitting element.

16. A display device comprising:
an input terminal;
a pixel portion; and
a protection circuit including at least a thin film transistor between the input terminal and the pixel portion;
wherein the thin film transistor includes:
a gate electrode;
a gate insulating layer covering the gate electrode;
a microcrystalline silicon layer over the gate insulating layer;
a buffer layer over the microcrystalline silicon layer;
a source region and a drain region over the buffer layer;
a source electrode being in contact with the source region; and
a drain electrode being in contact with the drain region,
wherein regions of the buffer layer overlapping with the source region and the drain region are thicker than a region of the buffer layer overlapping with a channel formation region,
wherein a protective insulating layer including a first opening portion and a second opening portion is provided over the source electrode and the drain electrode,
wherein the first opening portion is provided so as to reach one of the source electrode and the drain electrode,
wherein the second opening portion is provided so as to reach the gate electrode, and
wherein an electrode connecting the first opening portion and the second opening portion is provided over the protective insulating layer.

17. The display device according to claim 16, wherein the buffer layer is an amorphous semiconductor layer.

18. The display device according to claim 17, wherein the amorphous semiconductor layer includes nitrogen.

19. The display device according to claim 17, wherein the amorphous semiconductor layer includes hydrogen.

20. The display device according to claim 17, wherein the amorphous semiconductor layer includes at least one of fluorine, chlorine, and iodine.

21. The display device according to claim 16, wherein end portions of the source region and the drain region are almost aligned with a depression portion of the buffer layer.

22. The display device according to claim 16, wherein the display device is a liquid crystal display device including a liquid crystal element.

23. The display device according to claim 16, wherein the display device is a light-emitting device including a light-emitting element.

* * * * *